United States Patent
Ohbayashi et al.

(10) Patent No.: US 6,574,159 B2
(45) Date of Patent: Jun. 3, 2003

(54) SEMICONDUCTOR MEMORY DEVICE AND TESTING METHOD THEREFOR

(75) Inventors: Shigeki Ohbayashi, Hyogo (JP); Yoji Kashihara, Hyogo (JP); Motomu Ukita, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/137,352

(22) Filed: May 3, 2002

(65) Prior Publication Data

US 2002/0167849 A1 Nov. 14, 2002

(30) Foreign Application Priority Data

May 11, 2001 (JP) ........................................ 2001-141652
Jan. 24, 2002 (JP) ........................................ 2002-015659
Feb. 20, 2002 (JP) ........................................ 2002-043531

(51) Int. Cl.$^7$ .............................. G11C 29/00; G11C 7/00
(52) U.S. Cl. ..................... 365/201; 365/200; 365/226
(58) Field of Search ........................... 365/189.09, 200, 365/201, 226, 225.7, 230.06

(56) References Cited

U.S. PATENT DOCUMENTS 5,523,977 A * 6/1996 Tobita et al. ............... 365/201
5,703,816 A    12/1997 Nam et al. .................. 365/200
6,456,547 B1 * 9/2002 Mo et al. .................... 365/200

FOREIGN PATENT DOCUMENTS

JP    6-251599    9/1994    ........... G11C/29/00

OTHER PUBLICATIONS

U.S. patent application Ser. No. 09/846,197, Ohbayashi, filed May 2, 2001.
U.S. patent application Ser. No. 09/829,046, Ohbayashi, filed Apr. 10, 2001.
U.S. patent application Ser. No. 09/906,146, Ohbayashi, filed Jul. 17, 2001.
U.S. patent application Ser. No. 09/906,146, Ohbayashi, filed Jul. 17, 2001.

* cited by examiner

Primary Examiner—Son Mai
(74) Attorney, Agent, or Firm—McDermott, Will & Emery

(57) ABSTRACT

In a test operation for a semiconductor memory device, memory power supply lines are disconnected from a power supply node by using switch gates. Voltages of the memory power supply lines are detected using detection holding circuits. When the detected voltage is lower than a predetermined value, the corresponding memory power supply line is driven to a ground voltage level by the detection holding circuit. Thereby, a standby-current-defective but normally-operable memory cell is forced to an operation-defective state. Then, the standby-current-defective memory cell is identified, and redundancy replacement is performed thereon. Consequently, the standby current abnormality in the semiconductor memory device can be repaired.

23 Claims, 35 Drawing Sheets

SEMICONDUCTOR MEMORY DEVICE AND TESTING METHOD THEREFOR

BACKGROUND OF THE INVENTION

1. Field of the Invention

The present invention relates to a semiconductor memory device. In particular, the present invention relates to a semiconductor memory device of which power consumption in a standby state can be reduced. More particularly, the present invention relates to a configuration for reducing standby current of a semiconductor memory device that includes redundancy circuitry for repairing a defective memory cell through replacement with a redundant or spare memory cell. Furthermore, the present invention relates to a testing method of a low power consumption semiconductor memory device.

2. Description of the Background Art

FIG. 51 schematically shows a configuration of a memory cell of a static random access memory (SRAM).

In FIG. 51, the memory cell includes a pair of cross coupled P-channel MOS transistors (insulated gate field effect transistors) PQ1 and PQ2 for pulling up, a pair of cross coupled N-channel MOS transistors NQ1 and NQ2 for data storage, and a pair of accessing N-channel MOS transistors NQ3 and NQ4.

P-channel MOS transistor PQ1 is electrically coupled between a memory cell power supply line MVCC and a node ND1, and has a gate electrically coupled to a node ND2. P-channel MOS transistor PQ2 is electrically coupled between memory cell power supply line MVCC and node ND2, and has a gate electrically coupled to node ND1.

N-channel MOS transistor NQ1 is electrically coupled between node ND1 and a memory cell ground line MVSS, and has a gate electrically coupled to node ND2. N-channel MOS transistor NQ2 is electrically coupled between node ND2 and memory cell ground line MVSS, and has a gate electrically coupled to node ND1.

N-channel MOS transistor NQ3 turns ON, in response to the potential of a signal on a word line WL, to electrically couple node ND1 to a bit line BL. N-channel MOS transistor NQ4 selectively turns ON, in response to the potential of the signal on word line WL, to electrically couple node ND2 to a complementary bit line ZBL.

In the SRAM cell shown in FIG. 51, MOS transistors PQ1 and NQ1 form a CMOS (complementary MOS) inverter. Also, MOS transistors PQ2 and NQ2 form a CMOS inverter. MOS transistors PQ1, PQ2, NQ1, and NQ2 form a CMOS inverter latch circuit.

Data complementary to each other are stored at nodes ND1 and ND2. in the SRAM cell, in a data storage mode, a current path of transferring electric current between memory cell power supply line and MVCC memory cell ground line MVSS via nodes ND1 and ND2 is cut off. Thus, the power consumption can be reduced.

The memory cell shown in FIG. 51 is generally called a "full CMOS memory cell". Compared to a configuration including pull-up load elements provided to nodes ND1 and ND2, the configuration of the full CMOS memory cell is superior in operational performance and low power consumptionability. For these reasons, the full CMOS memory cells are generally widely used in low power consumption SRAMs.

FIG. 52 schematically shows a plan layout of the SRAM cell shown in FIG. 51. In FIG. 52, since the SRAM cell is the full CMOS cell, there is provided an n-well region for forming P-channel MOS transistors PQ1 and PQ2, and a p-well region for forming N-channel MOS transistors NQ1 and NQ2. In the n-well region, there are formed active regions AA1 and AA2 in which P-channel MOS transistors PQ1 and PQ2 are formed, respectively. Active regions AA1 and AA2 are each formed in an L-shape to be symmetric with respect to a central line vertically extending in between, as viewed in FIG. 52. Active regions AA1 and AA2 are used as p-type impurity regions. On the other hand, in the p-well region, active regions AA3 and AA4 are formed in which N-channel MOS transistors NQ1 and NQ2 are formed, respectively. Active regions AA3 and AA4 are each formed in a reversed L-shape to be symmetric with respect to a center line in between. Active regions AA3 and AA4 are used as n-type impurity regions.

A gate electrode interconnection line GA1 is formed across horizontally-extending regions of active regions AA1 and AA3. On the other hand, a gate electrode interconnection line GA2 is formed across horizontally-extending regions of active regions AA2 and AA4. Gate electrode interconnection lines GA1 and GA2 are formed of, for example, polysilicon interconnection lines. In addition, a gate electrode interconnection line GA3 is formed across vertically extending regions of active regions AA3 and AA4. Gate electrode interconnection line GA3 is electrically coupled to a word line.

Each of gate electrode interconnection lines GA1 and GA2 has a region extending horizontally toward a central region. Gate electrode interconnection line GA1 forms gate electrodes of MOS transistors PQ1 and NQ3. Similarly, gate electrode interconnection line GA2 forms gate electrodes of MOS transistors PQ2 and NQ4, and gate electrode interconnection line GA3 forms gate electrodes of MOS transistors NQ3 and NQ4.

Local interconnection lines LI1 to LI7 are formed electrically coupling MOS transistors PQ1, PQ2, NQ1, NQ2, NQ3, and NQ4 from one another. Local interconnection lines LI1 to LI7 are formed through a borderless process with respect to active regions AA1 to AA4. Local interconnection lines LI1 to LI5 are formed above active regions AA1 to AA4, and are electrically coupled directly to corresponding active regions AA1 to AA4. Specifically, local interconnection line LI1 electrically couples active regions AA1 and AA2 with each other. Similarly, local interconnection line LI2 electrically couples active regions AA1 and AA3 with each other, and local interconnection line LI3 electrically couples active regions AA2 and AA5 with each other.

Local interconnection line LI2 corresponds to node ND1 shown in FIG. 51, and local interconnection line LI3 corresponds to node ND2 shown in FIG. 51. Local interconnection lines LI1 to LI7 are individually formed in self alignment with gate electrode interconnection lines GA1 to GA3, and no contacts are formed in the portions in which local interconnection lines LI2 and LI3 overlap with gate electrode interconnection lines GA1 and GA2. After the gate electrode interconnection lines are formed, the gate electrode interconnection lines are used as a mask, and the local interconnection lines are formed. In this process, the gate electrode interconnection lines are covered with an insulation film, and the contact holes are formed in portions for the contact with the local interconnection lines. Therefore, in the portions in which the gate electrode interconnection lines overlap with the local interconnection lines, the insulation film is formed on the gate electrode interconnection lines, and no contacts are formed for the local interconnection lines and the gate electrode interconnection lines.

Local interconnection line LI2 is electrically coupled to gate electrode interconnection line GA2 via a contact hole CH1. Similarly, local interconnection line LI3 is electrically coupled to gate electrode interconnection line GA1 via a contact hole CH2.

On the other hand, local interconnection line LI4 is electrically coupled via a contact hole CH3 to a first level metal interconnection line ML1 formed vertically extending on an upper layer. Also, local interconnection line LI5 is electrically coupled via a contact hole CH4 to a first level metal interconnection line ML4 formed on an upper layer thereof First level metal interconnection line ML4 corresponds to memory cell ground line MVSS, and transfers ground voltage. Also, local interconnection lines LI6 and LI7 are electrically coupled via a contact hole CH5 to a first level metal interconnection line ML2 formed linearly extending in the vertical direction as viewed in the drawing. Also, local interconnection line LI7 is electrically coupled via a contact hole CH6 to a first level metal interconnection line ML3 formed linearly extending on an upper layer thereof. First level metal interconnection lines ML2 and ML3 form bit lines BL and ZBL, respectively.

Contact holes CH3 to CH6 are formed in self alignment with gate electrode interconnection lines GA1 to GA3. Also, local interconnection lines LI4 to LI7 are formed in self alignment with gate electrode interconnection lines GA1 to GA3. In this arrangement, contact holes CH3 to CH6 and local interconnection lines LI4 to LI7 can be formed at minimum pitches.

Gate electrode interconnection line GA2 is electrically coupled via contact hole CH1 to local interconnection line LI2. Also, gate electrode interconnection line GA1 is electrically coupled via contact hole CH2 to local interconnection line LI3. Local interconnection lines LI2 and LI3 are formed, respectively, in self-alignment with gate electrode interconnection lines GA1 and GA2. In this configuration, no contacts are formed in portions in which local interconnection lines LI2 and LI3 overlap with gate electrode interconnection lines GA1 and GA2. Contact holes CH1 and CH2 are used to electrically couple local interconnection lines LI2 and LI3 to gate electrode interconnection lines GA2 and GA1, respectively.

Local interconnection line LI1 is electrically coupled via a second level metal interconnection line (not shown) to memory cell power supply line MVCC disposed extending in the row direction.

In the layout of the memory cell of a vertically long type shown in FIG. 52, bit lines BL and ZBL and memory cell ground lines MVSS are first metal interconnection lines, and are disposed parallel in a common metal layer. As the miniaturization of memory cells progresses, the distances between first level metal interconnection lines ML2 and ML3 and first level metal interconnection lines ML1 and ML4 are reduced, resulting in an increased probability of occurrence of short circuits between bit lines BL and ZBL and memory cell ground lines MVSS.

Memory cell power supply line MVCC is disposed extending parallel to word line WL and perpendicular to bit line BL.

In the memory cell having the layout as shown in FIG. 52, when a short circuit occurs because of adhesion or adsorption of particles in a manufacturing step, an operational failure is caused. In addition, electric current flows even in a standby state through the short circuit. That is, although defectively operating memory cells are replaced by redundant cells, the defect itself remains thereat. As long as a defect exists, during standby, electric flows through the short circuit, thereby increasing the standby current. The following is the types of short circuits that can be considered to occur in the above-described configuration.

(1) Short circuit between the nodes; (2) Short circuit between a node and the memory cell power supply line; (3) Short circuit between a node and the memory cell ground line; (4) Short circuit between a node and a word line; (5) Short circuit between a node and a bit line; (6) Short circuit between bit lines; (7) Short circuit between a word line and a memory cell power supply line; (8) Short circuit between a bit line and a memory cell ground line; and (9) Short circuit between a memory cell power supply line and a memory cell ground line. During standby, the bit line is precharged to the level of power supply voltage, and the word line is maintained at the ground voltage level.

In particular, in the layout of the memory cell of a vertically long type as shown in FIG. 52, among the types of short circuits listed above, the short circuit between a bit line and a memory cell ground line can occur at a very high probability. This is because first level metal interconnection lines ML2 and ML3 (which form bit lines BL and ZBL) and first level metal interconnection lines ML1 and ML4 (which form memory cell ground lines MVSS) are disposed parallel to each other at minimum design dimensions.

In the full CMOS memory cell configured of the six MOS transistors shown in FIG. 51, when one of the aforementioned short circuits (1) to (9) occurs, a path allowing electric current to flow always exist because complementary data are stored at nodes ND1 and ND2. Thus, there is caused a standby current defect.

A state is considered in which, as shown in FIG. 53, a resistance component RZ exists, due to a particle or the like, between nodes ND1 and ND2 at which complementary data are stored. When the resistance value of resistance component RZ is sufficiently low, nodes ND1 and ND2 are short circuited, and can not store data accurately. Consequently, the memory cell is determined to be defective.

During standby, since word line WL is in an unselected state, and the voltage is kept at a LOW level, MOS transistors NQ3 and NQ4 stays in the OFF state. A case is now assumed that, as shown in FIG. 53, a node ND1 is at a HIGH level, and node ND2 is at a LOW level. In this case, MOS transistors PQ1 and NQ2 are each in the ON state, and MOS transistor PQ2 and NQ1 are each in the OFF state. Accordingly, there is formed a path through which electric current flows from memory cell power supply line MVCC to memory cell ground line MVSS via MOS transistor PQ1, resistant component RZ, and MOS transistor NQ2.

Suppose that the resistance value of resistance component RZ is larger than that of an ON-resistance of each of MOS transistors PQ1 and NQ2. In this case, nodes ND1 and ND2 are maintained at a HIGH level and a LOW level, respectively, and data are stored at nodes ND1 and ND2 accurately. That is, when the resistance value of resistance component RZ is relatively large, the memory cell causes a standby current defect, although it does not cause an operational defect.

As described above, the higher the power supply voltage applied through memory cell power supply line MVCC, the lower the ON-resistance of each of the memory cell transistors. Thereby, the resistance value of resistance component RZ is relatively increased, and a state in which the memory cell causes a standby current defect, but does not cause an operational defect becomes even more enhanced.

Generally, in a semiconductor memory device of a large storage capacity, in order to improve the yield, redundant memory cells are provided to replace a defective memory cell that does not normally operate. The following procedure is carried out to replace a defective memory cell with a redundant memory cell. The address corresponding to a defective memory cell is first identified. Then, a fuse in a redundant program circuit is blown off by using an energy beam such as a laser beam. Thereby, the address corresponding to the defective memory cell is programmed, and the defective memory cell is maintained in a normally unselected state.

When the address corresponding to the defective memory cell is designated, the redundant memory cell is addressed in accordance with the address of the defective memory cell programmed in the redundant program circuit. Consequently, the defective memory cell is replaced with the redundant memory cell.

As described above, the memory cell, which does not cause an operational defect while it cause a standby current defect, causes the standby current to increase. That is, this memory cell is a defective memory cell reducing the product yield of the memory device because the specification value of the standby current can not be satisfied due to the increased standby current. Such a defective memory cell will be referred to as "standby-current-defective but normally-operable memory cells" hereinbelow. However, since the standby-current-defective but normally-operable memory cells normally operate, the address thereof could not be identified through a normal testing.

In a conventional detection method for detecting a standby-current-defective but normally-operable memory cell described above, the following procedure is carried out. Testing is performed in a state in which the memory cell power supply voltage is lowered below that used in a normal operation state. In this state, since the ON-resistance of each of the memory cell transistors is increased according to the drop in the gate voltage, the resistance value of resistance component RZ is relatively small. Thereby, the memory cell that causes a standby-current defect but normally operates under the normal power supply voltage is forced into a defective operation state. Under this condition, the testing is performed. As a result, the address of the standby-current-defective but normally-operable memory cell is identified, and the standby-current-defective but normally-operable memory cell is replaced with the redundant memory cell.

However, since the ON-resistance of each of the memory cell transistors is reduced with the increase in the memory cell power supply voltage, the standby-current-defective but normally-operable state becomes even more enhanced. Therefore, in the method in which the testing is performed in the condition in which the memory cell power supply voltage is lowered below that used in the normal operation state, such a case may occur in which the standby-current-defective but normally-operable state cannot be caused to be revealed. For example, in an event that the resistance value of resistance component RZ is relatively large, even when the ON-resistance of each of the memory cell transistors is increased, data can normally be stored. Consequently, the standby-current-defective but normally-operable memory cell could not be identified. In addition, in this state, the increased ON-resistance causes the standby current to decrease, thereby causing a case in which a standby-current defect does not occur. Moreover, when the testing is performed under the condition in which the memory cell power supply voltage is lowered below that used in a normal operation state, such a case may occur that even normally-operating memory cells are determined to be operation-defective.

As described above, the standby-current-defective but normally-operable state caused due to the adhesion of particles would be caused due to patterning failure. In addition, the aforementioned state similarly occurs not only in short circuit between storage nodes, but also in any one of the aforementioned short circuits (1) to (9).

When a standby-current-defective but normally-operable memory cell is present, the power consumption during standby is increased, and therefore the semiconductor memory device cannot be used for a portable equipment that requires a low standby current.

In order to reliably detect such standby-current defective but normally operable memory cell, it is required to detect the standby current accurately. Moreover, when redundancy replacement is made on a standby-current-defective but normally-operable memory cell, the standby current after the redundancy replacement should be made smaller than a specification value with reliability. Thus, the redundant replacement state is established in a simulated manner to detect the standby current before practical replacement.

SUMMARY OF THE INVENTION

An object of the present invention is to provide a semiconductor memory device capable of reliably reducing standby current.

Another object of the present invention is to provide a semiconductor memory device capable of detecting the address of a standby-current-defective but normally-operable memory cell, without exerting an adverse effect on normal memory cells.

Still another object of the present invention is to provide a testing method for a semiconductor memory device capable of reliably reducing standby current by replacing a standby-current-defective but normally-operable memory cell with a redundant memory cell.

A semiconductor memory device according to a first aspect of the present invention includes a plurality of memory cells arranged in rows and columns, a reference potential node for supplying a reference potential, a switch circuit coupled to the reference node and selectively rendered conductive for transmitting the reference potential at the reference node, a first voltage transmission line for transmitting the reference potential received from the switch circuit to the memory cells, and voltage control circuitry activated in a specific operation mode for detecting whether the potential on the voltage transmission line is at a predetermined potential and for setting the potential of the first voltage transmission line to a potential level according to the result of detection in accordance with the result of detection.

A semiconductor memory device according to a second aspect of the present invention includes: a plurality of memory cells arranged in rows and columns; a reference voltage node; a switch circuit coupled to the reference voltage node and selectively rendered conductive for transmitting the voltage at the reference voltage node; a first voltage transmission line for transmitting the voltage received from the switch circuit to the plurality of memory cells; a plurality of bit line pairs, disposed in correspondence with memory cell columns, each having memory cells of a corresponding column connected; a second voltage transmission line for transmitting the reference voltage received from the switch circuit; a bit line load circuit disposed in correspondence with each bit line pair and rendered conductive for transmitting a voltage on the second voltage transmission line to the corresponding bit line pair; a load voltage detection circuit for detecting the voltage on the second voltage transmission line in a specific operation mode and setting the first voltage transmission line to a voltage level according to the detection result; and a switch control circuit for latching the voltage of the first voltage transmission line in the specific operation mode and setting the switch circuit into a conductive/non-conductive state in accordance with the latch result.

A semiconductor memory device according to a third aspect of the present invention includes: a plurality of memory cells arranged in rows and columns; a reference voltage node; a first voltage transmission line connected to the reference voltage node, for transmitting the voltage received from the reference voltage node to the plurality of memory cells; a plurality of bit line pairs, disposed in correspondence with memory cell columns, each having memory cells of a corresponding column connected; a second voltage transmission line for transmitting the voltage received from the reference voltage node; a bit line load circuit disposed in correspondence with each bit line pair and rendered conductive for transmitting a voltage on the second voltage transmission line to the corresponding bit line pair; and a load voltage detection circuit for detecting the voltage level on the second voltage transmission line in a specific operation mode and setting at least the voltage on the first voltage transmission line to a voltage level according to the detection result.

A testing method for a semiconductor memory device according to a fourth aspect of the present invention includes the steps of; writing data to memory cells; maintaining the memory cells in a standby state; in response to a test mode designation, disconnecting a predetermined reference potential node from a voltage transmission line transmitting a predetermined potential to the memory cells; detecting a potential of the voltage transmission line and holding the voltage transmission line to ground potential when the potential of the voltage transmission line is not higher than a prescribed potential level; reading data of the memory cells under the condition of the disconnection; in accordance with the read out data, identifying presence and an address of a defective memory cell if present; and replacing the defective memory cell with a redundant memory cell in accordance with the result of identification.

A testing method according to a fifth aspect of the present invention is provided for a semiconductor memory device having a plurality of memory cells arranged in rows and columns, a plurality of bit line pairs disposed in correspondence with columns and to each of which memory cells of a corresponding column are connected, a first voltage transmission line for transmitting the voltage at a reference power voltage node to the plurality of memory cells, and a second voltage transmission line for transmitting the voltage received from the reference power voltage node to the bit line pairs.

The testing method according to the fifth aspect of the present invention includes the steps of; isolating at least one of the first and second voltage transmission lines from the reference voltage node in accordance with a test mode designation signal; detecting a voltage of at least one of the first and second voltage transmission lines and setting the voltage level of the first voltage transmission line in accordance with the detection result; storing the voltage on the first voltage transmission line; selectively establishing the connection between the reference power voltage node and at least one of the first and second voltage transmission lines in accordance with the stored voltage level; performing writing and reading of test data on the plurality of memory cells and detecting the presence of and an address of a defective memory cell; and programming connection between the reference power voltage node and at least one of the first and second voltage transmission lines in accordance with the detection result and replacing the defective memory cell with a redundant memory cell.

As described above, by selectively disconnecting the first voltage transfer line from the reference potential node, the potential of the first voltage transfer line is lowered by a leakage current when a stand-by current defect exists. Consequently, a determination can be made as to whether a stand-by current defect exists by detecting the potential level of the first voltage transfer line and by setting the potential of the first voltage transfer line according to the detection result.

By detecting the voltage level of the second voltage transmission line for transmitting a voltage to a bit line pair and adjusting, according to the detection result, a voltage level of the first voltage transmission line, even in the case where a normally operable but stand-by current defective short circuit occurs in the second voltage transmission line, by driving the voltage level of the first voltage transmission line to a predetermined voltage level, memory cells associated with the defective bit line pair can be set in an electrically floating state. Consequently, a short circuit failure such as a micro short circuit can be detected with reliability.

As for the circuit for detecting the voltage level of the second voltage transmission line, the detection operation thereof is selectively stopped or allowed to drive the voltage level of the second voltage transmission line in accordance with the detected voltage level of the second voltage transmission line, in response to the operation mode designating signal. Thus, even in the case where a failure causing the second voltage transmission line to be held at an intermediate voltage level exists due to a micro short circuit or the like, the current can be prevented from being consumed due to a through current in the load detection circuit. Accordingly, by detecting the current consumption in the standby state, a stand-by current failure memory cell can be accurately detected. Consequently, a standby current failure can be detected accurately to perform the redundant replacement for repairing the standby current failure. Thus, a semiconductor memory device of a lower current consumption can be implemented.

Furthermore, it can be accurately identified whether the memory cells store the data accurately by reading out data from the memory cells under the state where the first voltage transfer line is maintained at a voltage level according to the detection result. Therefore, the standby-current defective but normally operable memory cell can be set to an operation-defective state and the address thereof can be accurately identified. Through the redundant replacement of the operation-defective memory cell, the standby-current defective but normally operable memory cell can be repaired. In addition, since the first voltage transfer line associated with the standby-current defective but normally operable memory cell is disconnected all the time from the reference potential node, a current path for the leakage current of the standby-current defective but normally operable memory cell can be cut off. Consequently, the standby-current defect can be repaired with reliability.

By latching the voltage of the first voltage transmission line and establishing, according to the latched voltage, the connection state between the reference potential node and the second voltage transmission line, a defective column can be maintained in a failure state with reliability. Even in the case where a short circuit occurs on a word line, the defective word line can be maintained in a non-selected state with reliability when unselected. Thus, a so-called multi-selection of word lines can be prevented with reliability in which a plurality of word lines are erroneously driven into a selected state concurrently. Without causing a block failure that an entire block including a plurality of word lines is determined defective, the defective word line can be specified and repaired with reliability. Particularly, a load of the defective word line is higher due to the short circuit than a load of a normal word line. Therefore, through a function test, the failure can be detected, so that the defective word line can be detected with reliability because the defective word line is slower in voltage change than a normal word line. A so-called cross failure of a defective word line (row) and a defective column due to a short circuit can be accurately detected and repaired through redundant replacement with redundant memory cells, resulting in a reliable repairing of the standby current failure.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
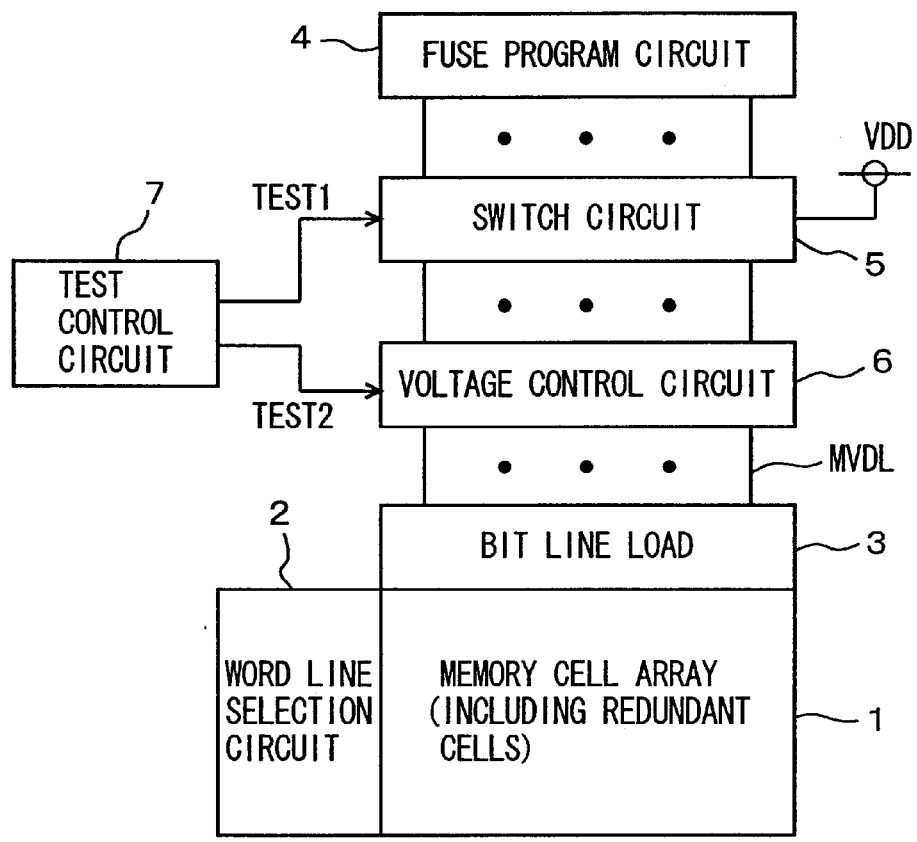
FIG. 1 schematically shows the overall configuration of a semiconductor memory device according to a first embodiment of the present invention.

FIG. 1 schematically shows the overall configuration of a semiconductor memory device according to a first embodiment of the present invention. In FIG. 1, the semiconductor memory device includes a memory cell array 1 having a plurality of memory cells arranged in rows and columns. Memory cell array 1 includes SRAM cells, and redundant memory cells for repairing a defective memory cell. In addition, memory cell array 1 includes word lines arranged corresponding to memory cell rows, and bit line pairs arranged corresponding to memory cell columns.

The semiconductor memory device according to the present invention further includes a word line selection circuit 2 for driving a word line arranged corresponding to an addressed row in memory array 1 into a selected state, bit line loads 3 arranged corresponding to the respective bit line pairs for holding the corresponding bit line pairs to a predetermined voltage level in a standby state, a fuse program circuit 4 having defective column information in memory array 1 programmed, a switch circuit 5 for selectively transmitting power supply voltage VDD to a memory power supply line MVDL in accordance with the programmed information in fuse program circuit 4, and a voltage control circuit 6 for detecting the voltage level on memory power supply line MVDL and setting the voltage level of memory power supply line in accordance with the result of detection.

Switch circuit 5 and voltage control circuit 6 are activated, respectively, according to test mode instruction signals TEST1 and TEST2 generated from a test control circuit 7.

Memory power supply lines MVDL are disposed corresponding to the respective columns in memory cell array 1. In memory cell array 1 (the configuration thereof will be described below), memory power supply line MVDL is disposed extending in the column direction in parallel to bit lines BL and ZBL. In addition, in memory cell array 1, the SRAM cells are arranged in rows and columns, and memory power supply lines MVDL are electrically coupled to power supply nodes of the memory cells of corresponding columns.

Fuse program circuit 4 includes fuse elements arranged corresponding to the respective columns in memory cell array 1. Each fuse element is programmed according to the defect free state or defective state of the corresponding column.

Switch circuit 5 includes switching elements provided corresponding to respective memory power supply lines MVDL. Switch circuit 5 selectively turns ON in response to test mode instruction signal TEST1 and an output signal of fuse program circuit 4. When switch circuit 5 is activated, it transfers power supply voltage VDD to a corresponding memory power supply line MVDL.

Voltage control circuit 6 is activated in response to the activation of test mode instruction signal TEST2, and drives a corresponding memory power supply line MVDL to a ground potential level when the potential level of the memory power supply line MVDL is lower than or equal to a predetermined potential level when activated.

When the switching elements of switch circuits 5 are set to the OFF states, and when memory cell array 1 includes a standby-current-defective memory cell, the voltage of a corresponding memory power supply line MVDL is lowered because of current leakage thereof. In this case, a column causing a standby-current defect can be detected through the detection of the voltage drop. When the voltage level of memory power supply line MVDL reaches the ground voltage level, stored data in corresponding memory cells volatilize, and these memory cells are forced into an operation-defective state. Subsequently, data stored in the memory cells are read out. The data stored in these memory cells are different from test write data (or, the correct data could not be read out). Thus, the defective column can be identified.

After the column of the standby-current-defective memory cell is identified, fuse program circuit 4 is programmed, memory power supply line MVDL disposed corresponding to the defective column is disconnected from the power supply node. In this way, the standby-current-defective but normally-operable memory cell can be reliably detected, and the corresponding memory power supply line is disconnected from the power supply node. In this way, the standby-current-defective but normally-operable memory cells can be repaired through redundancy replacement, and the standby current can be reduced.

Figure 2:
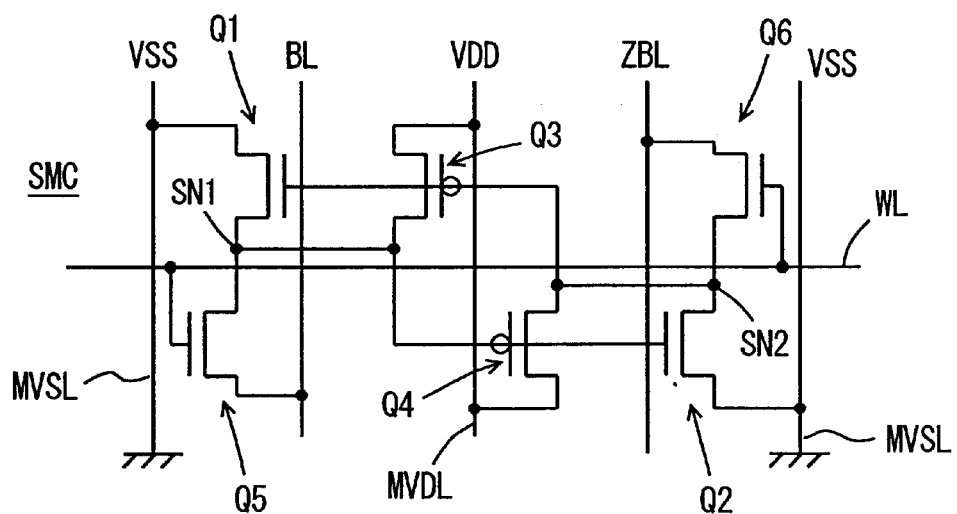
FIG. 2 schematically shows an electrical equivalent circuit of a memory cell according to the first embodiment of the present invention.

FIG. 2 schematically shows an electrical equivalent circuit of a memory cell SMC in memory cell array 1 shown in FIG. 1. In FIG. 2, memory cell SMC has a full-CMOS-cell configuration constituted of six MOS transistors Q1 to Q6. MOS transistors Q1, Q3, and Q6 are placed in alignment in the direction along which a word line WL extends, and MOS transistors Q5, Q4, and Q2 are placed in align in the direction along which word line WL extends.

N-channel MOS transistor Q1 turns ON when the voltage level of a storage node SN2 is a HIGH level, to electrically couple a storage node SN1 to a memory ground line MVSL. P-channel MOS transistor Q3 turns ON when the voltage level of storage node SN2 is a LOW level, to electrically couple storage node SN1 to memory power supply line MVDL. N-channel MOS transistor QG turns ON when the potential of a signal on word line WL is at a HIGH level, to electrically couple storage node SN2 to bit line ZBL.

N-channel type MOS transistor Q5 turns ON when the potential of a signal on word line WL is at a HIGH level, to electrically couple storage node SN1 to bit line BL. P-channel type MOS transistor Q4 turns ON when the voltage level of storage node SN1 is a HIGH level, to electrically couple memory power supply line MVDL to storage node SN2. N-channel MOS transistor Q2 turns ON when the voltage level of storage node SN1 is at a HIGH level, to electrically couple storage node SN2 to memory ground line MVSL.

In memory cell SMC shown in FIG. 2, memory ground line MVSL, bit line BL, bit line ZBL, and memory power supply line MVDL are disposed extending in the direction crossing word line WL.

MOS transistors Q1 and Q3 form a first CMOS inverter, and MOS transistors Q2 and Q4 form a second CMOS inverter. MOS transistors Q5 and Q6 are each form an access transistor that turns ON in response to the signal on word line WL.

Figure 3:
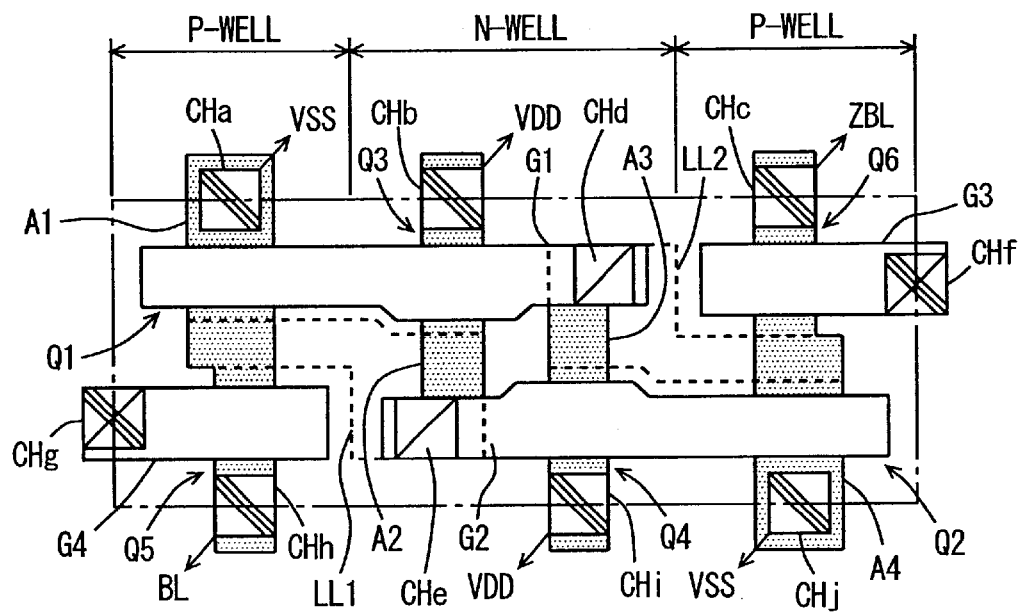
FIG. 3 schematically shows a plan layout of the memory cell shown in FIG. 1.

FIG. 3 schematically shows a plan layout of memory cell SMC shown in FIG. 2. In FIG. 3, memory cell SMC includes an N-well for forming MOS transistors Q3 and Q4, and a P-well for forming MOS transistors Q1 and Q5, and another P-well for forming MOS transistors Q6 and Q2. The P-wells are located on both sides of the N-well.

In the central N-well, active regions A2 and A3 are each formed extending in the column direction in the shape of a rectangle. Similarly, in the P-wells provided on both sides of the N-well, active regions A1 and A4 are each formed extending in the column direction in the shape of a rectangle.

A gate electrode interconnection line G1 is formed crossing active regions A1 to A3. A gate electrode interconnection line G2 is horizontally disposed crossing active regions A2 to A4.

In addition, with a space from gate electrode interconnection line G1, a gate electrode interconnection line G3 is formed crossing active region A4 in the shape of a rectangle, and a gate electrode interconnection line G4 is formed, in the form of a rectangle, crossing active region A1. Gate electrode interconnection line G1 forms gate electrodes of MOS transistors Q1 and Q3, and gate electrode interconnection line G2 forms the gate electrodes of MOS transistors Q2 and Q4.

Local interconnection lines LL1 and LL2 are formed in self alignment with gate electrode interconnection lines G1 to G4. In formation of local interconnection lines LL1 and LL2 in self alignment with the gate electrode, the following manufacturing steps are performed: after gate electrode interconnection lines G1 to G4 are formed, gate electrode interconnection lines G1 to G4 are covered with an insulation film such as a sidewall insulation film; substrate surface is exposed; and then local interconnection lines LL1 and LL2 are formed. In these steps, local interconnection lines LL1 and LL2 are formed through the borderless process, and local interconnection lines LL1 and LL2 are electrically coupled to active regions A1 to A4 in regions where local interconnection lines LL1 and LL2 overlap with active regions A1 to A4.

Since local interconnection lines LL1 and LL2 are formed in self-alignment with gate electrode interconnection lines G1 to G4, no contacts exist in portions where they overlap with each other. The contacts are formed in portions where the gate electrode interconnection lines are coupled to the local interconnection lines. The substrate surface is exposed using the gate electrode interconnection lines as a mask, and the local interconnection lines are formed.

In a region of isolation oxide film (field insulation film region) in the outside of active regions, since local interconnection lines LL1 and LL2 are formed through the borderless process, local interconnection lines LL1 and LL2 are directly formed on the isolation oxide film, and the isolation oxide films are not etched.

Local interconnection line LL1 electrically couples active regions A1 and A2 together, and local interconnection line LL2 electrically couples active regions A3 and A4 together. In this way, the drains of MOS transistors Q1, Q3, and Q5 are electrically coupled with each other through local interconnection line LL1 and similarly, the drains of MOS transistors Q2, Q6, and Q4 are electrically coupled with each other through local interconnection line LL2.

Local interconnection line LL1 is electrically coupled via a contact CHe to gate electrode interconnection line G2. Similarly, gate electrode interconnection line G1 is electrically coupled via a contact CHd to local interconnection line LL2. Gate electrode interconnection line G3 is provided with a contact CHf for coupling to word line WL. Similarly, gate electrode interconnection line G4 is provided with a contact CHg for coupling to word line WL.

Also in active region A1, at one end thereof, a contact CHa for coupling to memory ground line MVSL is provided adjacent tQ gate electrode interconnection line G1, and at the other end, a contact CHh for coupling to bit line BL is provided adjacent to gate electrode interconnection line G4. Active regions A2 and A3 are provided with contacts CHb and CHi, respectively, for coupling to memory power supply line MVDL. These contacts are formed in self-alignment with the corresponding gate electrode interconnection lines.

For active region A4, a contact CHc for coupling to bit line ZBL is provided in a portion adjacent to gate electrode interconnection line G3, and in an region adjacent to gate electrode interconnection line G2, a contact CHj for coupling to memory ground line MVSL is provided. These contacts for coupling to the bit lines, the memory ground lines, memory power supply lines, and word lines are formed in self-alignment with the corresponding gate electrode interconnection lines.

In the layout of memory cell SMC shown in FIG. 3, local interconnection lines LL1 and LL2 form storage nodes SN1 and SN2, respectively. Contacts CHd and CHe are formed through the following steps; the contact holes are formed for gate electrode interconnection lines G1 and G2 before local interconnection lines LL1 and LL2 are formed; and the contact holes are buried in the formation of local interconnection lines LL1 and LL2.

In memory cell SMC of a horizontally long type, the MOS transistors are symmetrically placed, and local interconnection lines LL1 and LL2 are each symmetric in shape. This facilitates patterning. In addition, local interconnection lines LL1 and LL2 are formed through the borderless process with respect to active regions A1 to A4, and are formed in self-alignment with gate electrode interconnection lines G1 to G4. This reduces the number of the contact holes, thereby allowing the layout occupation area of memory cell SMC to be reduced. In addition, the distance between gate electrode interconnection lines G1 and G2 can be reduced, and consequently, the memory cell occupation area can be reduced.

Figure 4:
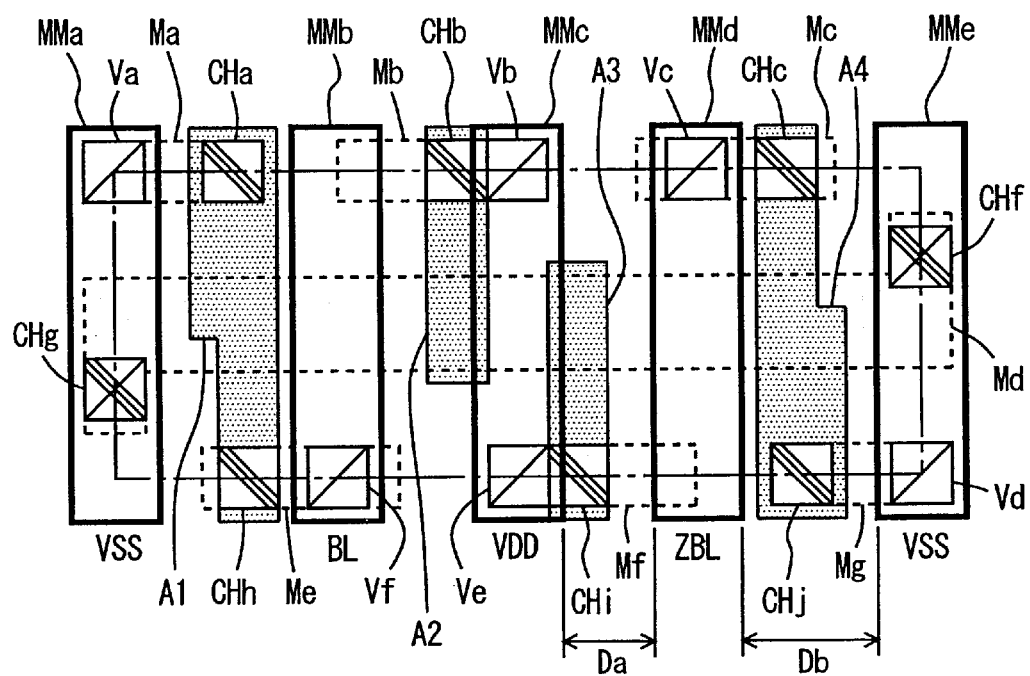
FIG. 4 schematically shows a layout of upper-layer interconnection lines above the memory cell shown in FIG. 3.

FIG. 4 schematically shows a layout of metal interconnection lines for the layout of memory cell SMC shown in FIG. 3. In FIG. 4, the same reference characters are used for the portions corresponding to those in the layout shown in FIG. 3, and detailed description therefor is omitted.

In FIG. 4, rectangular first level metal interconnection lines (referred to as a first metal interconnection line hereinafter) Ma, Mb, and Mc are disposed extending in the row direction for contacts CHa, CHb, and CHc, respectively. Through contacts CHa, CHb, and CHc, first metal interconnection lines Ma, Mb, and Mc are electrically coupled to active regions A1, A2, and A4, respectively. The gate electrode interconnection lines are formed of, for example, polysilicon, the local interconnection lines are formed of, for example, tungsten, and first metal interconnection lines are formed of, for example, aluminum or copper.

Rectangular first metal interconnection lines Me, Mf, and Mg are disposed extending in the row direction for contacts CHh, CHi, and CHj, respectively. Through contacts CHh, CHi, and CHj, first metal interconnection lines Me, Mf, and Mg are electrically coupled to active regions A1, A3, and A4, respectively.

Contact CHg is electrically coupled to a first metal interconnection line Md extending in the row direction in a central region of memory cell SMC. First metal interconnection line Md forms a word line, and is electrically coupled to gate electrode interconnection lines G4 and G3 shown in FIG. 3 via respective contacts CHg and CHf. In a central portion in the row direction of memory cell SMC, since only the gate electrode interconnection lines and the local interconnection lines are disposed, first metal interconnection line Md forming the word line can be disposed with sufficient margin.

Second level metal interconnection line (referred to as a second metal interconnection line hereinafter) MMa to MMe are disposed in the column direction. Second level metal interconnection line MMa is electrically coupled to first metal interconnection line Ma through a via hole Va. Second metal interconnection line MMb is electrically coupled to first metal interconnection line Me through a via hole Vf. Second metal interconnection line MMc is electrically coupled to first metal interconnection line Mb through a via hole Vb, as well as to first metal interconnection line Mf through a via hole Ve. The second metal interconnection lines are interconnection lines formed on a layer upper than the first metal interconnection lines.

Second metal interconnection line MMd is electrically coupled to first metal interconnection line Mc through a via hole Vc. Second metal interconnection line MMe is electrically coupled to first metal interconnection line Mg through a via hole Vd.

Second metal interconnection lines MMa and MMe individually form memory ground lines MVSL for transferring ground voltage VSS. Second metal interconnection line MMc forms a memory power supply line MVDL that transfers power supply voltage VDD. Second metal interconnection lines MMb and MMd form bit line BL and bit line ZBL, respectively.

With second metal interconnection lines MMa to MMe, memory power supply line MVDL, memory ground lines MVSL, and bit lines BL and ZBL are formed extending in the column direction. Memory cell SMC has the horizontally long structure, and therefore, the pitches Db between bit line BL and a ground line (VSS) and between bit line ZBL and a ground line can be made large. Thus, standby-current defects caused by a short circuit between a bit line and a ground line can be minimized.

With memory cell SMC having the horizontally long structure, as shown in FIG. 4, memory power supply lines MVDL are disposed perpendicular to word lines WL, and a distance Da between each of bit lines BL and each of memory power supply lines MVDL can be sufficiently made long. However, a short circuit may be likely to occur because of particles, and a standby-current defect may thereby be caused. In this case, the configuration shown in FIG. 1 is used to eliminate the standby-current defect.

Figure 5:
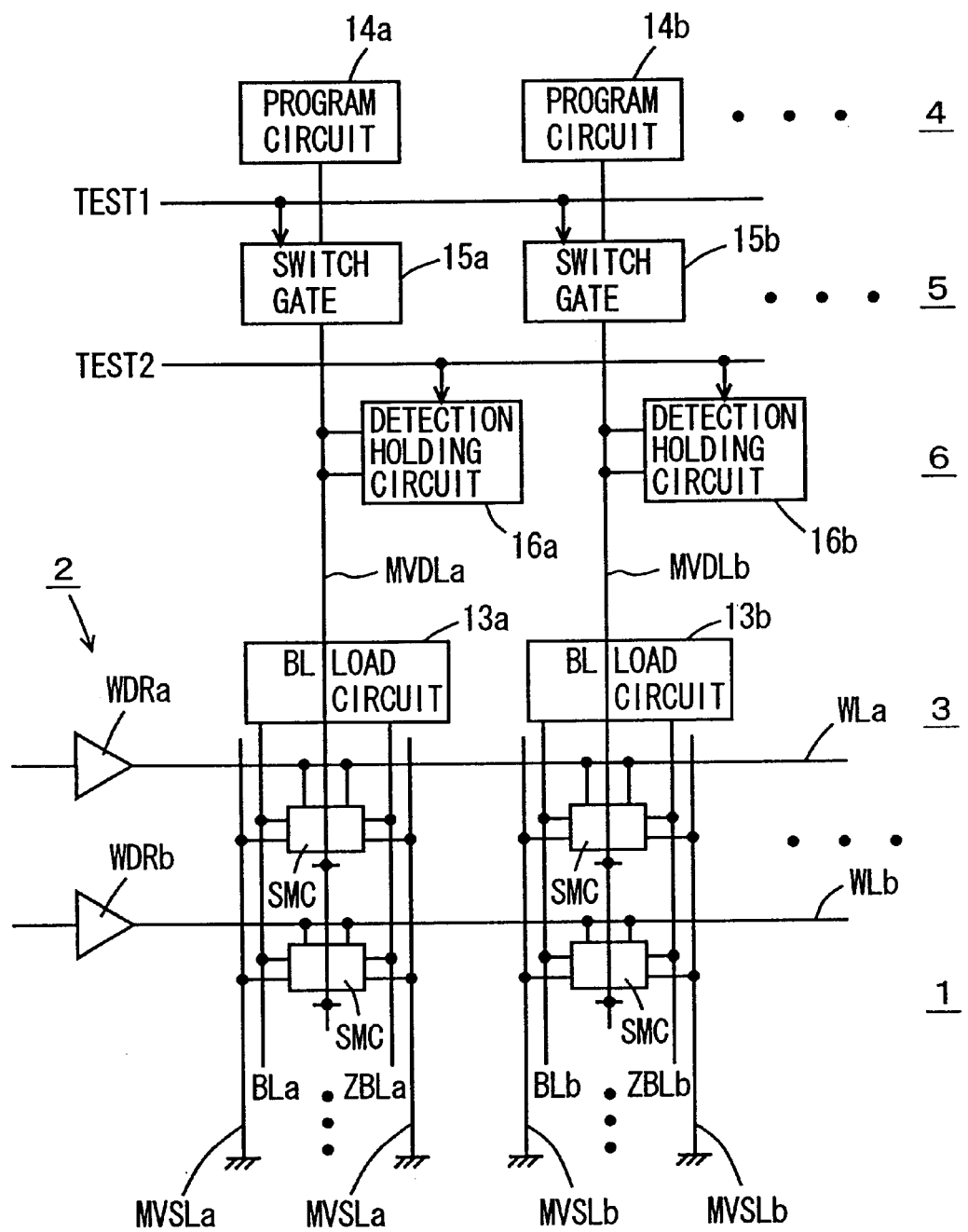
FIG. 5 schematically shows a configuration of a main portion of the semiconductor memory device according to the first embodiment of the present invention.

FIG. 5 schematically shows a configuration of a main portion of the semiconductor memory device according to the first embodiment of the present invention.

In FIG. 5, in memory cell array 1, memory cells SMC are disposed in rows and columns. FIG. 5 shows representatively memory cells SMC disposed in two rows and two columns. For memory cells SMC disposed in alignment on two rows in the row direction, a word line WLa and a word line WLb are individually disposed. Memory cells SMC have the horizontally long structure shown in FIGS. 2 to 4.

Word lines WLa and WLb are driven by word drivers WDRa and WDRb, respectively. A word driver WDRa and a word driver WDRb are included in word line selection circuit 2 shown in FIG. 1, and drive corresponding word lines into a selected state according to an output signal of an address decoding circuit (not shown). In a standby state or an unselected state, word lines WLa and WLb are maintained at the ground voltage level.

Corresponding to the memory cell columns, there are disposed a pair of a bit line BLa and a bit line ZBLa and a pair of a bit lines BLb and a bit line ZBLb. A bit line load circuit 13a (BL load circuit) is provided for precharging bit lines BLa and ZBLa in a standby state. Similarly, a BL load circuit 13b is provided for bit lines BLb and ZBLb.

Corresponding to the memory cell columns, memory power supply lines MVDLa and MVDLb are provided to extend in the column direction. In addition, a memory ground line MVSLa is disposed parallel to bit lines BLa and ZBLa, and similarly, a memory ground line MVSLb is disposed parallel to bit lines BLb and ZBLb. In the configuration shown in FIG. 5, memory power supply lines MVDLa and MVDLb are separately provided for the respective memory cell columns.

Fuse program circuit 4 includes program circuits 14a and 14b provided corresponding to the memory cell columns. Each of program circuit 14a and 14b stores information indicating whether the corresponding column include a defective memory cell SMC. Switch circuit 5 includes switch gates 15a and 15b provided corresponding to memory power supply lines MVDLa and MVDLb, respectively. According to information stored in corresponding program circuits 14a and 14b and a test mode instruction signal TEST1, switch gates 15a and 15b selectively disconnect the corresponding memory power supply lines MVDLa and MVDLb from a power supply node (not shown).

Voltage control circuit 6 includes detection holding circuits 16a and 16b provided corresponding to respective memory power supply lines MVDLa and MVDLb and activated when a test mode instruction signal TEST2 is activated. When activated, detection holding circuits 16a and 16b determine whether voltage levels of the corresponding memory power supply lines MVDLa and MVDLb are higher than or equal to a predetermined voltage level, and drive memory power supply lines MVDLa and MVDLb to voltage levels corresponding to the determination results. Specifically, when the corresponding memory power supply lines MVDLa and MVDLb are at a voltage level lower than the predetermined potential level, detection holding circuits 16a and 16b drive the corresponding memory power supply lines MVDLa and MVDLb to the ground voltage level, and maintain the corresponding memory power supply lines MVDLa and MVDLb while activated.

Figure 6:
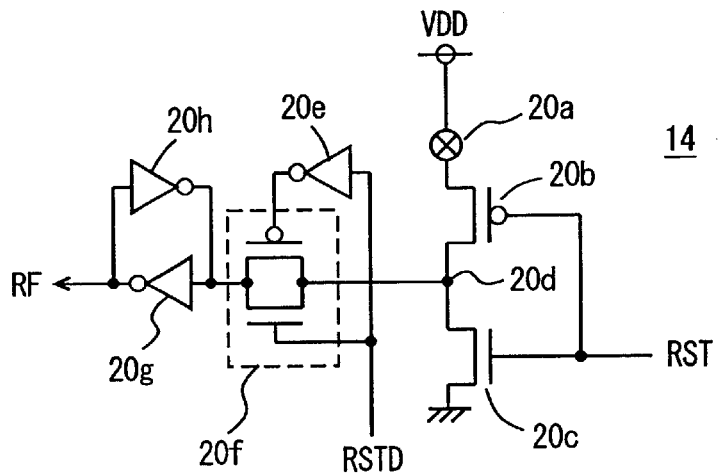
FIG. 6 shows an example of a configuration of a program circuit shown in FIG. 5.

FIG. 6 schematically shows an example of a configuration of program circuit 14a, 14b shown in FIG. 5. Since program circuits 14a and 14b have the same configuration, FIG. 6 shows the configuration of a program circuit 14 as a representative of program circuits 14a and 14b.

In FIG. 6, program circuit 14 includes a fusible link element (fuse element) 20a coupled to a power supply node, a P-channel MOS transistor 20b for coupling link element to a node 20a in response to a reset signal RST, an N-channel MOS transistor 20c for driving a node 20b to ground potential level in response to reset signal RST, an inverter 20e receiving a delayed reset signal RSTD, a CMOS transmission gate 20f selectively rendered conductive, in response to delayed reset signal RSTD and an output signal of inverter 20e for transmitting a potential on a node 20d, an inverter 20g inverting a signal received through transmission gate 20f to generate a fuse program signal PF, and an inverter 20h inverting fuse program signal PF for transmission to an input of inverter 20g.

Link element 20a can be fused off with an energy beam, such as a laser beam. When the corresponding column includes a defective memory cell SMC, link element 20a is blown off.

Reset signal RST is activated upon system reset or power up. Delayed reset signal RSTD is a signal generated by delaying reset signal RST by a predetermined time. Inverter 20g and inverter 20h form an inverter latch, and latches a signal transferred when CMOS transmission gate 20f turns ON, to generate fuse program signal PF.

Reset signal RST is activated when the system is either powered on or reset, and is at a HIGH level for a predetermined time, and is normally maintained at a LOW level. When reset signal RST is set to the HIGH level, N-channel MOS transistor 20c turns ON, and node 20d is initialized to the ground voltage level. Subsequently, reset signal RST returns to the LOW level, P-channel MOS transistor 20b turns ON, and link element 20a is electrically coupled to node 20d. When link element 20a is in the conductive state, power supply voltage VDD is transferred to P-channel MOS transistor 20b. When link element 20a is blown off, since P-channel MOS transistor 20b is disconnected from the power supply node, node 20d is maintained at the LOW level.

When a predetermined time passes after reset signal RST is set to the HIGH level, delayed reset signal RSTD goes to a HIGH level, and CMOS transmission gate 20f is responsively turned ON. When CMOS transmission gate 20f turns ON, the voltage of node 20d is transferred to inverter 20g. When link element 20a is blown off, since node 20d is at the LOW level, fuse program signal PF generated from inverter 20g goes to a HIGH level. On the other hand, when link element 20a is in the conductive state, since node 20d is set to the HIGH level of the level of power supply voltage VDD, fuse program signal PF generated from inverter 20g is at a LOW level.

When reset signal RST and delayed reset signal RSTD return to the LOW level, CMOS transmission gate 20f turns OFF, and inverter 20g is disconnected from node 20d. Fuse program signal PF is latched by the inverter latch circuit formed of inverters 20g and 20h.

CMOS transmission gate 20f is adapted to turn ON when node 20d is at the LOW level, to initialize the input node of inverter 20g to a LOW level. Thereafter, when reset signal RST returns to the LOW level, the voltage level of the input node of inverter 20g is set to a voltage level corresponding to the voltage level of node 20b. Subsequently, CMOS transmission gate 20b is rendered non-conductive, to prevent the transference of a noise in a blown off link element 20a to inverter 20g for exerting an adverse effect fuse program signal PF. Thus, fuse program signal PF that corresponds to the state of link element 20a is reliably produced.

Figure 7:
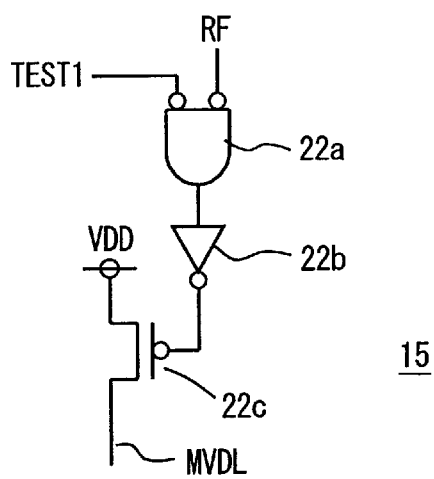
FIG. 7 shows an example of a configuration of a switch gate shown in FIG. 5.

FIG. 7 schematically shows an example of a configuration of switch gate 15a and 15b shown in FIG. 5. Since switch gates 15a and 15b have the same configuration, FIG. 7 shows the configuration of a switch gate 15, as a representative of switch gates 15a and 15b.

In FIG. 7, switch gate 15 includes a NOR circuit 22a receiving a fuse program signal PF from a corresponding program circuit and test mode instruction signal TEST1, an inverter 22b inverting an output signal of NOR circuit 22a, and a P-channel MOS transistor 22c for selectively coupling a memory power supply line MVDL to a power supply node.

During a normal operation mode, test mode instruction signal TEST1 is at a LOW level. When the corresponding column includes a defective memory cell SMC, fuse program signal PF is set to a HIGH level, and NOR circuit 22a produces a LOW level signal. Responsively, inverter 22b produces a HIGH level signal, P-channel MOS transistor 22c turns OFF, and corresponding memory power supply line MVDL is disconnected from the power supply node. In other words, power supply voltage VDD is not supplied to memory cells SMC in the column including a standby-current-defective memory cell SMC. Thereby, leakage current can be prevented form flowing via standby-current-defective memory cell SMC during standby, to suppress an increase in the standby current.

When all memory cells SMC on a corresponding column are normal, fuse program signal PF is set at a LOW level. Therefore, in a normal operation mode, an output signal of NOR circuit 22a is at a HIGH level, and accordingly, an inverter 22b produces a LOW level signal. In this state, P-channel MOS transistor 22c turns ON, and power supply voltage VDD is supplied to memory power supply line MVDL.

In a test mode, test mode instruction signal TEST1 is set to a HIGH level, and the output signal of NOR circuit 22a is fixed at the LOW level. In this state, an output signal of inverter 22b is at a HIGH level, and P-channel MOS transistor 22c is in the OFF state. In other words, in the test mode, under the state in which memory power supply line MVDL is forcibly disconnected from the power supply node, detection is made whether the voltage level of memory power supply line MVDL is lowered because of current leakage when the memory array is maintained in a standby state. Then, according to the detection result, further detection is made as to the existence of a standby-current-defective memory cell SMC.

Figure 8:
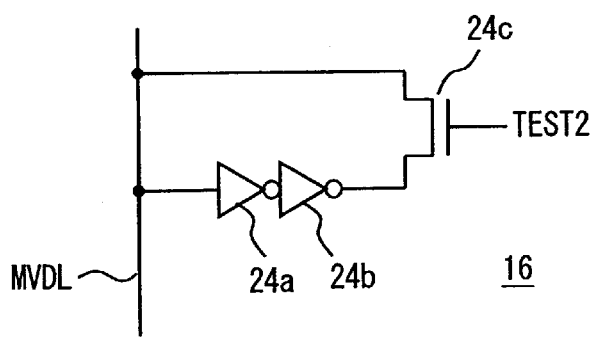
FIG. 8 shows a configuration of a detection holding circuit shown in FIG. 5.

FIG. 8 schematically shows an example of a configuration of detection holding circuit 16a and 16b shown in FIG. 5. Since detection holding circuits 16a and 16b have the same configuration, FIG. 8 shows the configuration of a detection holding circuit 16 as a representative of detection holding circuits 16a and 16b.

In FIG. 8, detection holding circuit 16 includes an inverter 24a that receives a signal from memory power supply line MVDL, an inverter 24b that receives an output signal of inverter 24a, and an N-channel MOS transistor 24c that selectively transfers an output signal of inverter 24b to memory power supply line MVDL in response to test mode instruction signal TEST2.

An input logic threshold voltage of inverter 24a is set to such a level that the voltage drop, caused when the voltage of memory power supply line MVDL is lowered because of the current leakage in testing, can be detected. In the test mode, test mode instruction signal TEST2 is set to a HIGH level, to turn N-channel MOS transistor 24c ON. Accordingly, inverters 24a and 24b form a so-called half latch that latches the potential level of memory power supply line MVDL. When the voltage level of memory power supply line MVDL is lowered because of the current leakage, inverter 24a amplifies the voltage drop and produces a HIGH level signal, and inverter 24b produces a LOW level signal accordingly. Inverter 24b is used to reduce memory power supply line MVDL at an intermediate voltage level to the ground voltage level. Thereby, a standby-current-defective memory cell SMC is reliably set to an operation-defective state. Specifically, the power supply nodes of the memory cells are set to the ground potential level to cause the data stored in memory cells SMC to disappear.

In a normal operation mode, test mode instruction signal TEST2 is at a LOW level, N-channel MOS transistor 24c is in the OFF state, and the output of inverter 24b is disconnected from memory power supply line MVDL. Inverters 24a and 24b are inhibited from detecting the voltage level of memory power supply line MVDL and driving/preserving the voltage level of memory power supply line MVDL according to the detection result.

Figure 9:
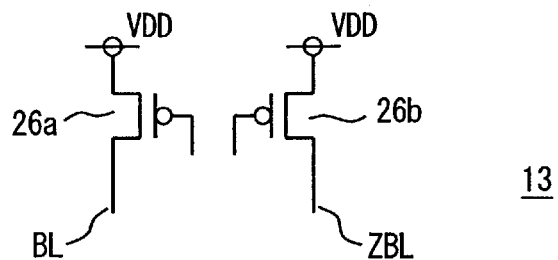
FIG. 9 shows a configuration of a BL load circuit shown in FIG. 5 in a standby-state.

FIG. 9 shows a configuration of BL load circuit 13a and 13b shown in FIG. 5. Since BL load circuits 13a and 13b have the same configuration, FIG. 9 shows the configuration of a BL load circuit 13 as a representative of BL load circuits 13a and 13b.

BL load circuit 13 includes a P-channel MOS transistor 26a provided for a bit line BL, and a P-channel MOS transistor 26b provided for a bit line ZBL. In the standby state, MOS transistors 26a and 26b electrically couples associated bit lines BL and ZBL to a power supply node. In an access mode in which data write/data read is performed, control signals are supplied to transistors 26a and 26b. For example, transistors 26a and 26b are kept in the OFF state in data writing mode. The circuit connection in the standby state of BL load circuit is equivalently shown in FIG. 9. As BL load circuit 13, any configuration can be employed as long as bit lines BL and ZBL are electrically coupled to the power supply nodes in the standby state.

In the standby state, word drivers WDRa and WDRb maintain corresponding word lines WLa and WLb at the ground voltage level. Therefore, also for word drivers WDRa and WDRb, any configuration can be employed as long as word line WL is maintained at a LOW level of, for example, the ground voltage level.

Figure 10:
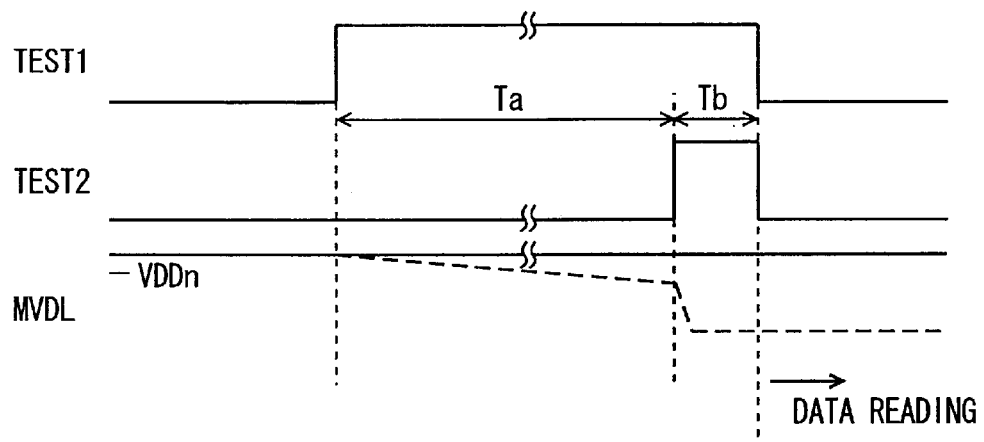
FIG. 10 is a signal waveform diagram representing the voltages in a testing mode of the semiconductor memory device according to the first embodiment of the present invention.

FIG. 10 is a signal waveform diagram representing testing operations of the semiconductor memory device according to the first embodiment of the present invention. Now, referring to FIG. 10, description will be made on testing operations of the semiconductor memory device shown in FIG. 1 and FIGS. 5 to 9.

In the standby state in the test mode, power supply voltage VDD is set higher than a voltage level VDDn used in a normal mode of operation. Thereby, the standby-current-defective but normally-operable state of a memory cell SMC is caused to be revealed. Both test mode instruction signal TEST1 and TESt2 stay at the LOW level. In a mode of detecting a standby-current-defective but normally-operable state, since fuse programming is not yet executed, output signals of program circuits 14a and 14b shown in FIG. 5 are at a LOW level.

In switch gates 15a and 15b, P-channel MOS transistors 22c are in the ON state, to supply power supply voltage VDD to corresponding memory power supply lines MVDL. As for a current supply capability, P-channel MOS transistor 22c is made to have a large size (ratio of the channel width to the channel length) sufficient to supply a sufficiently stable operation power supply voltage to memory cells SMC electrically coupled to a corresponding memory power supply line MVDL.

In memory cells SMC in the state as mentioned above, power supply voltage VDD supplied through memory power supply lines MVDLa and MVDLb is higher than voltage level VDDn supplied in a normal operation mode. When a resistance component due to particles and the like exists, the ON-resistance of each of the MOS transistors in the memory cell is reduced, and effects of the resistance component due to the foreign matters and the like is caused to be revealed. Thereby, a memory cell SMC that is likely to cause a standby-current defect is reliably set to a standby-current defective state.

Subsequently, test mode instruction signal TEST1 is driven to a HIGH level, P-channel MOS transistors 22c in switch gates 15a and 15b turn OFF, memory power supply lines MVDLa and MVDLb shown in FIG. 5 are disconnected from the power supply nodes. For a period Ta, memory power supply lines MVDL (MVDLa, and MVDLb) are disconnected from the power supply node. The period Ta is set to such a period that no significant voltage drop is caused by a normal standby current leakage permitted by a l specification value, while a significant voltage drop is caused on memory power supply line MVDL only by an abnormal current in a standby state.

When a memory cell SMC having a standby-current defect is present, the voltage level of a corresponding memory power supply line MVDL is lowered by current leakage thereof. On the other hand, when no memory cell SMC having a standby-current defect is present, the voltage level of a corresponding memory power supply line MVDL is maintained at a precharged voltage level thereof.

After time period Ta passes, test mode instruction signal TEST2 is driven to a HIGH level to thereby activate detection holding circuits 16a and 16b shown in FIG. 5. Specifically, in detection holding circuit 16, N-channel MOS transistor 24c turns ON, inverter 24a detects the voltage level of a corresponding memory power supply line MVDL, and the state of an output signal of an inverter 24a is set according to the detection result. Subsequently, the voltage level of memory power supply line MVDL is set according to an output signal of inverter 24b. That is, in the event that the voltage level of memory power supply line MVDL is lowered through abnormal current leakage, a HIGH level signal is produced from inverter 24a, and accordingly, memory power supply line MVDL is driven by inverter 24b to the ground voltage level. On the other hand, for memory power supply line MVDL which is small in voltage drop and through which a normal standby leakage current flows, in detection holding circuits 16a and 16b, a LOW level signal is produced from inverter 24a, a HIGH level signal is produced from inverter 24b accordingly, and memory power supply line MVDL is maintained at the level of an operation power supply voltage of inverter 24b. More specifically, the potential level of memory power supply line MVDL is amplified by inverter 24a, an output signal of inverter 24a is further amplified by inverter 24b, and the voltage level of memory power supply line MVDL is thereby set to the power supply voltage or the ground voltage level.

As described above, for memory cell SMC having a standby-current defect, since the voltage level of a corresponding memory power supply line MVDL is driven to the ground voltage level, the voltage levels of both internal nodes SN1 and SN2 storing data driven to a LOW level. Thereby, the stored data is erased, and memory cell SMC is therefore set to an operation defective state.

After test mode instruction signals TEST1 and TEST2 are set to a LOW level, data stored in memory cells SMC are read out, and a determination is made as to whether data is stored correctly in memory cells SMC. Thereby, a memory cell SMC having no operational defect and having a standby-current defect, that is, the standby-current-defective but normally-operable memory cell are forcibly set to the operation-defective state, and can be reliably detected.

Now, the abnormal standby current is assumed to be at minimum 1 $\mu$A, the normal standby current leakage is assumed to be at maximum 1 nA. Time period Ta shown in FIG. 10 is assumed to be 20 $\mu$s. The parasitic capacitance of memory power supply line MVDL is assumed to be 10 pF. In this case, because of the abnormal standby current of 1 $\mu$A, the voltage level of memory power supply line MVDL corresponding to the standby-current-defective memory cell drops to a voltage level expressed by $$VDD-(1\ \mu A \cdot 20\ \mu s)/10\ pF = VDD-2\ V.$$

Accordingly, when power supply voltage VDD is 3.6 V, the voltage level of memory power supply line MVDL is lowered to 1.6 V. In this state, memory cells SMC cannot sufficiently be set to the operation-defective state. For memory power supply line MVDL having the voltage level lowered to 1.6 V, inverter 24a shown in FIG. 8 is used to detect the drop in voltage level. The input logic threshold voltage of inverter 24a is set to, for example, 2.0 V to cause inverter 24a to output a high level signal. Then, inverter 24b amplifies the output signal of inverter 24a, drives memory power supply line MVDL corresponding to a standby-current-defective memory cell SMC to the ground voltage level, and maintains the voltage level thereof while switch gate is in an OFF state.

In the event that a normal standby leakage current of 1 nA flows to memory power supply line MVDL, even when the parasitic capacitance of memory power supply line MVDL is estimated to be as small as 1 pF, the voltage level thereof is lowered only by the voltage expressed as follows:

$$1\ nA \cdot 20\ \mu s/1\ pF = 20\ mV.$$

Accordingly, memory power supply line MVDL through which the normal standby leakage current flows is driven by inverter 24b shown in FIG. 8 to a normal power supply voltage level.

In FIG. 8, a time period Tb is a period required for inverter 24b to securely drive a memory cell power supply line in a standby-current-defective state to the ground voltage level. For example, with 1 mA of current driven by a discharging N-channel MOS transistor, even when the parasitic capacitance of memory power supply line MVDL is 10 pF, 40 ns is necessary in order to cause a voltage drop of 4 V. Hence, when time period Tb in which test mode instruction signal TEST2 is kept at a HIGH level is set to, for example, 100 ns, memory power supply line MVDL in the standby-current-defective state can be driven down to the ground voltage level.

Figure 11:
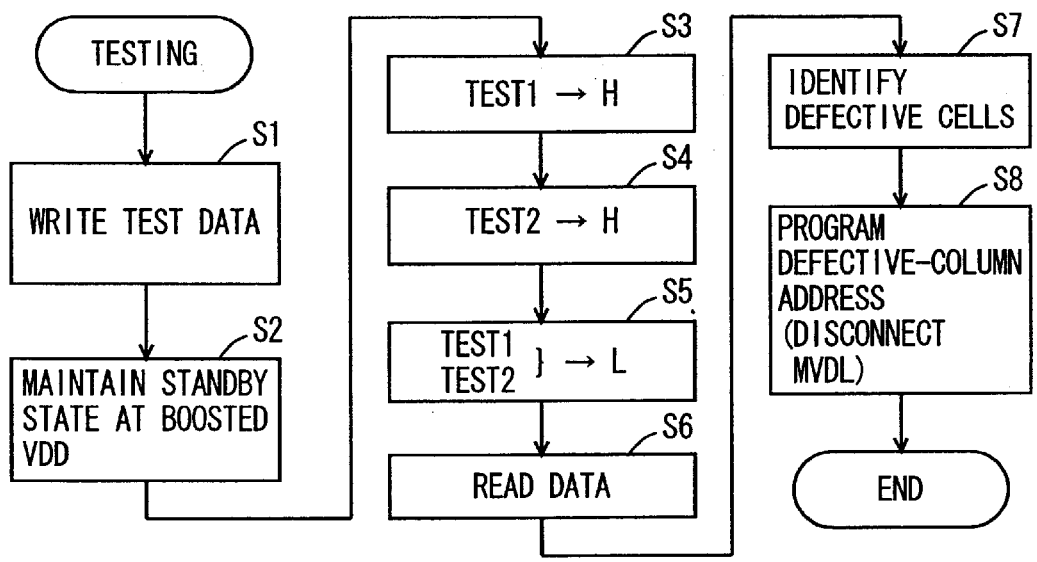
FIG. 11 is a flowchart representing a testing method of the semiconductor memory device according to the first embodiment of the present invention.

FIG. 11 is a flowchart representing a testing method of the semiconductor memory device according to the first embodiment of the present invention. Now, referring to the flowchart shown in FIG. 11, a description will be made on the testing method of the semiconductor memory device according to the first embodiment.

First, test data are written to the memory cells of memory cell array 1 (shown in FIG. 1) (step S1). After the test data are written to the memory cells, power supply voltage VDD is driven to and kept at a level higher than that in the normal state, and memory cell array 1 is maintained in the standby state (step S2). In writing of test data, the following steps may be performed. In step S1, the test data is written to the memory cells at the level of the power supply voltage used in the normal operation state. In step S2, after the standby state of the memory device is set, the voltage level of power supply voltage VDD is driven higher. These operations are performed through the control of the level of power supply voltage supplied through power supply terminal under the control of an external tester. By driving power supply voltage VDD to be higher than that normally used in step 2, as described above, the existence of a standby-current-defective but normally-operable memory cells is revealed.

Subsequently, test mode instruction signal TEST1 is set to a HIGH level (step S3), and memory power supply lines MVDL are disconnected from the power supply nodes. When a memory power supply lines MVDL is electrically coupled to a standby-current-defective memory cell, the voltage level of memory power supply line MVDL is lowered.

Subsequently, test mode instruction signal TEST2 is set to a HIGH level, the voltage levels of respective memory power supply lines MVDL are detected, and the voltage levels of corresponding memory power supply lines MVDL are set according to the results of the detection. Specifically, the voltage level of the memory power supply lines MVDL that is lowered by an abnormal standby current is driven to the ground voltage level.

Subsequently, both test mode instruction signals TEST1 and TEST2 are set to a LOW level (step S5), to complete the operation of causing the standby-current-defective memory cells to be revealed and of setting the defective memory cells to the operation-defective state.

In the standby-current-defective memory cell, the ground voltage is supplied to the power supply node thereof, and stored data is erased. Subsequently, the stored data of the memory cells are sequentially read out (step S6).

When the data read out of a memory cell is different from the written test data (as the data stored in the memory cell, the corresponding storage nodes are both at a LOW level, and read out data is uncertain data), the address (column address) of the defective memory cell is identified (step S7). The address of the memory cell that causes an operational defect is detected when a test mode is executed for detecting the operational defect. The discrimination of operation-defect memory cell and a standby-defective and normally-operable memory cell is performed by performing the test for detecting the operation-defective memory cell and the test for detecting the standby-current defective and operation-defective memory cell separately. This is because the operation-defective memory cell does not always cause the standby current defect.

After the defective memory cells are specified at step S7, the column address of the defective memory cell is programmed. In addition, the link element of the program circuit shown in FIG. 1 corresponding to the defective column is blown off. Thus, memory power supply line MVDL electrically coupled to the standby-current-defective memory cell is disconnected from the power supply node. Accordingly, the standby-current-defective memory cell is prevented from causing an abnormal standby leakage current to flow in the normal operation mode. The reason why the defective column address is used is that memory power supply line MVDL extends in the column direction, and memory power supply line MVDL is disposed corresponding to each of the memory cell columns.

For the operation-defective memory cell, corresponding memory power supply line MVDL may be disconnected from the power supply node regardless of whether the memory cells are defective or normal in standby current.

Through programming of the defective column address at step S8, standby-current-defective but normally-operable memory cell in the defective column is replaced by a redundant memory cell.

In the configuration shown in FIG. 5, switch gate (15a, 15b) is provided corresponding to the memory cell column, and memory power supply line MVDL is disconnected in units of the memory cell columns. However, the switch gate may be provided for each plurality of memory power supply lines MVDL. In this arrangement, the size (current supply capability) of P-channel MOS transistor 22c included in switch gate 15 is so set as to allow sufficient operation current to be supplied to the memory cells in corresponding plurality of columns. In this configuration, the redundancy replacement is performed for standby-current-defective memory cells on a basis of the plurality of columns.

In step S6, when the data stored in memory cells are read out, test mode instruction signals TEST1 and TEST2 may be maintained at an active state. Specifically, the data of memory cells may be read out under the state in which the voltage of memory power supply line MVDL is latched by detection holding circuit 16.

As described above, according to the first embodiment of the present invention, in the test mode, the memory power supply lines extending in the column direction are disconnected from the power supply node, and the voltage levels of the memory power supply lines are detected. When the voltage level of the memory power supply line is lowered, the memory power supply line is driven to the ground voltage level, and standby-current-defective memory cells can be securely set to an operation-defective state. Thus, the standby-current-defective but normally-operable memory cell is reliably set to the operation-defective state, thereby enabling the corresponding column address to be specified. In addition, the standby-current-defective memory power supply line is disconnected from the power supply node, and the standby-current defect can be securely repaired.

Second Embodiment

Figure 12:
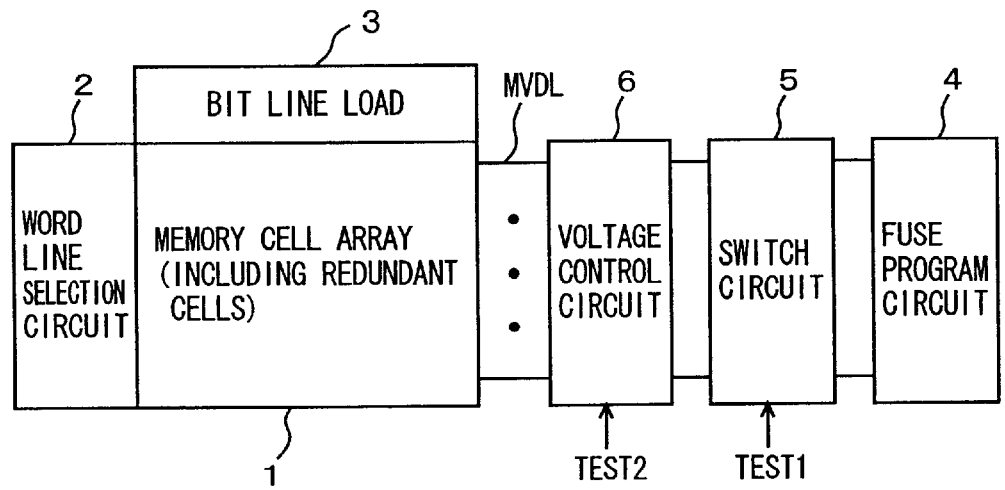
FIG. 12 schematically shows the overall configuration of the semiconductor memory device according to a second embodiment of the present invention.

FIG. 12 schematically shows the overall configuration of a semiconductor memory device according to a second embodiment of the present invention. Similarly to the first embodiment, the semiconductor memory device shown in FIG. 12 includes a fuse program circuit 4, a switch circuit 5, and a voltage control circuit 6. The configurations of fuse program circuit 4, switch circuit 5, and voltage control circuit 6 are the same as those used in the first embodiment. In the arrangement shown in FIG. 12, memory source-power lines MVDL are arranged parallel to the word lines in a memory cell array 1. For memory cell array 1, similarly to the configuration of the first embodiment, a word line selection circuit 2, and bit line loads 3 are provided.

Figure 31:
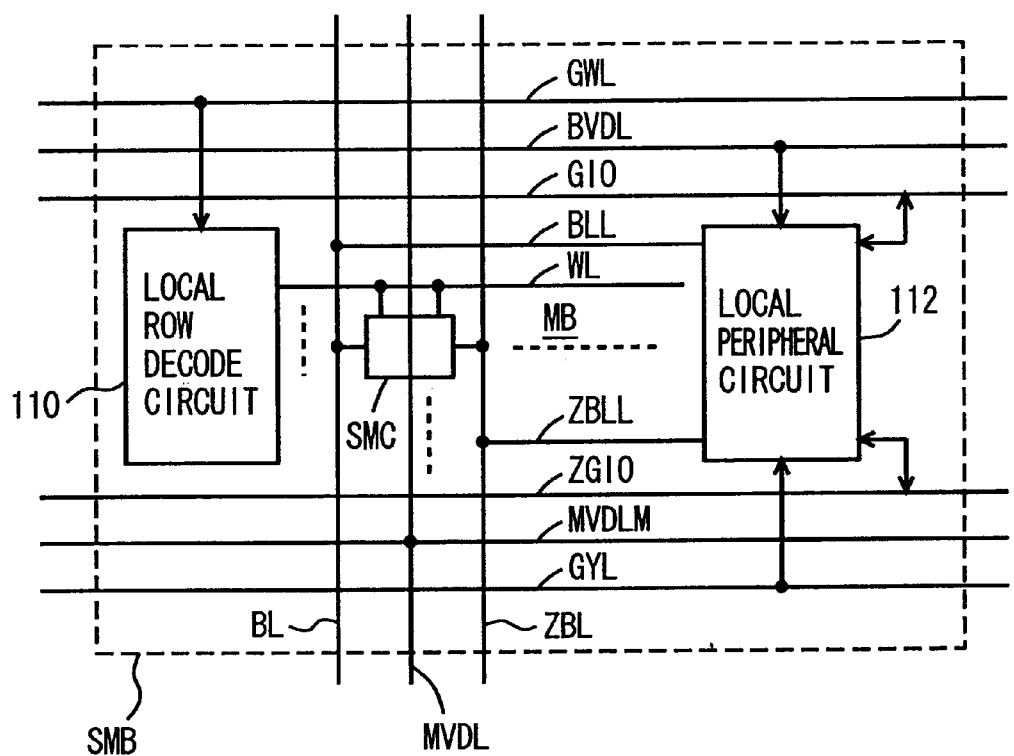
FIG. 31 is a diagram schematically showing a configuration of a sub memory block of the memory block shown in FIG. 29.

In the arrangement shown in FIG. 12, in memory cell array 1, memory power source lines MVDL are disposed in the row direction, and detection holding circuits in voltage control circuit 6, and switch gates in switch circuit 5 are provided for the rows. The memory cell has a vertically long cell structure, as shown in FIG. 31.

Figure 13:
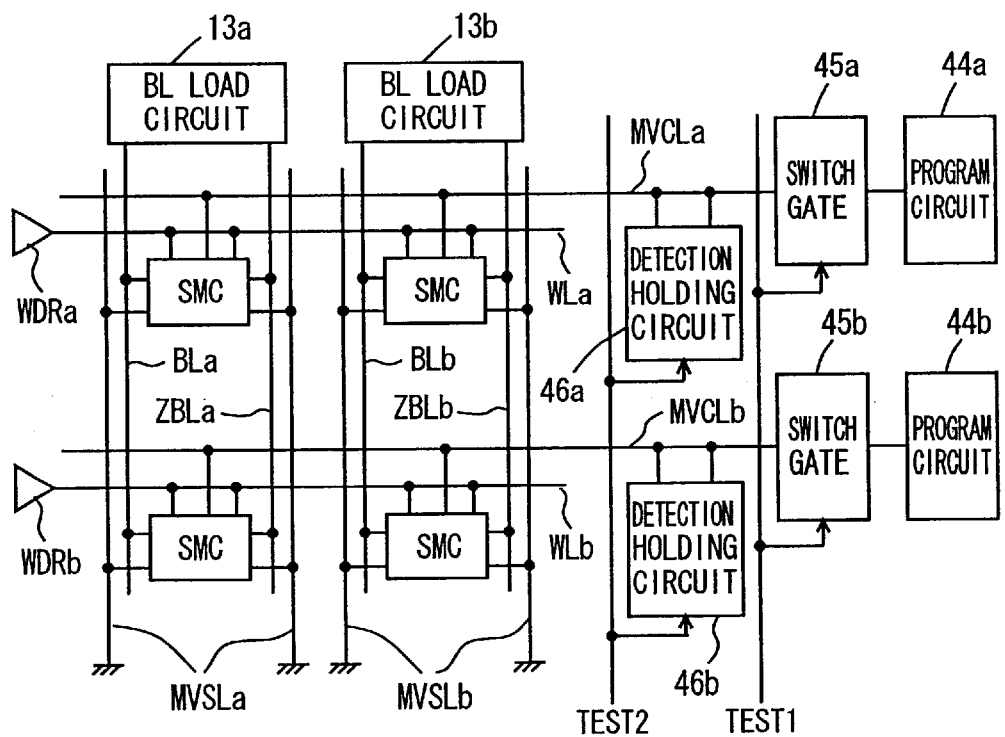
FIG. 13 schematically shows a configuration of a main portion of the semiconductor memory device according to the second embodiment of the present invention.

FIG. 13 schematically shows a configuration of a main portion of the semiconductor memory device shown in FIG. 12. Similarly to the configuration shown in FIG. 5, FIG. 13 schematically shows a configuration of a portion corresponding to memory cells SMC disposed in two rows and two columns. A BL load circuit 13a is provided for a bit line BLa and a bit line ZBLa, and a BL load circuit 13b is provided for a bit line BLb and a bit line ZBLb. A word line WLa extending in the row direction is driven by a word driver WDRa, and a word line WLb is driven by a word driver WDRb.

In parallel to bit lines BLa and ZBLa, a memory ground line MVSLa is provided extending in the column direction. Similarly, for bit lines BLb and ZBLb, a memory ground line MVSLb is provided extending in the column direction.

Corresponding to word lines WLa and WLb, memory power supply lines MVCLa and MVCLb are provided extending in the row direction, respectively.

As described above, the configuration of memory cell array 1 of the second embodiment is the same as that of the first embodiment shown in FIG. 5, except for the extending direction of memory power supply lines MVCL.

A detection holding circuit 46a, a switch gate 45a, and a program circuit 44a are disposed for memory power supply line MVCLa. Similarly, a detection holding circuit 46b, a switch gate 45b, and a program circuit 44b are disposed for memory power supply line MVCLb. The individual configurations of program circuits 44a and 44b, switch gates 45a and 45b, and detection holding circuits 46a and 46b are the same as those shown in FIGS. 6 to 8. As described above, since memory power supply lines MVCLa and MVCLb are disposed in the row direction, the standby current defect is detected in units of rows. Hence, program circuits 44a and 44b are programmed according to defective memory cell rows.

The configuration of the semiconductor memory device shown in FIGS. 12 and 13 is the same as that shown in FIGS. 1 and 5, except that memory source power lines MVCLa and MVCLb are disposed in the row direction in parallel to respective word lines WLa and WLb. Accordingly, testing operations for standby-current-defective memory cells are the same as those of the testing method according to the first embodiment. That is, switch gates 45a and 45b are turned OFF according to test mode instruction signal TEST 1, to disconnect memory source power lines MVCLa and MVCLb from a power supply node. Subsequently, detection holding circuits 46a and 46b are activated according to test mode instruction signal TEST2, to detect the voltage drops of corresponding memory power supply lines MVCLa and MVCLb for driving memory power supply line MVCLa and MVCLb, if lowered in voltage level, to the ground voltage level.

The layout of memory cell SMC according to the second embodiment shown in FIGS. 12 and 13 is the same as the memory cell shown in FIG. 31. In the layout shown in FIG. 31, the memory cell is of a vertically long type, and the distance between a bit line and a ground line are short, short circuits due to resistant components such as particles is likely to be caused. Even in this configuration, however, as in the case of the first embodiment, a standby-current-defective memory cell can be detected, and can be replaced by redundant memory cell.

Figure 14:
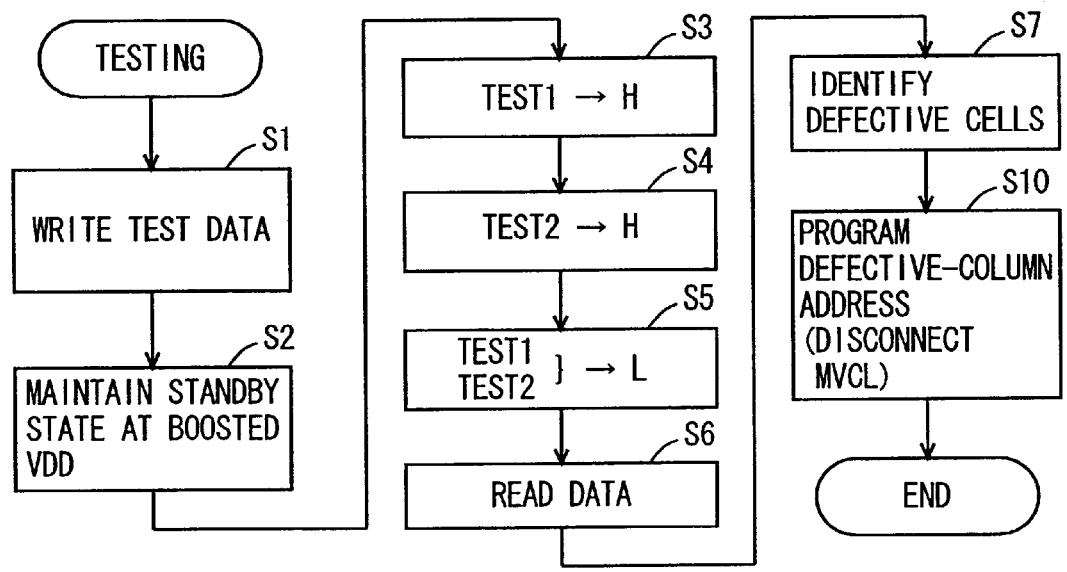
FIG. 14 is a flowchart representing testing operations of the semiconductor memory device according to the second embodiment of the present invention.

FIG. 14 is a flowchart representing testing operations for the semiconductor memory device according to the second embodiment. In the testing method shown in FIG. 14, the operations down to step 7, whereat a defective memory cell is specified, are the same as those in the testing method of the first embodiment, which is shown in FIG. 11. When a defective memory cell is specified at step 7, since a memory power supply line MVCL is disposed extending in the row direction, defective row address is specified, and the defective row address is programmed by a defective-address program circuit. At this time, blowing off is performed for a link element of a program circuit 44 (a representative of program circuit 44a and 44b) disposed corresponding to memory power supply line MVCL disposed corresponding to the defective row. Thereby, memory power supply line MVCL disposed corresponding to the standby-current-defective row is disconnected from the power supply node to prevent the abnormal standby current from flowing.

Also in the second embodiment, memory power supply line MVCL disposed corresponding to an operation-defective memory cell row may be disconnected from a power supply node regardless of whether the memory cells are defective or normal in standby current.

In addition, in the second embodiment, memory power supply lines VCL are separated corresponding to the memory cell rows, and are provided with switch gates 45a and 45b. However, switch gates 45a and 45b may be provided in a unit of a plurality of rows.

In the configuration shown in FIG. 13, the current driving capability of a MOS transistor 22c included in each of switch gates 45a and 45b is set to allow operation current to be sufficiently stably supplied to the memory cells disposed on the corresponding row. In this configuration, the redundancy replacement is performed in a unit of the plurality of rows.

As described above, according to the second embodiment of the present invention, in the test mode, the memory power supply lines extending in the row direction are disconnected from the power supply node, to lower the voltage levels of the memory power supply lines through the abnormal standby leakage current, and the memory power supply line having a lowered voltage level is driven to the ground voltage level. Therefore, as in the case of the first embodiment, standby-current-defective but normally-operable memory cells can reliably be set to an operation-defective state, and a standby-current-defective memory cell can be reliably detected, to allow the defective cell to be replaced by redundant memory cell. Thereby, the standby current defect can be repaired, and therefore, the product yield can be improved.

Third Embodiment

Figure 15:
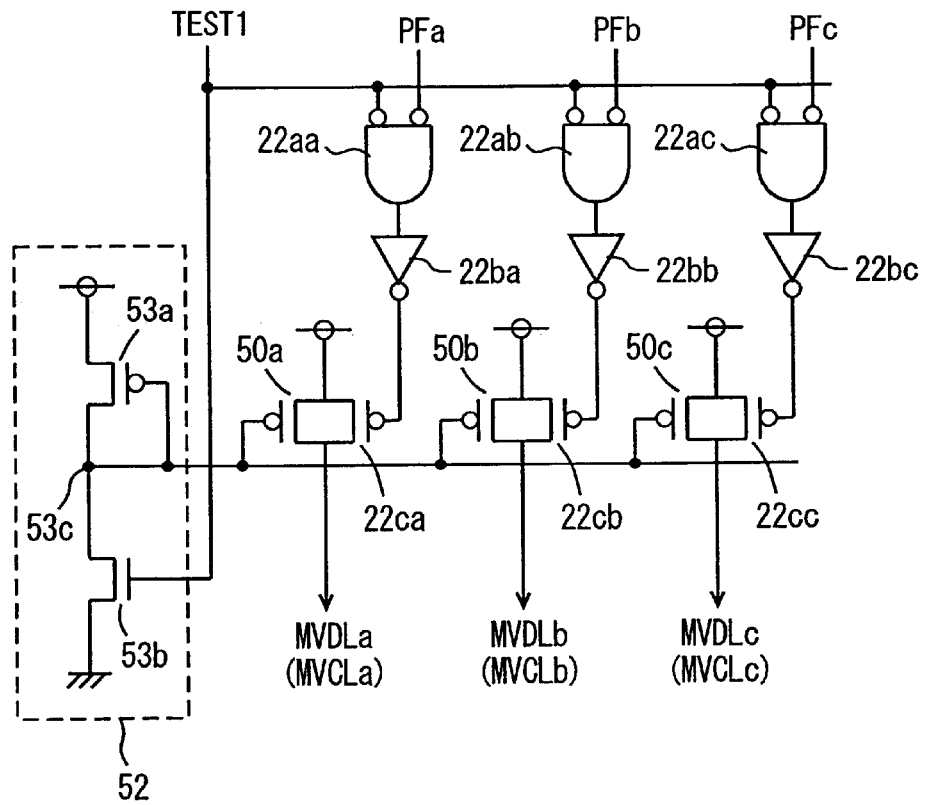
FIG. 15 shows a configuration of a main portion of a semiconductor memory device according to a third embodiment of the present invention.

FIG. 15 schematically shows a configuration of a main portion of a semiconductor memory device according to a third embodiment of the present invention. In FIG. 15, in parallel with MOS transistors 22ca to 22cc in switch gates provided corresponding to memory power supply lines MVDLa to MVDLc (MVCLa to MVCLc), there are provided P-channel MOS transistors 50a to 50c, respectively. NOR circuits 22aa to 22ac and inverters 22ba to 22bc are arranged corresponding to MOS transistors 22ca to 22cc. ON/OFF states of MOS transistors 22ca to 22cc are controlled according to output signals of the respective pairs of NOR circuits 22aa to 22ac and inverters 22ba to 22bc.

In specific, the ON/OFF state of MOS transistor 22ca is set according to test mode instruction signal TEST1 and a fuse program signal PFa. The ON/OFF state of MOS transistor 22cb is set according to test mode instruction signal TEST1 and a fuse program signal PFb. The ON/OFF state of MOS transistor 22cc is set according to test mode instruction signal TEST1 and a fuse program signal PFc.

Fuse program signals PFa to PFc are individually generated by the program circuits included in fuse program circuit 4 according to one of the first and second embodiments.

The ON/OFF state of each of MOS transistors 50a to 50c is controlled by voltage generated by a reference voltage generating circuit 52. Reference voltage generating circuit 52 includes an N-channel MOS transistor 53b for driving a node 53c to ground voltage in accordance with test instructing signal TEST1, and a P-channel MOS transistor 53a for setting the voltage level of node 53b in accordance with the current amount discharged by MOS transistor 53a. MOS transistor 53b has a gate and drain electrically coupled together to node 53c, and functions as a current/voltage converting element. Control voltage for MOS transistors 50a to 50c is generated at node 53c.

In reference voltage generating circuit 52, with test mode instruction signal TEST1 being at a LOW level, MOS transistor 53b is in the OFF state, and node 53c is maintained at the power supply voltage level. Accordingly, in this state, each of MOS transistors 50a to 50c are kept in the OFF state, not affecting MOS transistors 22ca to 22cc.

With test mode instruction signal TEST1 set to the HIGH level, in reference voltage generating circuit 52, MOS transistor 53b turns ON, and the voltage level of node 53c is set according to the amount of current driven by MOS transistor 53a. The voltage generated by MOS transistor 53a at node 53c is at an intermediate voltage level between power supply voltage VDD and the ground voltage level. Although each of MOS transistors 50a to 50c is rendered conductive in response to the control voltage output by reference voltage generating circuit 52, the resistance values thereof are of the order of several MΩ and in a high resistive, but conductive state. Each of MOS transistors 50a to 50c in the high resistive, but conductive state functions as a pullup resistance.

In the test mode, suppose individual MOS transistors 22ca to 22cc are in the OFF states, and individual memory power supply lines MVDLa to MVDLc (MVCLa to MVCLc) are disconnected from the power supply node for a long time. In this case, there is a possibility that the voltage levels of memory power supply lines MVDLa to MVDLc (MVCLa to MVCLc) drops, and memory power supply lines MVDLa to MVDLc (MVCLa to MVCLc) are determined to be defective. Against this event, MOS transistors 50a to 50c are individually set to the high resistive, but conductive state to supply a normal standby leakage current (about 1 nA). Thereby, even when a normal standby current flows out, the voltage level of memory power supply lines MVDL is prevented from lowering.

Only with MOS transistors 22ca to 22cc, it is required that the voltage levels of memory power supply lines MVDLa to MVDLc (MVCLa to MVCLc) are not lowered by the normal standby leakage current. Therefore, in order to reduce the voltage level of memory power supply lines MVDLa to MVDLc (MVCLa to MVCLc) in the test mode, there is caused a restriction on the period of time in which MOS transistors 22ca to 22cc are maintained in the OFF state. However, in the configuration as shown in FIG. 15, individual MOS transistors 50a to 50c are so controlled as to stay in the high resistive, but conductive state during the test mode, even when a normal standby current flows, no voltage drops are caused in memory power supply lines MVDLa to MVDLc (MVCLa to MVCLc). A wide margin can be secured for the period of time in which test mode instruction signal TEST1 is kept at a HIGH level, and defective memory cells can be accurately detected.

In reference voltage generating circuit 52, node 53c is set to such a voltage level that the current supplied by MOS transistor 53a is balanced with the current discharged by MOS transistor 53b. The level of the reference voltage generated by reference voltage generating circuit 52 in an active state may be sufficient to be at a level at which each of MOS transistors 50a to 50c is set to a high resistive, but conductive state of the order of several M-ohms (MΩ).

In addition, such a configuration may be employed that MOS transistors 50a to 50c form a current mirror circuit with MOS transistor 53c, and the drive current of each of MOS transistors 50a to 50c is adjusted according to the mirror rate. As described above, according to the third embodiment of the present invention, the elements that can be driven to high resistive, but conductive state in the test mode are provided parallel to the switching transistors used for disconnecting the memory power supply lines from the power supply node in the test mode. With this configuration, drop in voltage level of the memory power supply lines can be suppressed, and standby-current-defective memory cells can be accurately detected. In addition, a sufficiently wide margin can be secured for the activation period of test mode instruction signal TEST1, and therefore, accurate testing can be performed.

Fourth Embodiment

Figure 16:
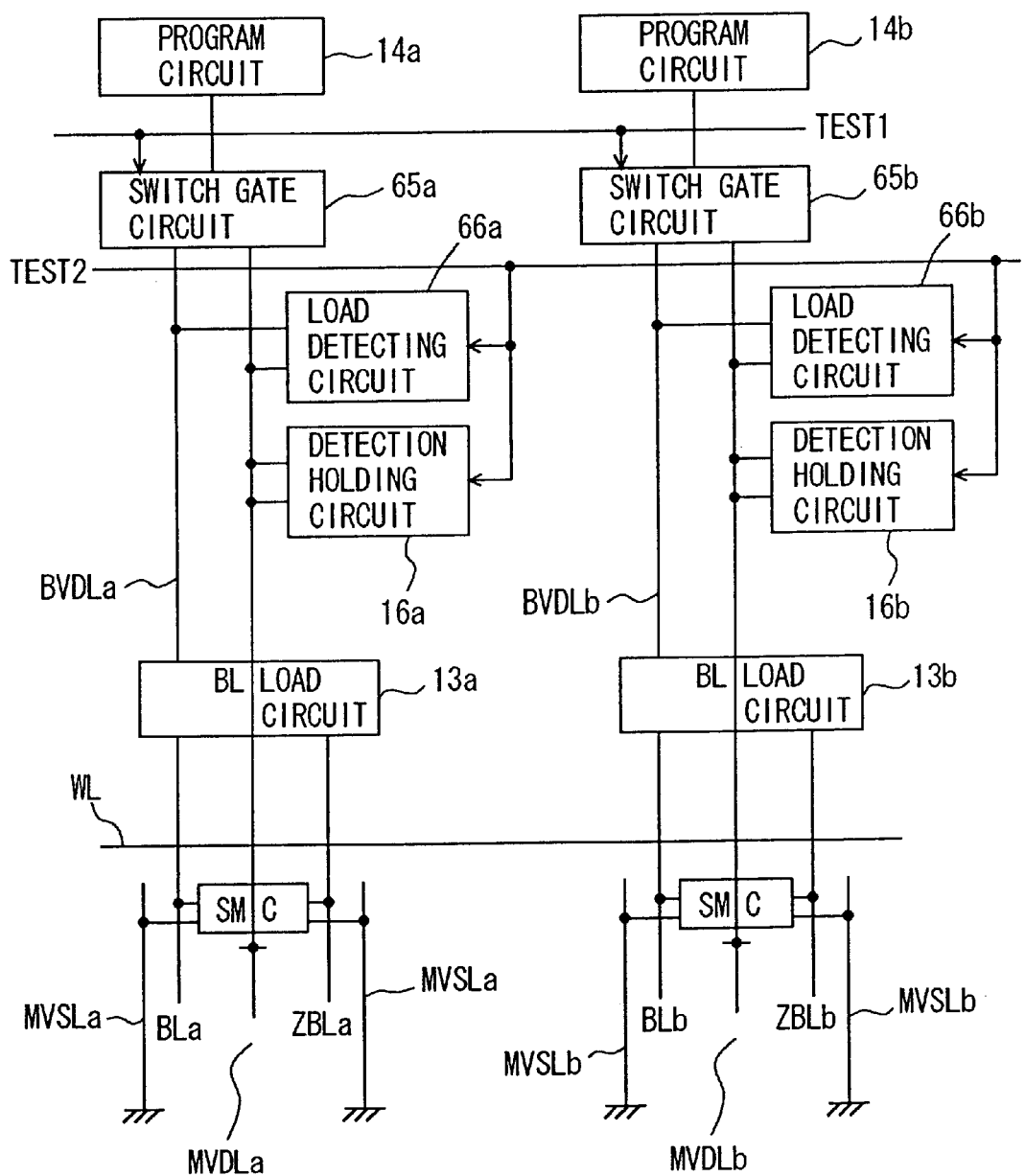
FIG. 16 schematically shows a configuration of a main portion of a semiconductor memory device according to a fourth embodiment of the present invention.

FIG. 16 schematically shows a configuration of a main portion of a semiconductor memory device according to a fourth embodiment of the present invention. In the arrangement shown in FIG. 6, bit lines, memory power supply lines, and memory ground lines are disposed extending in parallel to each other in the column direction.

The power supply voltage is supplied to BL load circuits 13a and 13b via respective load power supply lines BVDLa and BVDLb. Load power supply lines BVDLa and BVDLb are disposed corresponding to respective memory power supply lines MVDLa and MVDLb. Specifically, a pair of memory power supply line MVDL and load power supply line BVDL is disposed for each of the columns, and supplies the power supply voltage to BL load circuit (13a or 13b) in the corresponding column.

For load power supply lines BVDLa and BVDLb, load detecting circuits 66a and 66b are provided. Load detecting circuits 66a and 66b are activated when test mode instruction signal TEST2 is activated, and detect the voltage levels of load power supply lines BVDLa and BVDLb, to set the voltage levels of respective memory power supply lines MVDLa and MVDLb according to the detection results.

Load power supply lines BVDLa and BVDLb are electrically coupled to power supply node via respective switch gate circuits 65a and 65b. Switch gate circuits 65a and 65b include switching transistors provided for respective load power supply lines BVDLa and BVDLb, and switching transistors provided for respective memory power supply lines MVDLa and MVDLb.

In the configuration shown in FIG. 16, in the detection of a standby current defect, similarly to memory power supply lines MVDLa and MVDLb, load power supply lines BVDLa and BVDLb are also disconnected from the power supply node. When an abnormal standby current flow through a load power supply lines BVDLa and BVDLb, to lower the voltage level thereof, the voltage levels of corresponding memory power supply lines MVDLa and MVDLb are driven to the ground voltage level. This arrangement enables the detection of a standby current defect due to a bit line-related short circuit defect such as short circuits between a node and a bit line, between a bit line and a word line, and between a bit line and a memory ground line, in addition to a power-supply-node-related short circuit defect.

More specifically, when an abnormal standby current flows to a bit line, the voltage level of the corresponding memory power supply line is driven to the ground voltage level, and the memory cells are forcibly set to the operation-defective state. Thereby, the operation-defective memory cells can be detected by ordinary testing.

Figure 17:
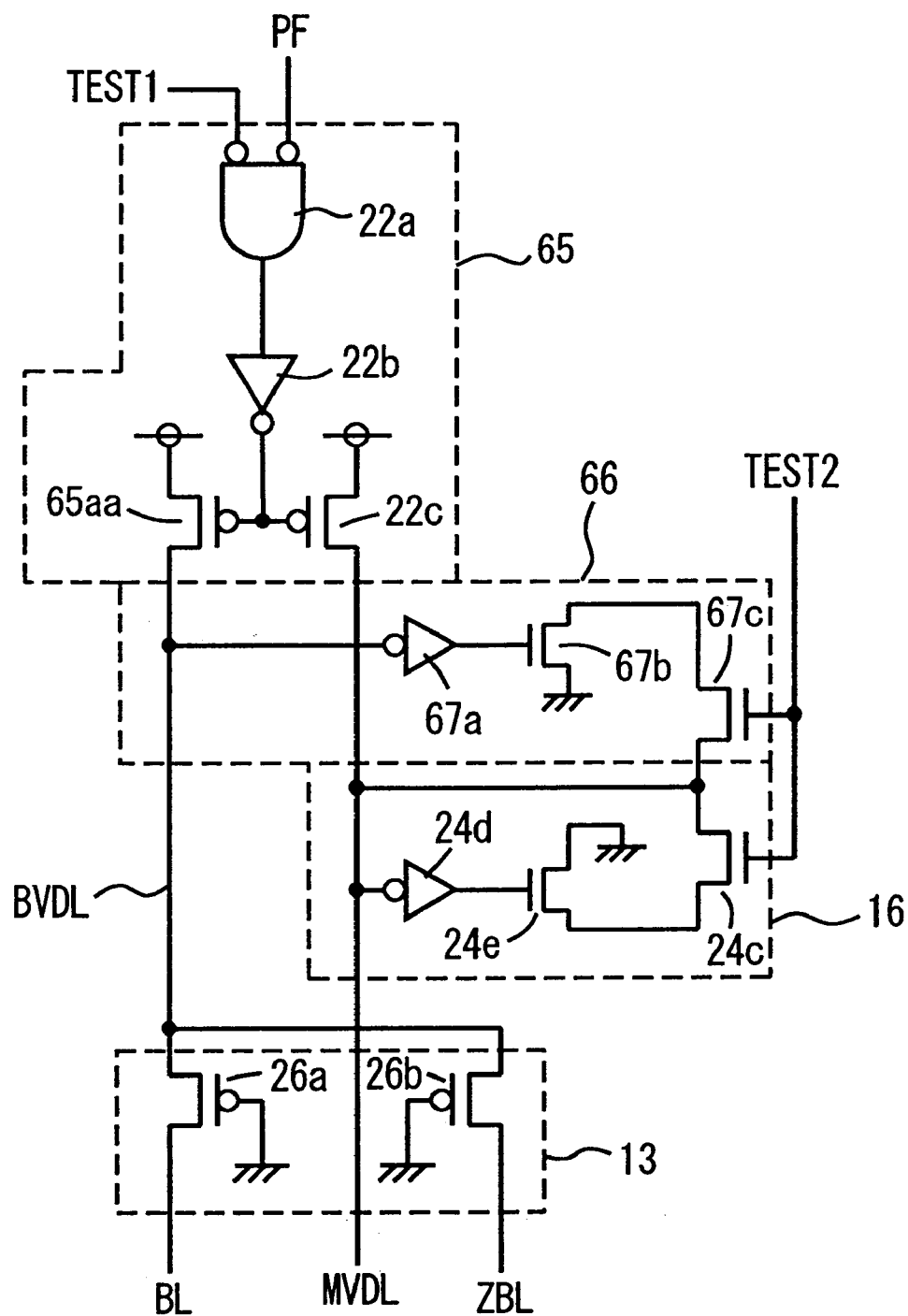
FIG. 17 shows example of a configurations of a switch gate circuit, a load detecting circuit, and a detection holding circuit that are shown in FIG. 16.

FIG. 17 schematically shows an example of a configuration related to one bit line pair in the configuration shown in FIG. 16. In FIG. 17, a switch gate circuit 65 representative of switch gate circuits 65a and 65b is shown because the switch gate circuits 65a and 65b have the same configuration. Switch gate circuit 65 includes: a NOR circuit 22a receiving a fuse program signal PF and test mode instructing signal TEST1; an inverter 22b receiving an output signal of NOR circuit 22a; a P-channel MOS transistor 22c rendered conductive, when the output signal of inverter 22b is at a Low level, to electrically couple the power supply node to memory power supply line MVDL; and a P-channel MOS transistor 65aa rendered conductive, when an output signal of inverter 22b is at a Low level, to electrically connect the power supply node to load power supply line BVDL.

In the configuration of switch gate circuit 65, in addition to the configuration of the switch gate in the described first embodiment, P-channel MOS transistor 65aa is provided for load power supply line BVDL. When test mode instruction signal TEST1 is at a HIGH level, MOS transistors 65aa and 22c turn OFF, both load power supply line BVDL and memory power supply line MVDL are disconnected from the power supply node. When a standby current defect associated with a bit line exists, the voltage level of load power supply line BVDL is lowered. By detecting the voltage drop of the load power supply line BVDL, standby current defect associated with the bit line can be detected.

A load detecting circuit 66 includes: an inverter 67a receiving a potential on load power supply line BVDL; an N-channel MOS transistor 67b rendered selectively conductive according to an output signal of inverter 67a, to transmit the ground voltage; and an N-channel MOS transistor 67c rendered conductive, when test mode instruction signal TEST2 is at a HIGH level, to electrically connect the drain of MOSS transistor 67b to memory power supply line MVDL.

Inverter 67a functions as a level detecting circuit for detecting the voltage level of load supply line BVDL. When the voltage level of load supply line BVDL lowers below an input logic threshold voltage of inverter 67a, an output signal of inverter 67a goes high, and MOS transistor 67b at the subsequent stage is made conductive to transmit the ground voltage. When test mode instruction signal TEST2 is at the HIGH level, therefore, memory power supply line MVDL is driven to the ground voltage level by MOS transistors 67b and 67c. Therefore, MOS transistor 67b has the function of an amplifying transistor for amplifying an output signal of inverter 67a.

Detection holding circuit 16 has a configuration different from that of detection holding circuit 16 in the first embodiment. Specifically, detection holding circuit 16 includes an inverter 24d receiving the potential on memory power supply line MVDL; an N-channel MOS transistor 24e rendered conductive, when an output signal of inverter 24d is at the HIGH level, to transmit the ground voltage; and an N-channel MOS transistor 24c rendered conductive, when test mode instruction signal TEST2 is activated (goes high), to electrically connect the drain node of MOS transistor 24e to memory power supply line MVDL.

In the configuration of detection holding circuit 16 shown in FIG. 17, when the voltage level of memory power supply line MVDL lowers, inverter 24d detects the voltage level drop of memory power supply line MVDL, its output signal goes high and accordingly, MOS transistor 24e is made conductive to transmit the ground voltage. Therefore, when memory power supply line MVDL drops in voltage level, memory power supply line MVDL is driven to the ground voltage level by MOS transistors 24e and 24c.

When load power supply line BVDL is normal and the voltage drop does not occur, the output signal of inverter 67a is at the L level, and MOS transistor 67b is maintained in a non-conductive state. On the other hand, in this state, if a failure occurs in memory power supply line MVDL and a voltage drop occurs thereon, MOS transistor 24e is made conductive according to an output signal of inverter 24d, and memory power supply line MVDL is driven to the ground voltage level. When memory power supply line MVDL is driven to the ground voltage level, even when MOS transistor 67c is made conductive according to test mode instruction signal TEST2, MOS transistor 67b maintains the non-conductive state. No influence is exerted on the driving to the ground voltage level of memory power supply line MVDL by detection holding circuit 16. Consequently, in the case where load power supply line BVDL is normal and memory power supply line MBDL is defective, memory power supply line MVDL can be driven to the ground voltage level with reliability as well.

In the case where memory power supply line MVDL is normal and load power supply line BVDL is abnormal or defective, a voltage drop of load power supply line BVDL is detected by inverter 67a, and memory power supply line MVDL can be driven to the ground voltage level by MOS transistors 67b and 67c. When memory power supply line MVDL is driven to the ground voltage level, at an initial stage of the driving, an output signal of inverter 24d is at the L level, and MOS transistor 24e maintains the non-conductive state. Consequently, according to load detecting circuit 66, the voltage level of memory power supply line MVDL can be decreased with reliability. When the voltage level of memory power supply line MVDL drops below an input logic threshold voltage of inverter 24d, an output signal of inverter 24d goes high, MOS transistor 24e is made conductive, and memory power supply line MVDL is driven to the ground voltage level at high speed.

In the case where both memory power supply line MVDL and load power supply line BVDL are normal, output signals of inverters 24d and 67a are at the L level and both MOS transistors 67b and 24e are in the non-conductive state. Even when MOS transistors 67c and 24c are made conductive, no voltage drop occurs in memory power supply line MVDL and load power supply line BVDL, and the power supply voltage level is maintained.

By constructing each of load detecting circuit 66 and detection holding circuit 16 by the inverter for detecting the potential and the MOS transistor selectively made conductive according to an output signal of the inverter, even when the voltage level of load power supply line BVDL and that of memory power supply line MVDL are different from each other, memory power supply line VMDL can be driven to the ground voltage level with reliability in the event of occurrence of a failure.

Load power supply line BVDL is electrically coupled to bit lines BL and ZBL via P-channel MOS transistors 26a and 26b included in a BL load circuit 13. In BL load circuit 13, MOS transistors 26a and 26b are shown having respective gates connected to the ground node to be normally in ON state. However, such connection of the gates of MOS transistors 26a and 26b to the ground node is shown to emphasize an operation in the standby state of BL load circuit 13. Actually, to BL load circuit 13, another control signal (for example, a write enable signal) is applied. As in the first embodiment, the practical configuration of BL load circuit 13 can be any as long as the function of maintaining bit lines BL and ZBL at the power supply voltage in standby state is implemented by the BL load circuit.

As described above, load detecting circuit 66 detects a voltage drop of load power supply line BVDL. When a voltage drop occurs in load power supply line BVDL, the voltage level of a corresponding memory power supply line MVDL is driven to the ground voltage level. Thereby, when a standby current failure occurs due to a bit line-related failure such as a short circuit between a word line and a bit line, a corresponding memory power supply line MVDL is driven to the ground voltage level. Responsively, memory cells coupled to corresponding bit lines BL and ZBL are forced to a malfunction state. Therefore, bit lines BL and ZBL can be set to a malfunctioning column state with reliability.

Modification

Figure 18:
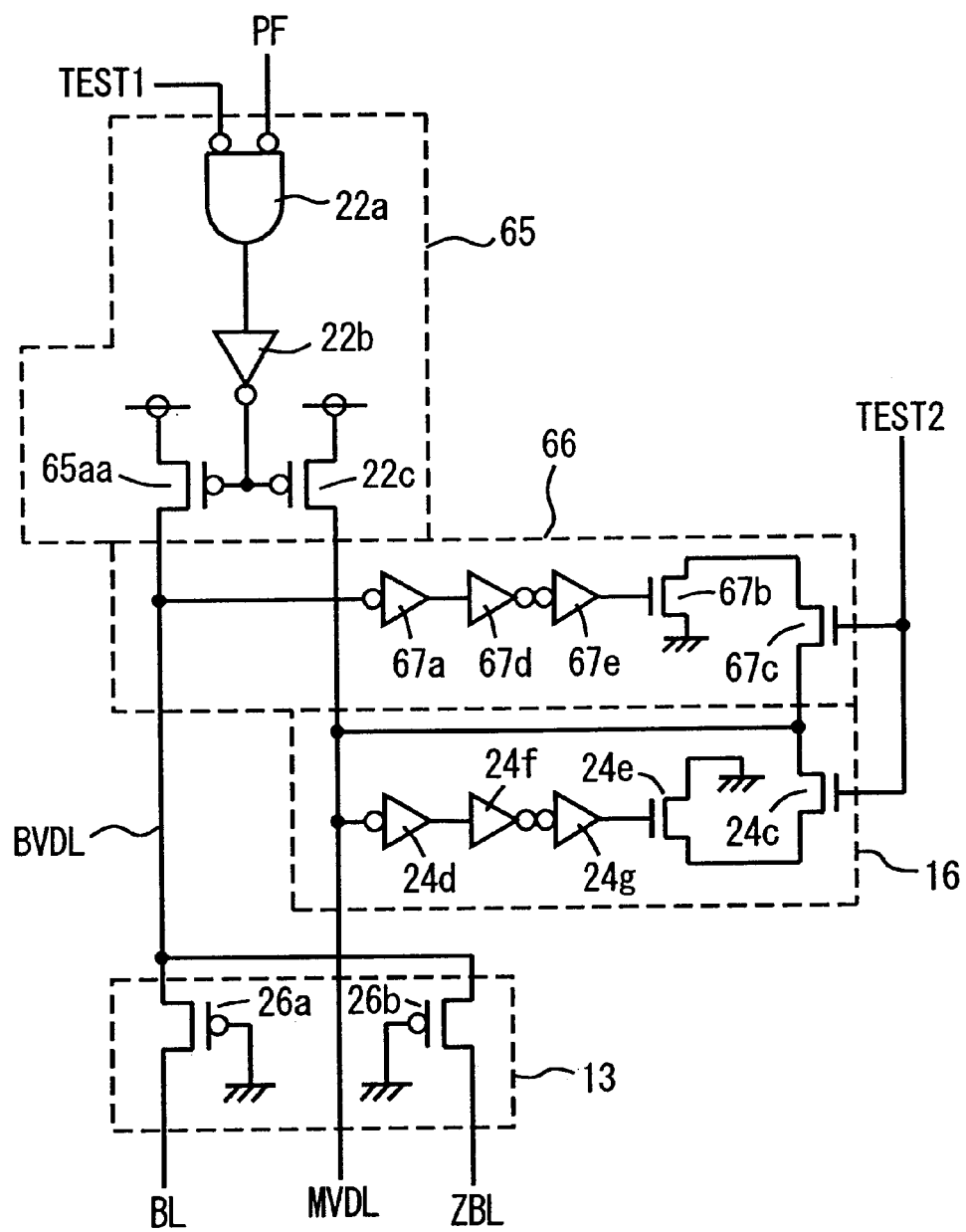
FIG. 18 shows a modification of the load detecting circuit and the detection holding circuit shown in FIG. 17.

FIG. 18 is a diagram showing the configuration of a modification of the fourth embodiment of the present invention. The configuration of FIG. 18 is different from the configuration of FIG. 17 with respect to the following point. In load detecting circuit 66, cascaded inverters 67d and 67e of two stages are connected between inverter 67a and N-channel MOS transistor 67b. In detection holding circuit 16 as well, cascaded inverters 24f and 24g of two stages are connected between inverter 24d and N-channel MOS transistor 24e. The other configuration of FIG. 18 is the same as that of FIG. 17, corresponding components are designated by the same reference numerals, and their detailed description will not be repeated.

In the configuration of FIG. 18, the waveform of an output signal of inverter 67a is shaped by cascaded inverters 67d and 67e of two stages, thereby generating a binary signal of the power supply voltage or ground voltage level with reliability. Similarly, the waveform of an output signal of inverter 24d is shaped by cascaded inverters 24f and 24g of two stages, to generate a binary signal. Therefore, even when a voltage drop amount of load power supply line BVDL and memory power supply line MVDL is small and an output signal of inverter 67a and/or inverter 24d is at an intermediate voltage level between the ground voltage and the power supply voltage, in the event of abnormal standby current, memory power supply line MVDL can be driven to the ground voltage level with reliability in accordance with inverters 67d and 67e and/or inverters 24f and 24g at the subsequent stages. Thus, a memory cell that operates normally but has a standby current failure can be set in a failure state with reliability.

A testing method for the semiconductor memory device according to the fourth embodiment is the same as that according to the first embodiment, and a test is performed according to the flowchart shown in FIG. 11.

Bit line load power supply line BVDL and memory power supply line MVDL are each shown being divided in correspondence with the respective columns, to detect standby current defects in units of bit line pairs. It is also possible to dispose gate circuit 65 for each a plurality of columns, and detect a standby current failure on the basis of the plurality of columns. This applies to any of the following embodiments.

The size of P-channel MOS transistor 65a in switch gate circuit 65 is adjusted to have a current driving capability of supplying precharge current in the standby state and column current at the time of data reading to corresponding bit lines BL and ZBL.

As described above, according to the fourth embodiment of the present invention, in test mode, the load power supply lines are also disconnected from the power supply node, and voltage drop thereof is detected. When a voltage drop is detected, the corresponding memory power supply line is driven to the ground potential level, and the corresponding memory cells are set in an operation-failure state. Thereby, standby-current-defective but normally-operable memory cells can be reliably set to the operation-failure state, and memory cells of standby current defect can be detected. Furthermore, standby current defect caused by a failure related to bit line can also be detected. In this way, the standby current failure can be detected, to be repaired through replacement with a redundancy memory cell more reliably.

Fifth Embodiment

Figure 19:
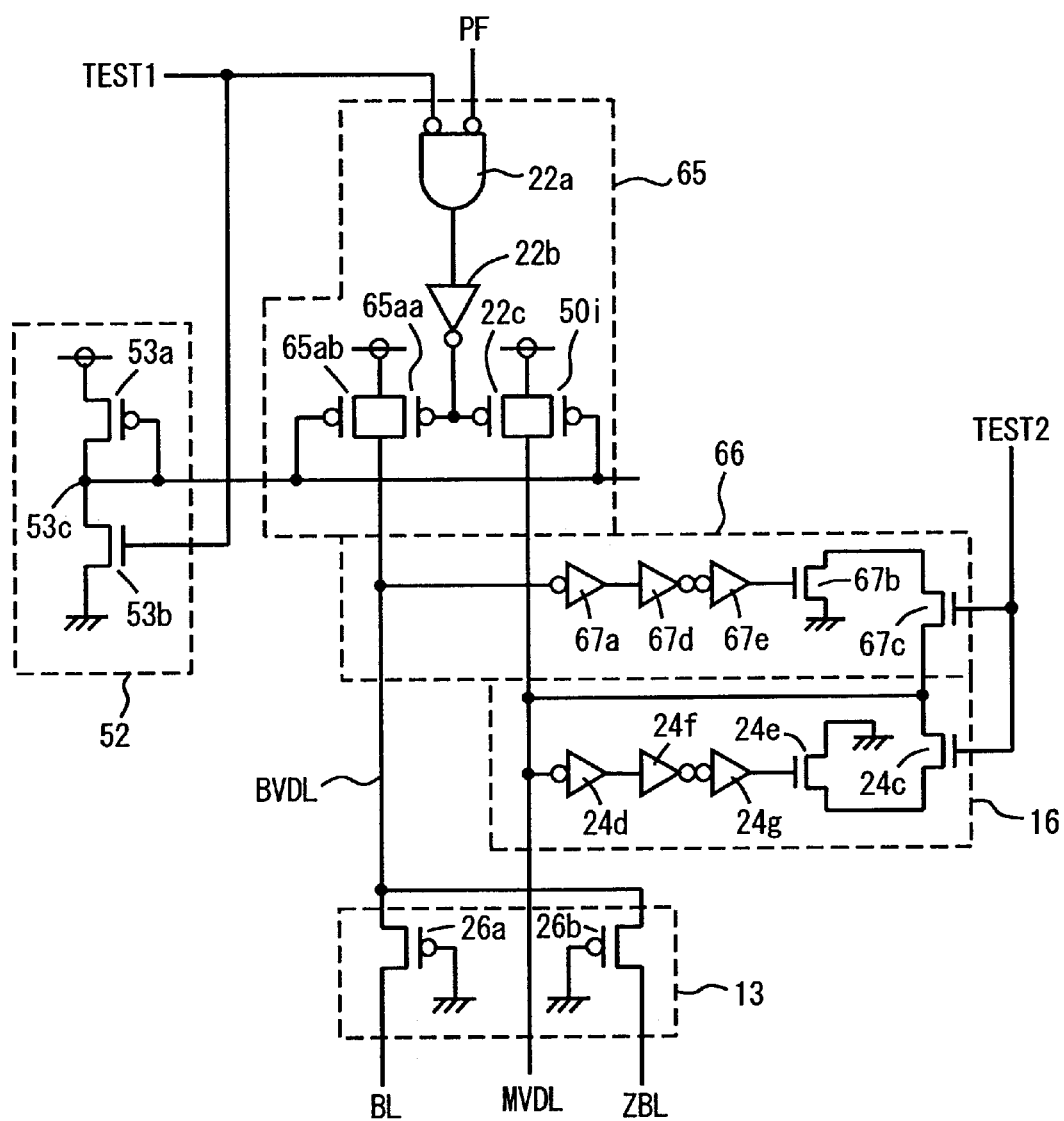
FIG. 19 shows a configuration of a main portion of a semiconductor memory device according to a fifth embodiment of the present invention.

FIG. 19 shows a configuration of a main portion of a semiconductor memory device according to a fifth embodiment of the present invention. Similarly to the configuration shown in FIG. 18, FIG. 19 shows the configuration for one memory power supply line MVDL and one load power supply line BVDL. In the configuration shown in FIG. 19, in a switch gate circuit 65, P-channel MOS transistors 65ab and 50i are coupled in parallel with MOS transistors 65a and 22c, respectively. The gates of MOS transistors 65ab and 50i receive reference voltages (control signal) from a reference voltage generating circuit 52. Similarly to the configuration shown in FIG. 15, reference voltage generating circuit 52 includes an N-channel MOS transistor 53b responsive to test mode instructing signal TEST 1, and a P-channel MOS transistor 53a for producing the voltage at a node 53a when MOS transistor 53b is in an ON state.

In the configuration shown FIG. 19, since the portions other than the above are the same as those shown in FIG. 18, the same reference numerals/symbols are used for the corresponding portions, and detailed descriptions thereof will not be repeated.

In the configuration shown in FIG. 19, in the test mode, a reference voltage at an intermediate voltage level between the power supply voltage and the ground voltage is generated by reference voltage generating circuit 52, and each of MOS transistors 65ab and 50i is driven to a high resistive, but conductive state, to suppress a drop in voltage level of load power supply line BVDL and memory power supply line MVDL by a normal standby leakage current. When a normal standby current flows, MOS transistors 65ab and 50i in the high resistive, but conductive state maintain load power supply line BVDL and memory power supply line MVDL at the power supply voltage level.

Consequently, in the event that a standby current failure occurs, even when the voltage level of one of load power supply line BVDL and memory power supply line MVDL drops due to the normal standby current and the defective, abnormal standby current, the power line through which the normal standby current flows and the power line through which the abnormal standby current flows can be discriminated from each other. Therefore, even when the speeds of voltage drop of load power supply line BVDL and memory power supply line MVDL are different from each other, the voltage drop of load power supply line BVDL or memory power supply line MVDL can be accurately detected by using test mode instruction signal TEST2. Consequently, the standby current defect can be detected more reliably.

As described above, according to the fifth embodiment of the present invention, the switching transistors each turning into a high resistive, but conductive state in the test mode are provided parallel to the switching transistors for disconnecting the load power supply line and the memory power supply lines from the power supply line in the test mode. Therefore, a power supply line that causes a voltage drop due to an abnormal standby current can be discriminated from the power supply line that causes normal standby leakage current to flow in the memory power supply line and the load power supply line, and a memory cell of standby current failure can be reliably set to the failure state.

Sixth Embodiment

Figure 20:
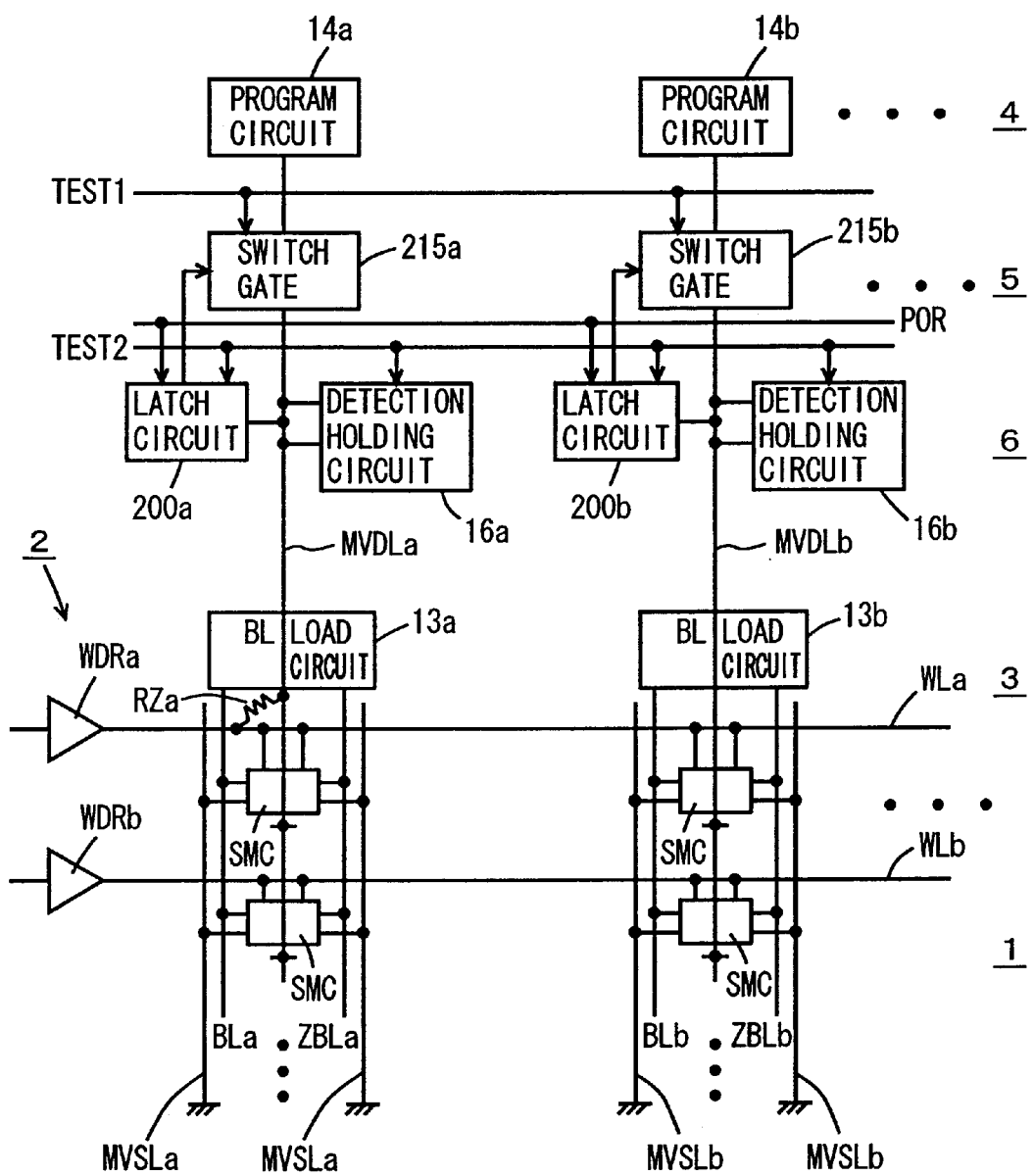
FIG. 20 schematically shows a configuration of a main portion of a semiconductor memory device according to a sixth embodiment of the present invention.

FIG. 20 schematically shows a configuration of a main portion of a semiconductor memory device according to a sixth embodiment of the invention. The semiconductor memory device of FIG. 20 is different in configuration from that of FIG. 5 in the following points.

Specifically, in voltage control circuit 6, in correspondence with memory power supply lines MVDLa and MVDLb, latch circuits 200a and 200b are provided for latching the potentials of corresponding memory power supply lines MVDLa and MVDLb and setting the states of switch gates 215a and 215b, respectively, when test mode instruction signal TEST2 is activated. A power-up detection signal POR, driven to the HIGH level when power is turned on, is supplied to latch circuits 200a and 200b. In latch circuits 200a and 200b, a latch signal is initialized by power-up detection signal POR when power is turned on.

Switch gates 215a and 215b selectively transmit a power supply voltage to memory power supply lines MVDLa and MVDLb, respectively, in accordance with respective output program information of corresponding program circuits 14a and 14b, latch signals (voltages) of corresponding latch circuits 200a and 200b, and test mode instruction signal TEST1. The other configuration of FIG. 20 is the same as that of FIG. 5. The corresponding components are designated by the same reference numerals and their detailed description will not be repeated.

Figure 21:
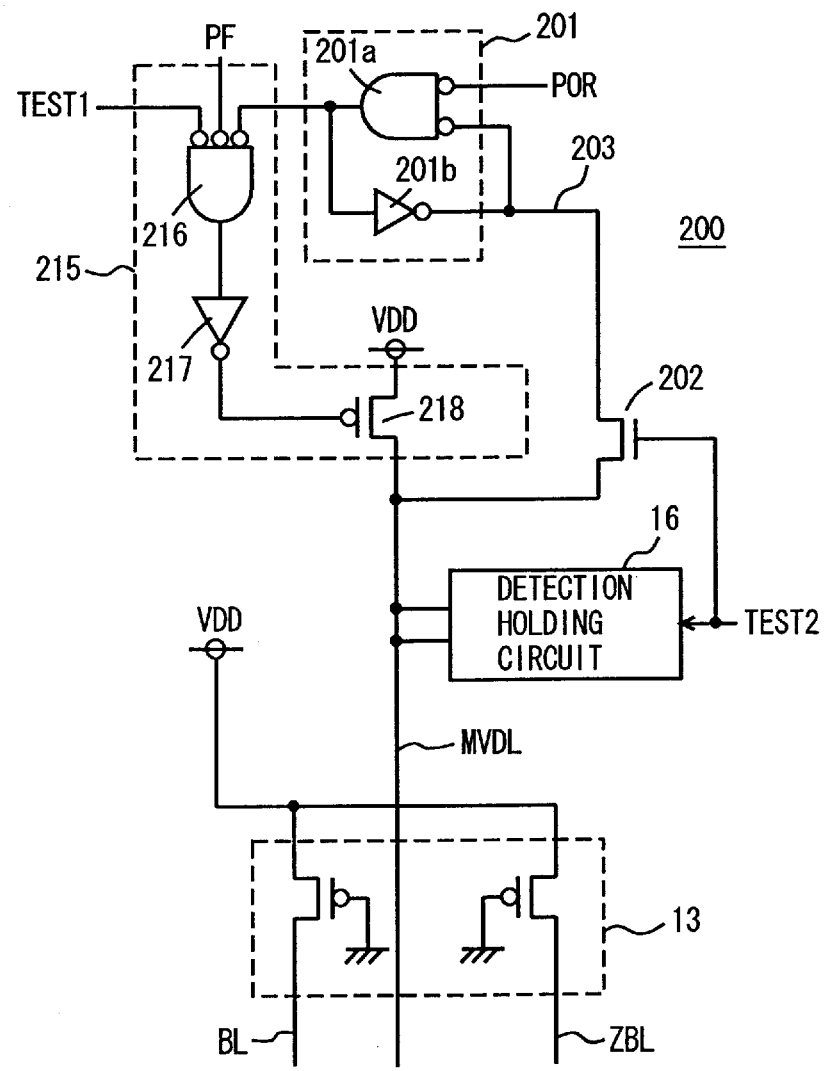
FIG. 21 is a diagram showing a configuration of a bit line peripheral circuit shown in FIG. 20.

FIG. 21 is a diagram showing an example of the configuration of latch circuits 200a and 200b and switch gates 215a and 215b shown in FIG. 20. In FIG. 21, since latch circuits 200a and 200b have the same configuration and switch gates 215a and 215b have the same configuration, FIG. 21 shows switch gate 215 and latch circuit 200 is shown as the respective representative. Switching gate 215 and latch circuit 200 are provided in correspondence with memory power supply line MVDL. Memory power supply line MVDL supplies power supply voltage VDD to memory cells connected bit lines BL and ZBL. Bit lines BL and ZBL are coupled to a power supply node for supplying power supply voltage VDD via BL load circuit 13. In FIG. 21 as well, BL load circuit 13 has a state of a load transistor in a standby state shown.

In FIG. 21, latch circuit 200 includes a transfer gate 202 for electrically coupling memory power supply line MVDL to a node 203 in response to test mode instruction signal TEST2, and a latch gate 201 for latching the voltage at node 203 when activated. Transfer gate 202 is formed of an N-channel MOS transistor, for example.

Latch gate 201 includes an NOR gate 201a receiving power-up detection signal POR and a signal (voltage) on node 203, and an inverter 201b for inverting an output signal of NOR gate 201a and transmitting the inverted signal to node 203.

Power-up detection signal POR is at the HIGH level until power supply voltage VDD reaches a predetermined voltage level or is stabilized when power is turned on. Power-up detection signal POR maintains the LOW level in a normal operation mode. Consequently, upon power up, an output signal of NOR gate 201a is initialized to the LOW level in accordance with power-up detection signal POR. In the normal operation mode, NOR gate 201a operates as an inverter, and an inverter latch is formed by inverter 201b and NOR gate 201a.

Switch gate 215 includes a 3-input NOR gate 216 receiving fuse program information PF from a corresponding program circuit, an output signal of NOR gate 201a included in latch gate 201, and test mode instruction signal TEST1, an inverter 217 for inverting an output signal of NOR gate 216, and a P-channel MOS transistor 218 that is made conductive in response to an output signal of inverter 217 to transmit power supply voltage VDD to memory power supply line MVDL.

Detection holding circuit 16 has the configuration of FIG. 8, 17, or 18. The driving power in driving memory power supply line MVDL of detection holding circuit 16 is set to be sufficiently greater than that of inverter 201b in latch gate 201. Consequently, latch gate 201 latches the voltage level of memory power supply line MVDL without exerting an adverse influence on the detection holding operation of detection holding circuit 16.

Figure 22:
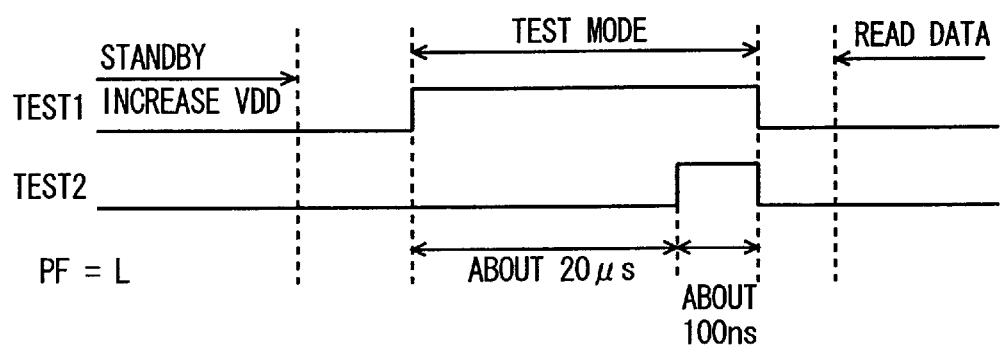
FIG. 22 is a timing chart representing an operation of the configurations of FIGS. 20 and 21.

FIG. 22 is a timing chart representing a test operation of the semiconductor memory device according to the sixth embodiment of the invention. Referring to FIG. 22, the operation of the semiconductor memory device shown in FIGS. 20 and 21 will be described in the following.

First, before a test operation, power is turned on, and power-up detection signal POR is set to the HIGH level to reset latch gate 201. Since a fuse is not blown yet, fuse program information PF is at the LOW level. After completion of the initialization, the voltage level of power supply voltage VDD supplied to memory power supply line MVDL is set to be higher than that in the normal operation mode. This increases contribution of a resistance component such as a short circuit.

In this state, test mode instruction signal TEST1 is set to the HIGH level. Accordingly, an output signal of NOR gate 216 goes high, MOS transistor 218 is made non-conductive, and memory power supply line MVDL is disconnected from the power supply node. Test mode instruction signal TEST2 is still at the L level, and transfer gate 202 maintains the non-conductive state. Detection holding circuit 16 is in a nonconductive state and does not perform detection and holding operation on the voltage of memory power supply line MVDL.

Since test mode instruction signal TEST1 is set to the HIGH level for, for example, 20 μs, in the case where a leak path through which the abnormal standby current flows exists in memory power supply line MVDL, the voltage level thereof drops.

Subsequently, in a state where test mode instruction signal TEST1 is maintained at the HIGH level, test mode instruction signal TEST2 is set in an active state of the HIGH level for, for example, 150 ns (nano seconds). Accordingly, detection holding circuit 16 is activated, and the voltage level of memory power supply line MVDL is set according to the detection result. At this time, transfer gate 202 is made conductive, and node 203 is coupled to memory power supply line MVDL. The voltage level of memory power supply line MVDL set by detection holding circuit 16 is accordingly transferred to node 203 and is latched by latch gate 201.

By this test mode, a column having standby current abnormality can be fully set in a failure state.

After completion of the test mode, both test mode instruction signals TEST1 and TEST2 are set to the L level. In latch gate 201, information of whether a corresponding column is a column associated with standby current abnormality or not is stored. In the case where memory power supply line MVDL is driven to the ground voltage level in the test mode, an output signal of latch gate 201 is at the HIGH level. In switch gate circuit 215, an output signal of NOR gate 216 is at the LOW level, an output signal of inverter 217 accordingly goes high, and MOS transistor 218 maintains the nonconductive state.

In this state, by using various test patterns, a memory cell function test is performed. It is now assumed that, as shown in FIG. 20, a short circuit RZa exists between a word line WLa and a memory power supply line MVDLa. In the case of performing tests using various test patterns, bit lines BLa and ZBLa are detected as a defective column since the voltage level of memory power supply line MVDLa is at the ground voltage level and memory cells connected to bit lines BLa and ZBLa cannot store data normally.

When word line WLa is not selected, even if it is connected to memory power supply line MVDLa through short circuit RZa, memory power supply line MVDLa is at the ground voltage level, and word line WLa is prevented from increasing in voltage level to an intermediate voltage level when not selected. Therefore, in a memory block including defective word line WLa, a plurality of word lines are prevented from being simultaneously driven to a selected state, and a block failure that a whole memory block including word line WLa is determined as failure never occurs.

Word line WLa is connected to memory power supply line MVDLa via short circuit RZa, and therefore, the load thereof is heavier than that on a normal word line, so that a rise in voltage level of word line WLa is slower than that of a normal word line. Particularly, in the case of a horizontally-long memory cell structure, if a word line is short-circuited, the word line is connected to memory power supply line MVDL via a low-resistive metal interconnection line, so that the capacitance of memory power supply line MVDL is connected to defective word line WLa, which makes a voltage change rate of the defective word line slow.

Therefore, data cannot be stored accurately in memory cells connected to word line WLa and the memory cells connected to word line WLa are determined defective. Consequently, a cross failure constructed by the defective column and the defective row related to short circuit RZa can be detected with accuracy. After that, by programming the addresses of the defective column and row by using redundant column and row, bit lines BLa and ZBLa and word line WLa are replaced with a redundant bit line pair and a redundant word line, respectively. By blowing the fuse in program circuit 14a shown in FIG. 20, memory power supply line MVDL is disconnected from the power supply node, current consumption is reduced, and standby-current abnormality is repaired.

As described above, according to the sixth embodiment of the invention, by forcedly setting the voltage level of the memory power supply line corresponding to a defective column to the ground voltage level and latching the voltage level by the latch circuit, both the defective column and the defective row can be detected, the cross failure constructed by the defective row and defective column can be accurately detected, and the defective row and defective column can be repaired through redundant replacement.

Particularly, in a horizontally-long type memory cell as shown in FIG. 2, in many cases, a word line and memory power supply line MVDL or a word line and a bit line are short-circuited via a low-resistive first level metal interconnection line. In this case, the capacitance of the short-circuited memory power supply line or bit line is connected to the word line, the operation of the defective word line becomes slow, and data cannot be accurately read/written from/to the memory cells. Consequently, a defective word line can be detected with reliability.

Seventh Embodiment

Figure 23:
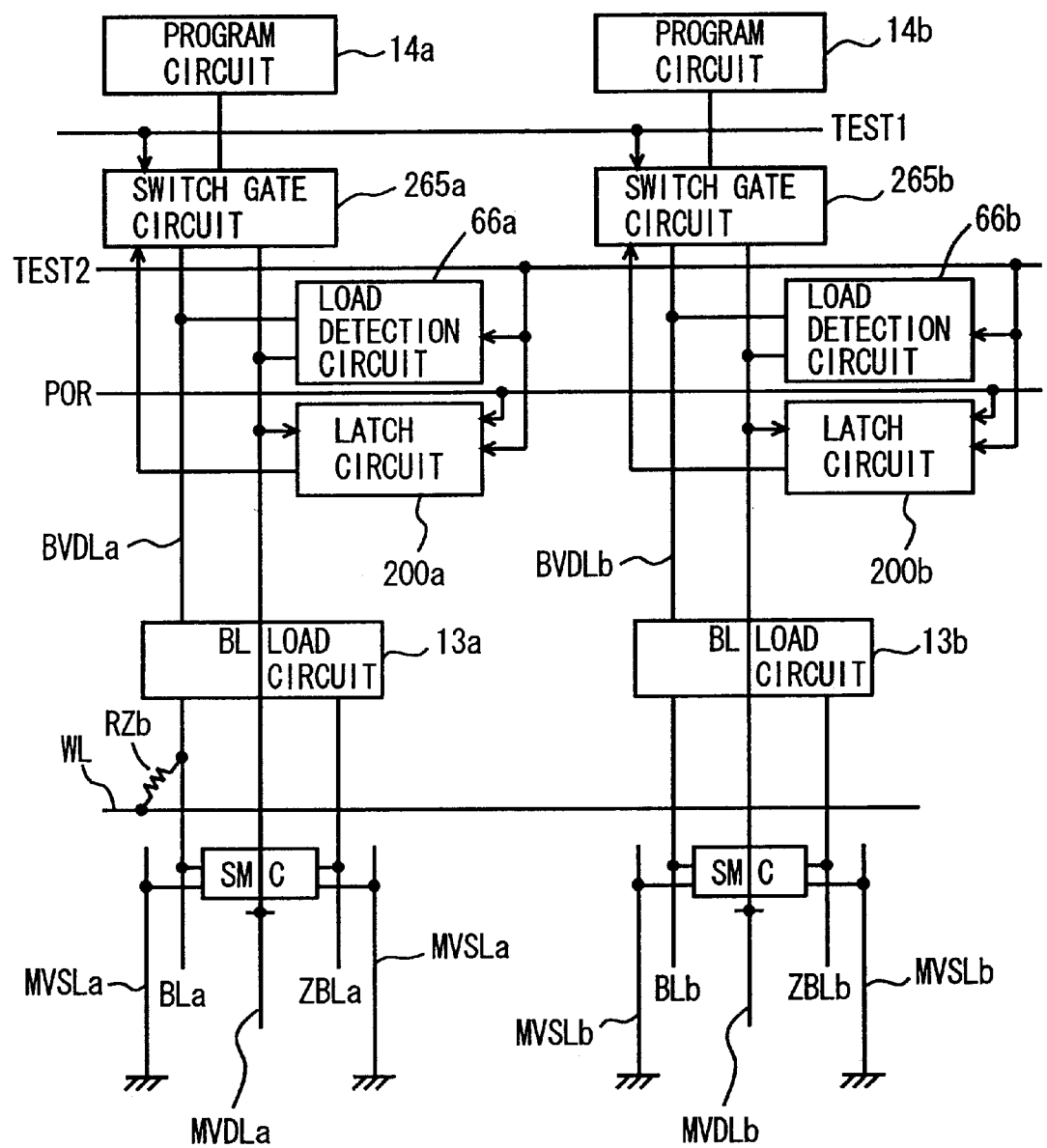
FIG. 23 is a diagram schematically showing a configuration of a main portion of a semiconductor memory device according to a seventh embodiment of the invention.

FIG. 23 is a diagram schematically showing a configuration of a main portion of a semiconductor memory device according to a seventh embodiment of the invention. In the configuration shown in FIG. 23, in correspondence with load power supply lines BVDLa and BVDLb, there are provided: load detecting circuits 66a and 66b that are activated according to test mode instruction signal TEST2, to set the voltage levels of memory power supply lines MDVLa and MVDLb in accordance with the voltage levels of load power lines BVDLa and BVDLb, respectively; and latch circuits 200a and 200b for latching the voltage levels of memory power supply lines MVDLa and MVDLb, respectively, when test mode instruction signal TEST2 is active.

Output signals (voltages) of latch circuits 200a and 200b are transmitted to switch gate circuits 265a and 265b arranged in correspondence with load power supply lines BVDLa and BVDLb, respectively. According to test mode instruction signal TEST1, output signals of corresponding latch circuits 200a and 200b and power-up detection signal POR, switch gate circuits 265a and 265b control the connection between memory power supply lines MVDLa and MVDLb and power supply nodes of load power supply lines BVDLa and BVDLb, respectively. Load power supply line BVDLa is coupled to bit lines BLa and ZBLa via BL load circuit 13a, and load power supply line BVDLb is coupled to bit lines BLb and ZBLb via BL load circuit 13b.

Memory ground line MVSLa is disposed in parallel with bit lines BLa and ZBLa, and memory ground line MVSLb is disposed in parallel with bit lines BLb and ZBLb. Memory power supply line MVDLa supplies a power supply voltage to memory cells SMC connected to bit lines BLa and ZBLa, and memory power supply line MVDLb supplies a power supply voltage to memory cells SMC connected to bit lines BLb and ZBLb.

Figure 24:
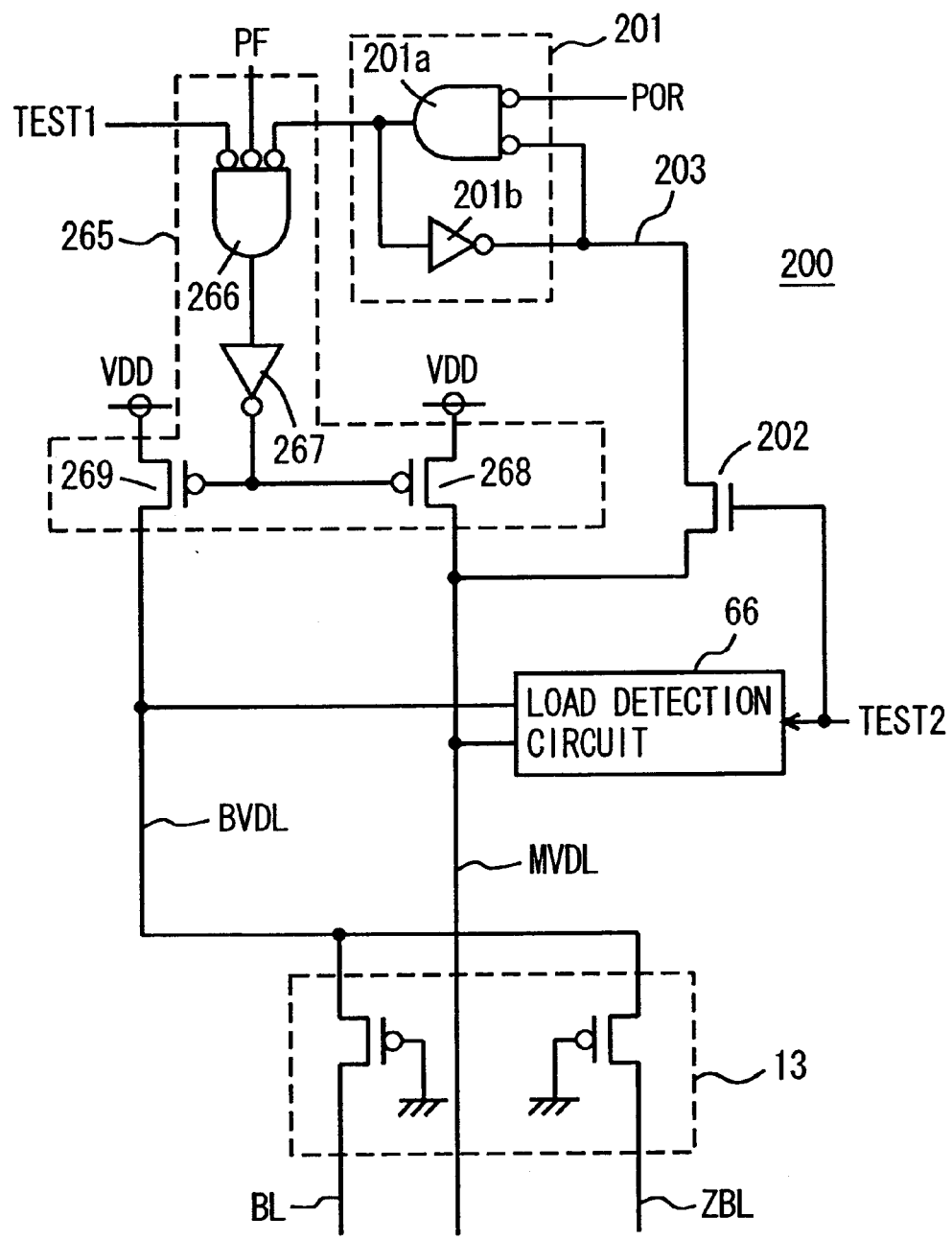
FIG. 24 is a diagram showing the configuration of a bit line peripheral circuit shown in FIG. 23.

FIG. 24 shows a specific example of the configuration of latch circuits 200a and 200b and switch gate circuits 265a and 265b shown in FIG. 23. Since latch circuits 200a and 200b have the same configuration and switch gates 265a and 265b have the same configuration, FIG. 24 representatively shows the configuration of latch circuit 200 and switch gate 265, which are disposed for bit lines BL and ZBL.

In FIG. 24, latch circuit 200 includes transfer gate 202 which is selectively made conductive in response to test mode instruction signal TEST2 to electrically couple memory power supply line MVDL to internal node 203, and a latch gate 201 that latches the voltage on internal node 203. Latch gate 201 includes a 2-input NOR gate 201a receiving the voltage at internal node 203 and power-up detection signal POR, and inverter 201b for inverting an output signal of NOR gate 201a and transmitting the inverted signal to internal node 203.

In response to power-up detection signal POR which is activated at power-up, an output signal of latch gate 201a is reset to the LOW level.

In place of power-up detection signal POR, a signal which goes high in an operation mode other than the test mode may be supplied to latch gate 201a (this configuration will be described later).

Switch gate circuit 265 includes: a 3-input NOR gate 266 receiving fuse program information PF from a corresponding program circuit, test mode instruction signal TEST1, and an output signal of NOR gate 201a included in latch gate 201; an inverter 267 for inverting an output signal of NOR gate 266; a P-channel MOS transistor 268 which is made conductive in response to an output signal of inverter 267, to transmit power supply voltage VDD to memory power supply line MVDL; and a P-channel MOS transistor 269 which is made conductive, when an output signal of inverter 267 is at the LOW level, to transmit power supply voltage VDD to load power supply line BVDL.

Load detection circuit 66 has the configuration similar to that of load detection circuit 66 illustrated in FIG. 19. Alternately, load detection circuit 66 may have a configuration similar to that of detection holding circuit 16 shown in FIG. 18.

Bit line load circuit 13 has a configuration similar to that shown in the previously described embodiments.

In the configuration shown in FIG. 24, test mode instruction signals TEST1 and TEST2 are activated according to the operation sequence shown in FIG. 22 in a test mode.

Figure 25:
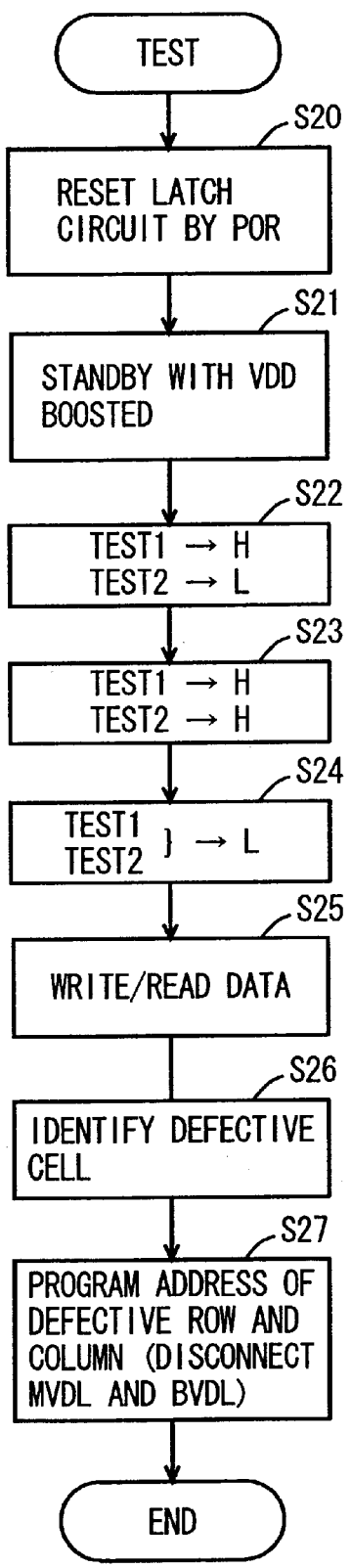
FIG. 25 is a flowchart showing a test operation sequence of the semiconductor memory device according to the seventh embodiment of the invention.

FIG. 25 is a flowchart showing test operation sequence of the semiconductor memory device according to the seventh embodiment of the invention. A method of testing the semiconductor memory device shown in FIGS. 23 and 24 will be described below with reference to FIG. 25.

It is now assumed that a short circuit RZb exists between word line WL and bit line BLa as shown in FIG. 23. First, a power supply voltage is supplied to activate power-up detection signal POR and latch gate 201 in latch circuit 200 is initialized. The voltage at node 203 is set to the power supply voltage level (step S20).

Power supply voltage VDD is set to a voltage higher than a voltage in the normal operation mode, thereby making an influence of short circuit RZb conspicuous (step S21).

Test mode instruction signal TEST1 is set to the HIGH level, while test mode instruction signal TEST2 is in the LOW level. By setting test mode instruction signal TEST1 to the HIGH level, both MOS transistors 268 and 269 enter a non-conductive state in switch gate circuit 265, and the power supply node is disconnected from load power supply line BVDL and memory power supply line MVDL (step S22).

In the case where short circuit RZb exists between word line WL and bit line BLa, since word line VWL is in a non-selected state, load power supply line BVDLa is discharged via short circuit RZb, and drops in voltage level. By setting test mode instruction signal TEST1 to the HIGH level for, for example, about 10 μs, the voltage level of load power supply line BVDLa sufficiently drops.

Subsequently, both test mode instruction signals TEST2 and TEST1 are set to the HIGH level (step S23). Load detection circuits 66 (66a and 66b) are accordingly activated to detect the voltage levels of memory power supply lines MVDLa and MVDLb and set the voltage levels of these memory power supply lines MVDLa and MVDLb in accordance with the result of detection. The voltage level of load power supply line BVDLa is dropped due to short circuit RZb, and the voltage level of memory power supply line MVDLa is driven to the ground voltage level by load detection circuit 66a. According to test mode instruction signal TEST2, transfer gate 202 is made conductive, and the voltage level of memory power supply line MVDL is latched by latch gate 201.

Subsequently, test mode instruction signals TEST1 and TEST2 are set to the LOW level (step S24). Accordingly, load detection circuit 66 is made inactive, and transfer gate 202 enters a non-conductive state. In corresponding latch circuit 200a, information that bit lines BLa and ZBLa are a defective column is stored. According to the information latched by latch circuit 200a, switch gate 265a disconnects memory power supply line MVDLa and load power supply line BVDLLa from the power supply node.

In this state, by using various data patterns, writing and reading of data is executed (step S25). Since no power supply voltage is supplied to memory power supply line MVDLa, accurate data is not stored in memory cells connected to bit lines BLa and ZBLa. Consequently, bit lines BLa and ZBLa are determined as a defective column.

Word line WL is connected to bit line BLa via short circuit RZb. In a memory cell of a horizontally-long structure, in many cases, the short circuit between word line WL and a bit line occurs via a low-resistive first level metal interconnection line. Therefore, bit line BLa is connected as a load capacitance to word line WL, a voltage on a word line changes at a slow speed, and data cannot be accurately written/read to/from memory cells connected to word line WL.

Supply of power supply voltage VDD to load power supply line BVDLa is interrupted, the voltage level of load power supply line BVDLa is low, and the voltage level of bit lines BLa and ZBLa is low. Therefore, also in a non-selected state, the voltage level of word line WL is low and does not rise in voltage level to an intermediate voltage level, and it can be prevented that a plurality of word lines are selected erroneously at the same time. Therefore, erroneous determination that a memory cell block included in word line WL is defective is prevented. Defective word line WL can be accurately identified, and the cross failure can be identified (step S26).

Subsequently, the addresses of the defective row and column are programmed through fuse blowing in program circuit 14a, thereby fixedly disconnecting memory power supply line MVDLa and load power supply line BVDLa from the power supply node (step S27).

By disconnecting the load power supply line for supplying a column current to the bit line from the power supply node and setting and latching the voltage level of the memory power supply line in accordance with the voltage level of the load power supply line in the test mode, the cross failure can be accurately detected.

In the configurations of FIGS. 23 and 24, according to the voltage level of load power supply line BVDLa, the voltage level of the memory power supply line of the corresponding column is set. Even in the case where load power supply line BVDL is disposed in correspondence with a defective column, its voltage level is not forced to the ground voltage level. However, in the test mode, if the period of time is appropriate, during which load power supply line BVDL is disconnected from the power supply node under the state where both test mode instruction signals TEST1 and TEST2 are set to the LOW level, load power supply line BVDL can be sufficiently driven to the ground voltage level.

Since the power supply voltage of a memory cell is once driven to the ground voltage level by load detection circuit 66, even if memory power supply line MVDL is in an electrically floating state in a test, the voltage level of the memory power supply line is sufficiently low. When a memory cell is selected, both bit lines BL and ZBL are driven to the ground voltage level in accordance with complementary data of the selected memory cell. Consequently, at the time of writing/reading data in the test mode, the voltage level of load power supply line BVDL can be set to the low level that is the ground voltage level.

Eighth Embodiment

Figure 26:
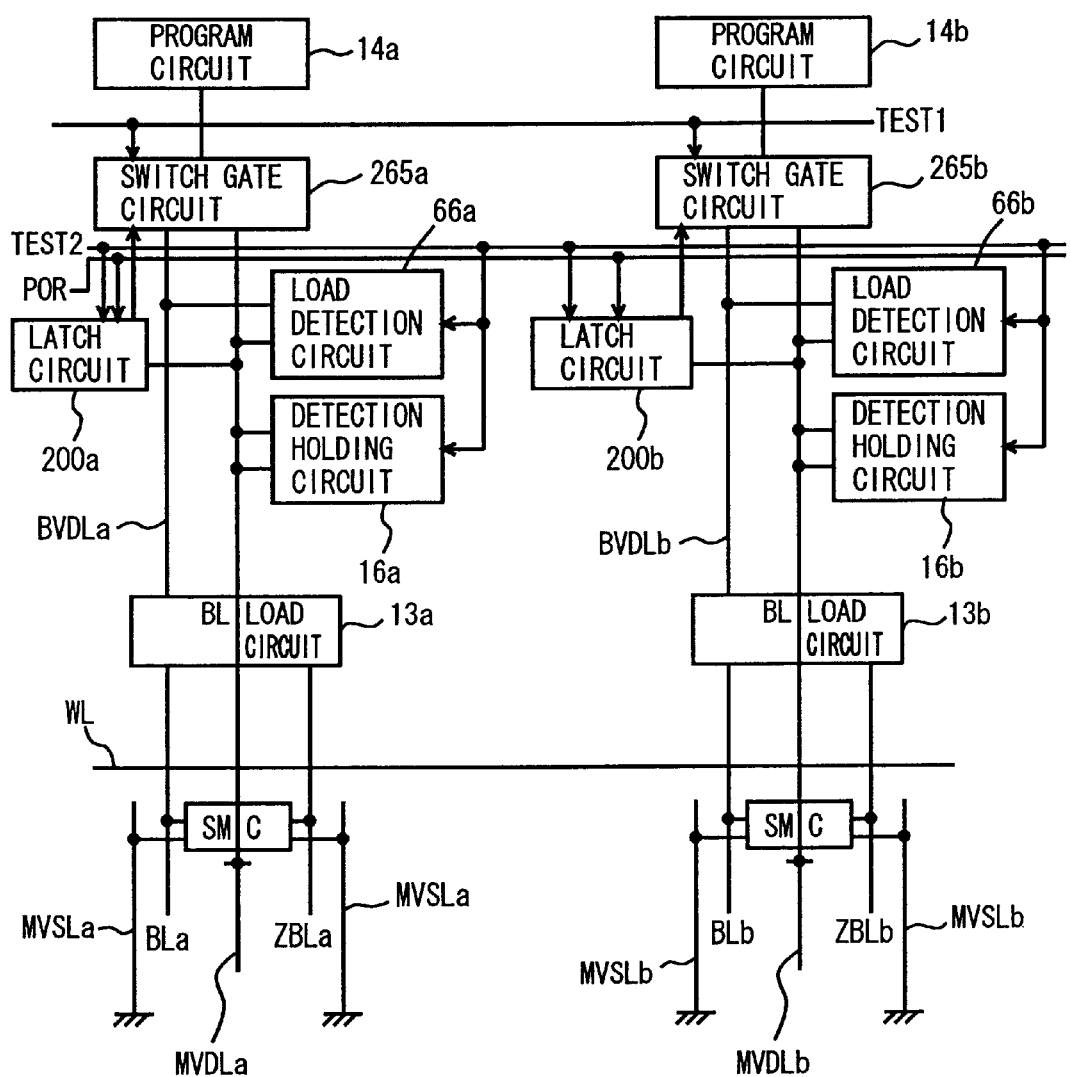
FIG. 26 is a diagram schematically showing a configuration of a main portion of a semiconductor memory device according to an eighth embodiment of the invention.

FIG. 26 schematically shows a configuration of a main portion of a semiconductor memory device according to an eighth embodiment of the present invention. In the configuration of FIG. 26, there are provided: load detection circuits 66a and 66b which are activated when test mode instruction signal TEST2 is activated, to detect the voltage level of load power supply lines BVDLa and BVDLb and according to the detection result, setting the voltage level of memory power supply lines MVDLa and MVDLb, respectively; and detection holding circuits 16a and 16b which are activated when test mode instruction signal TEST2 is activated, to detect the voltage level of memory power supply lines MVDLa and MVDLb and according to the detection result, setting the voltage level of memory power supply lines MVDLa and MVDLb.

For memory power supply lines MVDLa and MVDLb, latch circuits 200a and 200b are further provided. In the test operation mode, latch circuits 200a and 200b latch the voltage of memory power supply lines MVDLa and MVDLb, respectively, and control switch gate circiuts 265a and 265b in accordance with the latched voltage. To latch circuits 200a and 200b, similarly to the sixth and seventh embodiments, power-up detection signal POR is supplied.

The configuration of each of switch gate circuits 265a and 265b is similar to that of switch gate circuit 265 shown in FIG. 24 and the configuration of each of latch circuits 200a and 200b is similar to that of latch circuit 200 shown in FIG. 24.

The configuration shown in FIG. 26 is equivalent of the combination of the sixth and seventh embodiments. Therefore, in the event of occurrence of a short circuit between a word line and a bit line or a short circuit between a word line and a memory power supply line, in a manner similar to the sixth and seventh embodiments, the cross failure having the short-circuiting parts crossed with each other can be accurately detected, so that defective row and column can be repaired by redundancy replacement.

Ninth Embodiment

Figure 27:
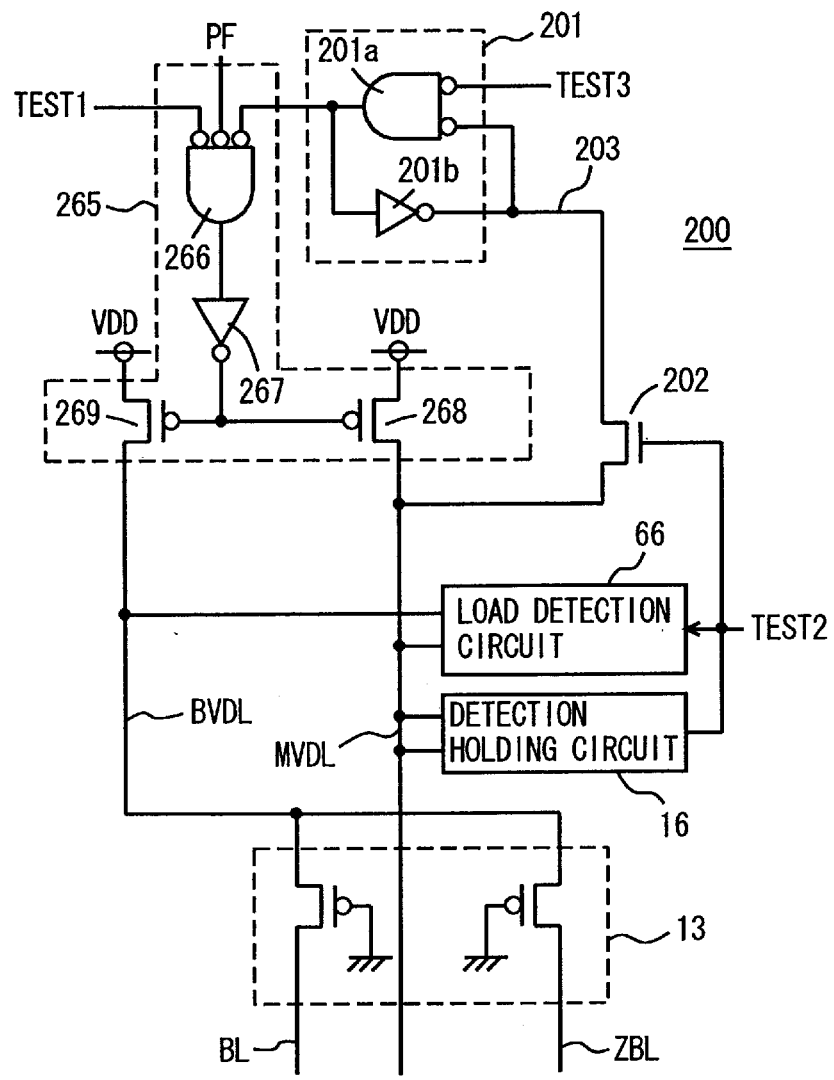
FIG. 27 shows a configuration of bit line peripheral circuitry shown in FIG. 26.

FIG. 27 is a diagram showing a configuration of a main portion of a semiconductor memory device according to a ninth embodiment of the present invention. FIG. 27 shows switch gate circuit 265, latch circuit 200, load detection circuit 66, and detection holding circuit 16 provided for bit lines BL and ZBL. The configuration of switch gate circuit 265 and latch circuit 200 is the same as that shown in FIGS. 21 and 24. The corresponding components are designated by the same reference numerals and their detailed description will not be repeated.

In the configuration shown in FIG. 27, in place of power-up detection signal POR, a test mode instruction signal TEST3 is supplied to latch gate 201. Test mode instruction signal TEST3 is set to the HIGH level in a mode other than the test operation mode and is set to the LOW level in the test mode.

The configuration of load detection circuit 66 and that of detection holding circuit 16 are similar to those shown in FIG. 17 or 18. In FIG. 27, detection holding circuit 16 and load detection circuit 66 are shown in a block form for the purpose of simplification of the drawing.

Figure 28:
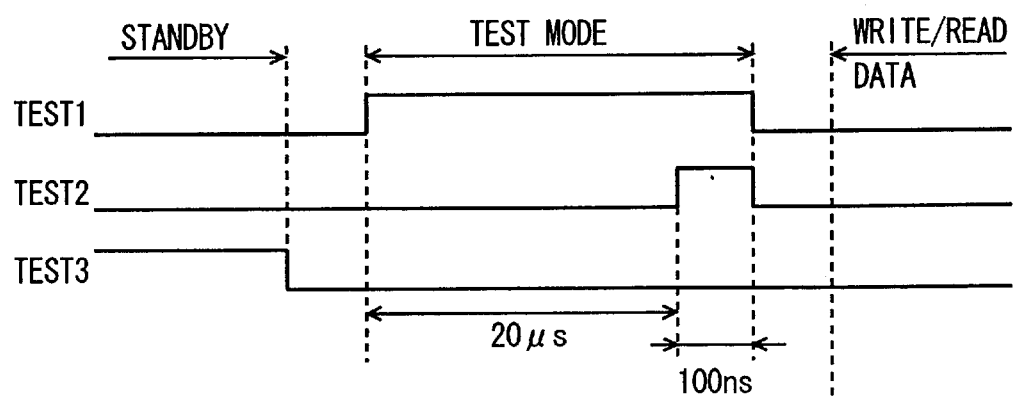
FIG. 28 is a timing chart representing an operation of a semiconductor memory device according to a ninth embodiment of the invention.

FIG. 28 is a timing chart showing the operation sequence of semiconductor memory device illustrated in FIG. 27. The operation of the semiconductor memory device shown in FIG. 27 will be briefly described with reference to FIG. 28.

In a standby state before the test operation mode, test mode instruction signals TEST1 and TEST2 are set to the LOW level, and test mode instruction signal TEST3 is set to the HIGH level. Since the fuse blowing in the program circuit is not yet performed, fuse program information PF is at the L level. Latch gate 201 is reset to the initial state in accordance with test mode instruction signal TEST3, and an output signal of latch gate 201 is at the LOW level. Therefore, in switch gate circuit 265, an output signal of NOR gate 266 is at the HIGH level. Accordingly, an output signal of inverter 267 is at the LOW level, and MOS transistors 268 and 269 are in a conductive state. Therefore, memory power supply line MVDL and load power supply line BVDL are coupled to the power supply node and receive power supply voltage VDD.

On the other hand, in the test mode for detecting standby current abnormality, first, test mode instruction signal TEST3 is set to the LOW level to release latch gate 201 from the reset state. Subsequently, test mode instruction signal TEST1 is set to the HIGH level for a predetermined period, such as 20 µs, an output signal of inverter 267 is set to the HIGH level in switch gate circuit 265 to disconnect power supply lines MVDL and BVDL from the power supply node, and the voltage level of memory power supply line MVDL is set in accordance with the presence or absence of a short circuit.

Then, test mode instruction signal TEST2 is set to the H level to activate load detection circuit 66 and detection holding circuit 16, and the voltage level of memory power supply line MVDL is set in accordance with the voltage levels of load power supply line BVDL and memory power supply line MVDL. The voltage level of memory power supply line MVDL is latched by latch gate 201 through transfer gate 202 rendered conductive in response to the test mode instruction signal TEST 2.

After the completion of setting and latching of the voltage level of the memory power supply line, both test mode instruction signals TEST1 and TEST2 are set to the LOW level, and test mode instruction signal TEST3 is maintained at the LOW level. Therefore, latch gate 201 maintains the latching state, and switch gate circuit 265 selectively disconnects load power supply line BVDL and memory power supply line MVDL from the power supply node in accordance with the presence or absence of a short circuit.

By writing/reading data with various data patterns and detecting a defective memory cell in this state, the cross failure can be detected.

Test mode instruction signal TEST3 is set at the HIGH level in a mode other than the test operation mode for maintaining latch gate 201 in a reset state. Thus, even if α rays, neutrons, or the like are made incident from a noise source during the period from power-up to the start of a test mode, latch circuit 200 can be prevented from being set in an erroneous state. The voltage level of memory power supply line MVDL can be latched and the cross failure can be detected with accuracy.

In the configuration shown in FIG. 27, the voltage levels of both load power supply line BVDL and memory power supply line MVDL are detected to set the voltage level of memory power supply line MVDL. The configuration of using test mode instruction signal TEST3 in place of power-up detection signal POR can be also applied to the foregoing embodiments 6 and 7.

Tenth Embodiment

Figure 29:
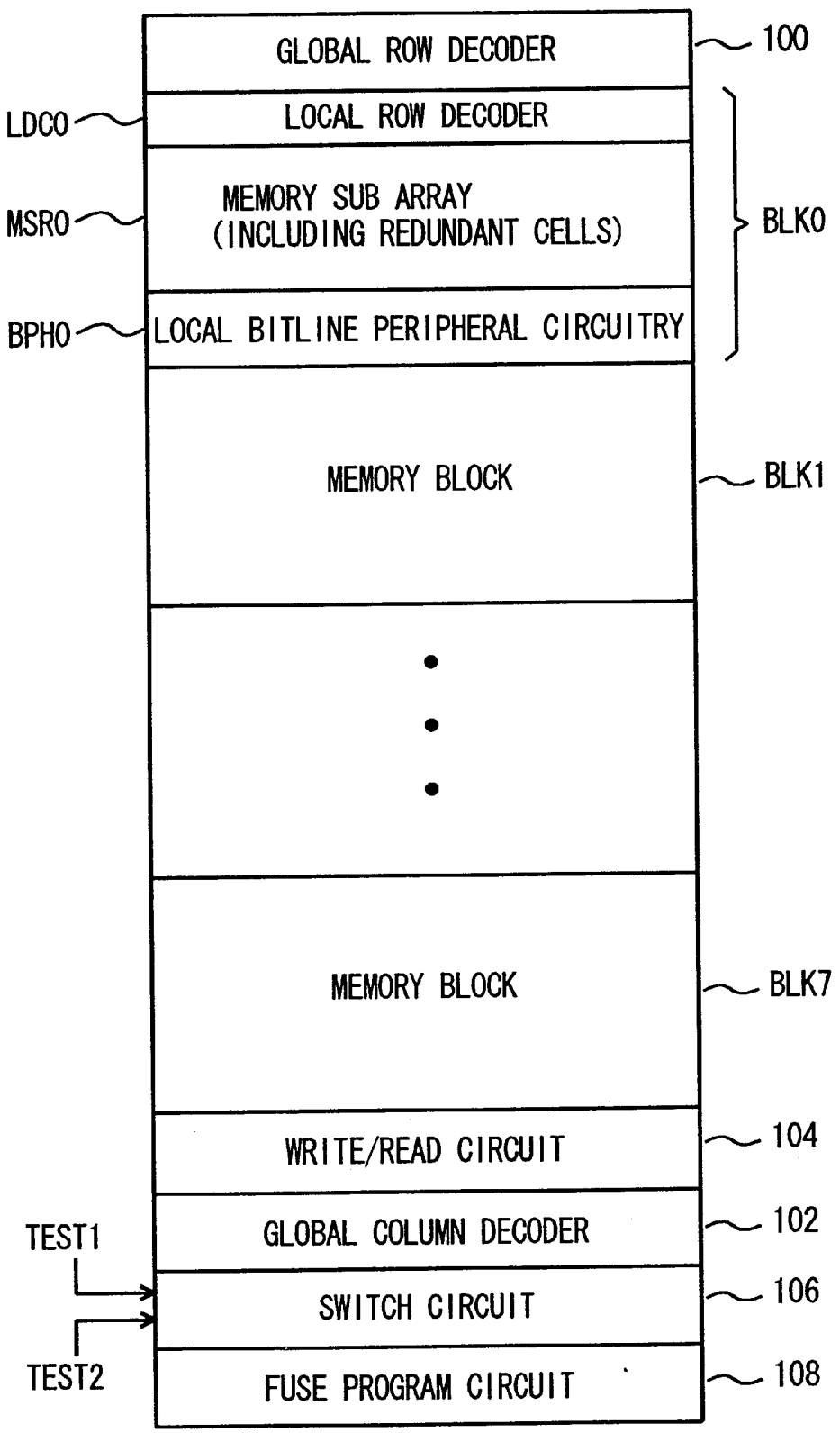
FIG. 29 is a diagram schematically showing a configuration of a main portion of a semiconductor memory device according to a tenth embodiment of the present invention.

FIG. 29 schematically shows the overall configuration of a semiconductor memory device according to a tenth embodiment of the present invention. In FIG. 29, the semiconductor memory device includes: eight memory blocks BLK0 to BLK7 each having a plurality of memory cells arranged in rows and columns; a global row decoder 100 provided commonly to memory blocks BLK0 to BLK7, for selecting a row in accordance with a not shown address signal; a global column decoder 102 for selecting a column in memory blocks BLK0 to BLK7; a write/read circuit 104 for performing writing/reading data on a memory cell selected by global column decoder 102; a switch circuit 106 for detecting voltage levels of load power supply lines and memory power supply lines provided commonly to memory blocks BLK0 to BLK7 in a test mode of operation to set the voltage levels of these power supply lines in accordance with the result of detection; and a fuse program circuit 108 for driving a memory power supply line and a load power supply line provided for a defective column to ground voltage. In order to normally maintain a defective column in an unselected state, fuse program circuit 108 further maintains a corresponding column selection signal from global column decoder 102 in an unselected state in accordance with the programmed information.

Since memory blocks BLK0 to BLK7 have the same configuration, FIG. 29 schematically shows the configuration of memory block BLK0. Memory block BLK0 includes a memory sub array MSR0 having memory cells arranged in rows and columns, a local row decoder LDC0 for selecting a row in memory sub array MSR0 in accordance with a global row decode signal and a local row decode signal not shown, and a local bit line peripheral circuitry BPH0 provided for the bit lines in memory sub array MSR0. Local bit line peripheral circuitry BPH0 includes a local sense amplifier for reading out data of a selected memory cell, a bit line load circuit, and a column selection gate for connecting, to a global data lines, the bit lines corresponding to a selected column in the memory sub array.

In memory sub array MSR0 of the semiconductor memory device shown in FIG. 29, the memory cell has a layout of a horizontally long structure, as shown in FIGS. 3 and 4. The horizontally long memory cell has a length in the column direction made longer than a vertical length in the bit line direction. Therefore, in memory sub array MSR0, bit lines are disposed extending in the column direction, and word lines are disposed extending in the row direction. The bit lines are electrically coupled to bit line lead lines extending in the row direction, for electrical coupling to local bit line peripheral circuitry BPH0. In this case, the memory power supply lines and the bit line load power supply lines are arranged in the row direction commonly to memory blocks BLK0 to BLK7. In this way, also in the horizontally long type cell structure, that is, in a so-called "T shaped bit line configuration", the identification of a defective column address allows the repairing of a standby current defect in the bit line load power supply line and/or the memory power supply line.

Figure 30:
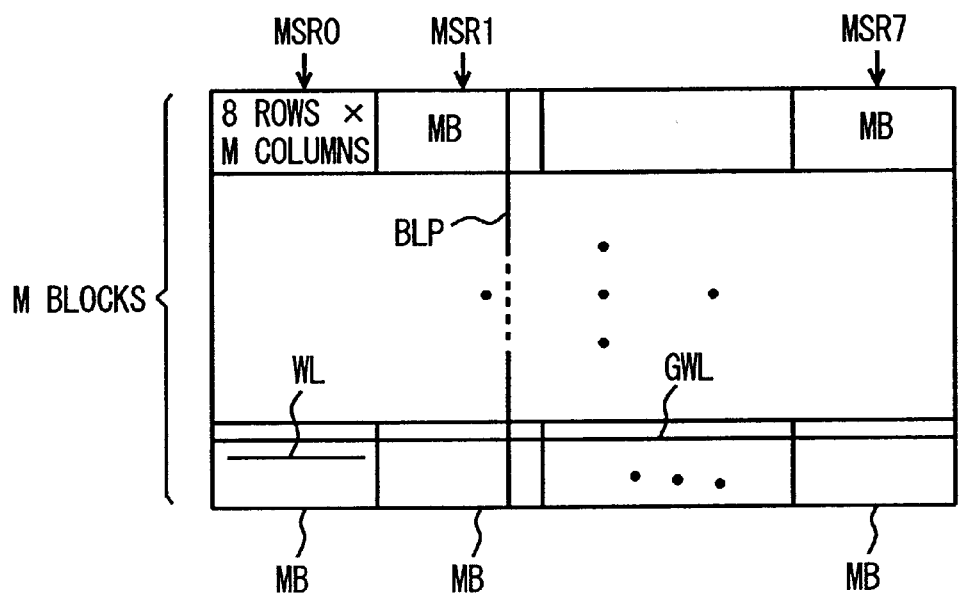
FIG. 30 is a diagram schematically showing a configuration of a memory sub array in the semiconductor memory device shown in FIG. 29.

FIG. 30 schematically shows a configuration of a memory sub array in the semiconductor memory device shown in FIG. 29.

Each of memory sub arrays MSR0 to MSR7 is divided into M unit memory blocks MB. The unit memory block MB includes SRAM cells of a horizontally long structure and arranged in 8 (eight) rows and M columns. A global word line GWL is commonly disposed for memory sub arrays MSR0 to MSR7. A global word line selection signal is transferred onto global word line GWL from global row decoder 100 shown in FIG. 29.

In each of unit memory blocks MB, word lines WL are disposed corresponding to the memory cell rows. In each of memory sub arrays MSR0 to MSR7, bit line pairs BLP are commonly disposed for corresponding M unit memory blocks MB. Therefore, in each of memory sub array MSR0 to MSR7, M bit line pairs BLP are disposed.

Memory sub array selection is performed using a memory block selection signal. Selection of a memory cell row is commonly performed with the global word lines on the unit memory blocks (memory row block) aligned in the row direction. In SRAM, row and column addresses are simultaneously applied. Therefore, a main word line selection signal and a global column selection signal of the global row decoder and the global column decoder, and the memory block selection signal are together used to access to a memory cell SMC in a selected unit memory block MB.

FIG. 31 schematically shows a configuration a sub memory block SMB related to one of unit memory blocks MB in memory blocks BLK0 to BLK7. In sub memory block SMB, memory cells SMC are disposed in 8 rows and M columns, and word lines WL are disposed corresponding to the respective memory cell rows. Therefore, eight word lines WL are disposed in unit memory block MB of sub memory block SMB.

In response to a signal on global word line GWL and a word line selection signal (not shown), a local row decode circuit 110 included in local row decoder LDC drives one of eight word lines WL (when a corresponding global word line is selected). In this case, local row decode circuit 110 may be selectively activated according to the memory block selection signal. More specifically, in the unit memory blocks (memory row block) aligned in the row direction, a row (word line) may be driven to a selected state in one of sub memory blocks SMB.

Bit lines BL and ZBL are arranged extending in the column direction. Memory power supply line MVDL is also disposed extending in the column direction in parallel to bit lines BL and ZBL.

In parallel to global word line GWL, bit line load power supply line BVDL is commonly disposed for sub memory blocks SMB disposed in alignment in the row direction. Bit lines BL and ZBL are electrically coupled to a local peripheral circuit 112 via bit line lead lines BLL and ZBLL that extend in the row direction. In response to a global column selection signal GYL and a memory block selection signal (not shown), local peripheral circuit 112 electrically couples bit line lead lines BLL and ZBLL to corresponding global data lines GIO and ZGIO.

In addition, in the row direction, a memory power supply line MVDLM is disposed extending in the row direction commonly for sub memory blocks SMB aligned in the row direction. Memory power supply line MVDLM is electrically coupled to memory power supply line MVDL in each of sub memory blocks SMB. As described later in detail, in memory sub array MSR, connections between bit line pairs (column) and the bit line lead line pairs in the M unit memory blocks are uniquely determined. In each of unit memory block MB, one bit line lead line pair is disposed and is electrically coupled to a corresponding local peripheral circuit. Hence, the memory power supply line MVDL that is to be electrically coupled to main memory power supply line MVDLM is uniquely determined according to the position of sub memory block SMB in each of the memory sub arrays.

Global data lines GIO and ZGIO are disposed extending in the row direction commonly to sub memory blocks SMB of a row block, and are electrically coupled to write/read circuit 104 shown in FIG. 29. Global data lines GIO and ZGIO are disposed corresponding to individual memory row blocks. That is, in total, M pairs of global data lines GIO and ZGIO are disposed.

Figure 32:
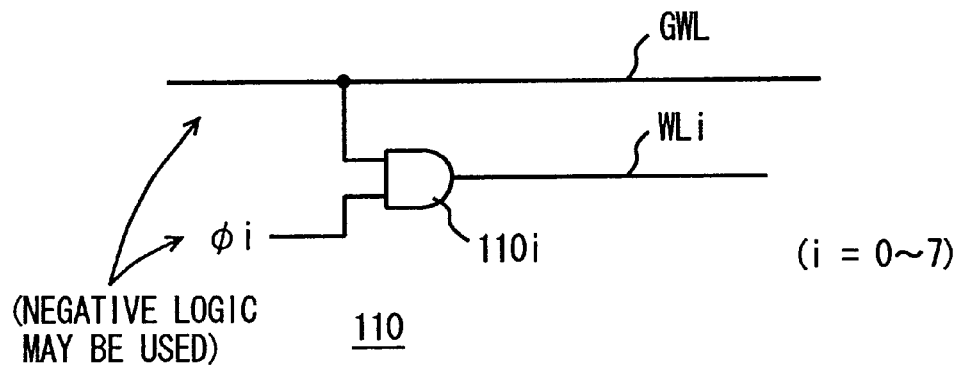
FIG. 32 is a diagram showing an example of a configuration of a local row decoder shown in FIG. 29.

FIG. 32 schematically shows an example of a configuration of the local row decode circuit 110 shown in FIG. 31. In FIG. 32, local row decode circuit 110 includes a word line drive circuit 110$i$ provided for a word line WL$i$. Word line drive circuit 110$i$ drives word line WL$i$ to a selected state in response to a word line selection signal $\phi i$ and a signal on a corresponding global word line GWL. Word line selection signal $\phi i$ is applied from a word line selection signal generating section (not shown). Eight word lines WL0 to WL7 are disposed for one global word line GWL. Word line selection signal $\phi i$ is generated from, for example, 3-bit row address signal. In this case, such a configuration may be employed that a 3-bit column address signal is decoded to generate a memory block selection signal for designating a memory block, and the logical product of the word line selection signal and the memory lock selection signal is used to generate a word line drive signal. That is, only in the selected memory block, selection of a memory cell row may be performed.

In the configuration shown in FIG. 32, a word line drive signal is generated by an AND circuit 110$i$, and global word line GWL and word line selection signal $\phi i$ are driven to a HIGH level when selected. However, global word line GWL and word line selection signal $\phi i$ may be a negative-logic signal that goes to a LOW level when selected. When the negative-logic signal is used, a NOR circuit is used for the word line drive circuit.

Figure 33:
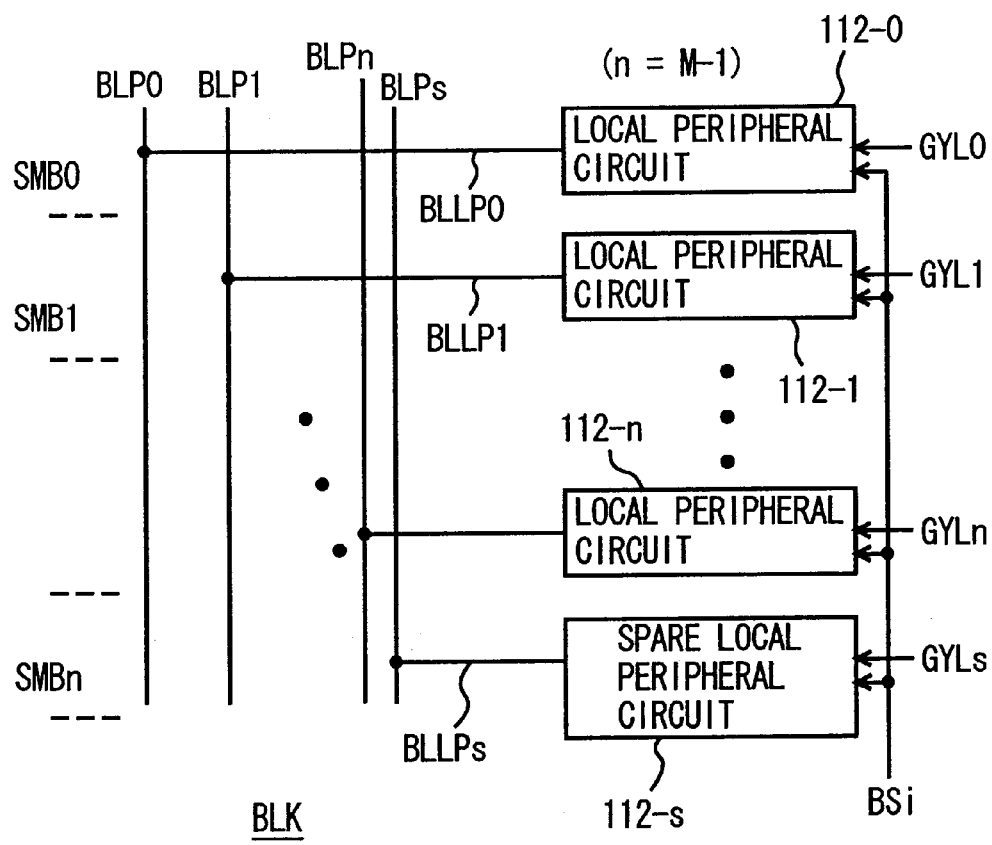
FIG. 33 is a diagram schematically showing a configuration of the memory block shown in FIG. 29.

FIG. 33 schematically shows a bit line arrangement in a memory block BLK. In memory block BLK, bit line pairs BLP0 to BLPn are commonly disposed for M sub memory blocks SMB0 to SMBn (n=M−1) to extend in the column direction in correspondence to memory cell columns.

Bit line lead line pairs BLLP0 to BLLPn are disposed for sub memory blocks SMB0 to SMBn, respectively. Thus, as to individual bit line lead line pairs BLLP0 to BLLPn, the bit line pairs to be electrically coupled are uniquely predetermined according to the positions of corresponding sub memory blocks SMB. Specifically, a bit line lead line pair BLLP$i$ disposed for a sub memory block SMB$i$ is electrically coupled to a bit line pair BLP$i$.

In memory block BLK, a spare bit line pair BLPs for redundancy replacement is disposed, and is electrically coupled to a corresponding spare local peripheral circuit 112-$s$ via a spare bit line lead line pair BLLPs. Spare local peripheral circuit 112-$s$ selects spare bit line pair BLPs in response to the memory block selection signal and a spare global column selection signal GYLs. Spare local peripheral circuit 112-$s$ is disposed in a spare sub memory block. The spare sub memory block includes a spare word line that is used to repair a defective row through replacement. Therefore, a spare global word line (not shown) is disposed for a global word line GWL, and spare global data lines (not shown) are disposed for global data lines GIO and ZGIO.

In addition, local peripheral circuits 112-0 to 122-$n$ are provided corresponding to these bit line lead line pairs BLLP0 to BLLPn, and electrically couple corresponding bit line lead line pairs BLLP to corresponding global data lines GIO and ZGIO in response to respective global column selection signals GYL0 to GYLn and memory block selection signal BS$i$. Spare local peripheral circuit 112-$s$ electrically couples the corresponding spare bit line lead line pair to the corresponding spare global data lines in response to spare global column selection signal GYLs and memory block selection signal BS$i$. The number of the spare bit line pairs and the number of the spare word lines are appropriately determined in consideration of the storage capacity and the repairing efficiency.

Figure 34:
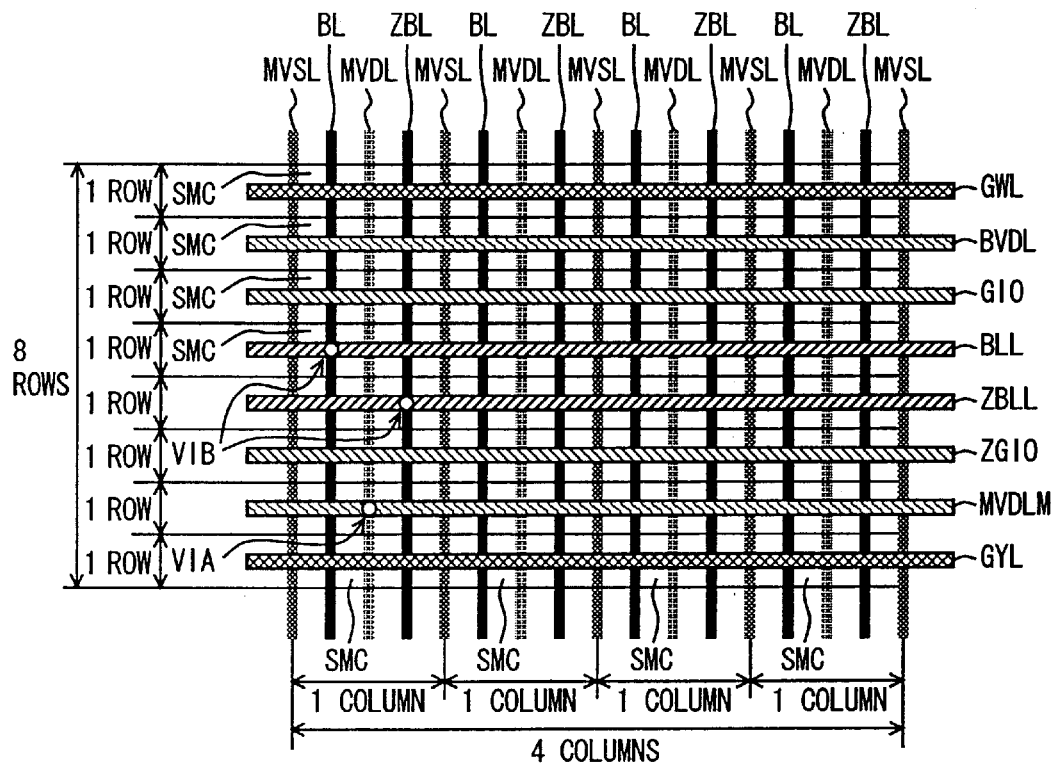
FIG. 34 is a diagram schematically showing an interconnection line layout in a unit memory block.

FIG. 34 schematically shows an interconnection line layout in unit memory block MB. As shown in FIG. 34, in a single unit memory block MB, memory cells SMC are arranged in eight rows and four columns, for example. Pairs of bit lines BL and ZBL are arranged corresponding to the respective columns of memory cells SMC.

A memory ground line MVSL is disposed outside of each of the pairs of bit lines BL and ZBL, and a memory power supply line MVDL is disposed between each of the pairs of bit lines BL and ZBL. That is, memory ground line MVSL, bit line BL, memory power supply line MVDL, and bit line ZBL are alternately disposed in the first level metal interconnection line layer. Memory ground line MVSL, bit line BL, memory power supply line MVDL, and bit line ZBL are disposed extending in the column direction commonly to unit memory blocks MB included in a single memory block BLK.

Second level metal interconnection lines are used to dispose global word line GWL, load power supply line BVDL, global data line GIO, bit line lead line BLL, bit line lead line ZBLL, global data line ZGIO, memory power supply line MVDLM, and global column selection signal GYL, extending in the row direction in correspondence to the individual memory cell rows. These interconnection lines are disposed corresponding to the individual memory cell rows, and the second level metal interconnection lines can be disposed with sufficient margins at the pitch of the memory cell row.

Bit line lead lines BLL and ZBLL are electrically coupled to predetermined bit lines BL and ZBL, respectively, through a corresponding via hole VIB. In unit memory block MB, bit lines BL and ZBL to which bit line lead lines BLL and ZBLL are electrically coupled are uniquely determined (refer to FIG. 33).

Similarly, main memory power supply line MVDLM is electrically coupled through a via hole VIA to memory power supply line MVDL provided for bit lines BL and ZBL electrically coupled to the bit line lead lines BLL and ZBLL. Memory power supply line MVDLM is electrically coupled to the memory sub arrays aligned in the row direction. Main memory power supply line MVDLM is coupled to memory power supply line MVDL disposed corresponding to the bit lines on the same column of sub memory blocks aligned in the row direction or in the memory row block.

Accordingly, when bit lines BL and ZBL provided with via holes VIB are defective, memory cells SMC on the same column in unit memory blocks aligned in the row direction are all replaced by redundant cells. Hence, when a main memory power supply line MVDLM causes a standby current defect, the main memory power supply line MVDLM is disconnected from a power supply node, which allows a standby-current-defective memory cell SMC to be repaired and to be disconnected from the power supply node, thereby enabling the standby current failure to be reliably repaired.

In addition, according to the layout shown in FIG. 34, when data is read out, in the second level metal interconnection lines, bit line lead lines BLL and ZBLL and global data lines GIO and ZGIO are small in signal amplitude, and global word line GWL and global column selection signal GYL are large in signal amplitudes. However, bit line load power supply line BVDL is disposed adjacent to global word line GWL, and memory power supply line MVDLM is disposed adjacent to global column selection signal GYL, and bit line load power supply line BVDL and memory power supply line MVDLM serve as shield layers. Thus, capacitive coupling noise can be prevented from being transferred to small-amplitude signal lines GIO, BLL, ZBLL, and ZGIO. Therefore, the data can be accurately read out.

Figure 35:
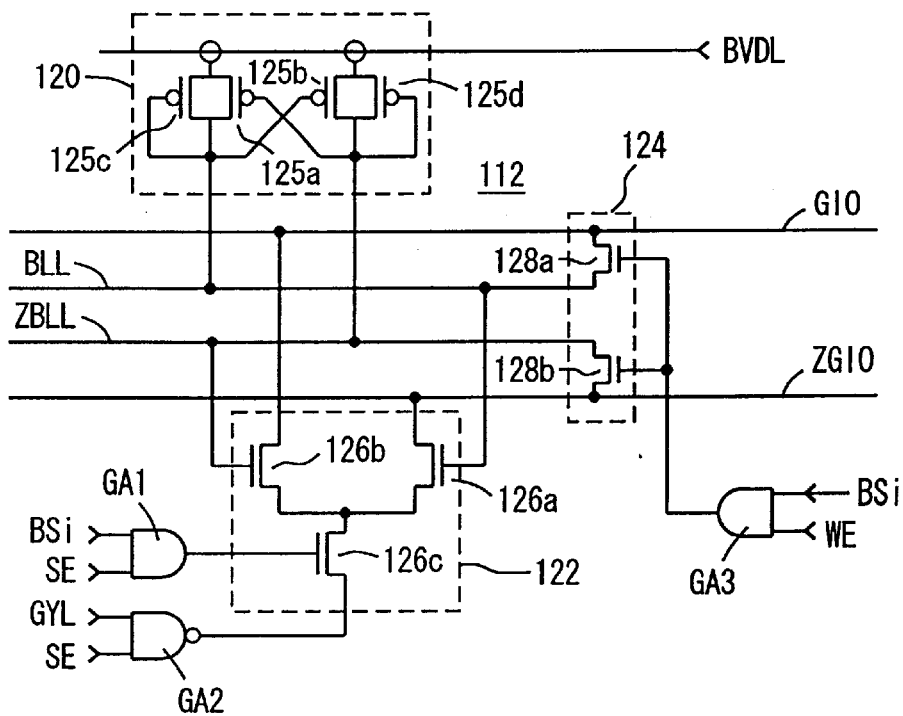
FIG. 35 is a diagram showing an example of a configuration of a local peripheral circuit shown in FIG. 31.

FIG. 35 schematically shows a configuration of local peripheral circuit 112 shown in FIG. 31. In FIG. 35, local peripheral circuit 112 includes a bit line load circuit 120 for pulling up the voltage levels of bit line lead lines BLL and ZBLL to a power supply voltage VDD, a sense amplifier 122 rendered active in response to memory block selection signal BSi and a sense amplifier activation signal SE and global column selection signal GYL for driving global data lines GIO and ZGIO in accordance with the signal potentials on bit line lead lines BLL and ZBLL, and a write column selection gate 124 for selectively, electrically coupling bit line lead lines BLL and ZBLL to the respective global data lines GIO and ZGIO in accordance with memory block selection signal BSi and write enable signal WE.

Bit line load circuit 120 is constructed of cross-coupled P-channel MOS transistors 125a and 125b, and diode-connected P-channel MOS transistors 125c and 125d. P-channel MOS transistor 125a is coupled between bit line load power supply line BVDL and bit line lead line ZBLL, and has a gate coupled to bit line lead line BLL. P-channel MOS transistor 125b is coupled between bit line load power supply line BVDL and bit line lead line ZBLL, and has a gate coupled to bit line lead line BLL. P-channel MOS transistor 125c is coupled in parallel to P-channel MOS transistor 125a, and has a gate coupled to bit line lead line BLL. P-channel MOS transistor 125d is coupled in parallel to P-channel MOS transistor 125b, and has a gate coupled to bit line lead line ZBLL.

In bit line load circuit 120, in the standby state, MOS transistors 125c and 125d precharge corresponding bit lines BL and ZBL to the voltage level of bit line load power supply line BVDL through respective bit line lead lines BLL and ZBLL. In a data read operation, MOS transistors 125a and 125b detect the difference in potential of bit line lead lines BLL and ZBLL to maintain a bit line lead line BLL or ZBLL at a higher potential at power supply voltage VDD for latching the potential difference between bit line lead lines BLL and ZBLL. In a data write operation, MOS transistors 125a and 125b latch write data according to the write data received through global data lines GIO and ZGIO.

Upon entry to the standby state, MOS transistors 125c and 125d pull up the voltage levels of respective bit line lead lines BLL and ZBLL to the power supply voltage VDD on bit line load power supply line BVDL to release the latch state of MOS transistors 125a and 125b.

Sense amplifier 122 includes N-channel MOS transistors 126a and 126b for sensing a potential difference between bit line lead lines BLL and ZBLL, and a sense amplifier activating MOS transistor 126c for activating a sense amplifier 122. The gate of MOS transistor 126c receives an output signal outputted from an AND circuit GA1 that receives memory block selection signal BSi and sense amplifier activation signal SE. The source of MOS transistor 126c receives an output signal outputted from NAND circuit GA2 that receives global column selection signal GYL and sense amplifier activation signal SE.

Sense amplifier 122 is activated when all of global column selection signal GYL, memory block selection signal BSi, and sense amplifier activation signal SE are at a HIGH level, and a corresponding memory block is designated and a row block constituted of sub memory blocks aligned in the row direction is designated. In this way, sense amplifier 122 is activated in one sub memory block SMB. When sense amplifier 122 is activated, global data lines ZGIO and GIO are driven by MOS transistors 126a and 126b according to the difference in potential between bit line lead lines BLL and ZBLL. For example, when the potential of bit line lead line BLL is higher than that of bit line lead line ZBLL, the conductance of MOS transistor 126a is made greater than that of MOS transistor 126b, thereby causing the voltage level of global data line ZGIO to drop. This amplification enables read out signals of a small amplitude to transfer from the bit line lead lines BLL and ZBLL to respective global data lines GIO and ZGIO. Global data lines GIO and ZGIO are provided with a load circuit, and global data lines GIO and ZGIO are precharged at HIGH level in the standby state.

Write column selection gate 124 includes N-channel MOS transistors 128a and 128b for electrically connecting bit line lead lines BLL, ZBLL to global data lines GIO, ZGIO. MOS transistors 128a and 128b are turned ON when both memory block selection signal BSi and write enable signal WE are in an active state, and electrically couples respective bit line lead lines BLL and ZBLL to global data lines GIO and ZGIO when made conductive. In a data write operation, MOS transistors 128a and 128b transfer write data received from a write driver (not shown) to respective bit line lead lines BLL and ZBLL.

An AND gate GA3 receives memory block selection signal BSi and write enable signal WE, and applies an output signal thereof to MOS transistors 128a and 128b in write column selection gate. According to the above configuration, the bit line lead lines are electrically coupled to the corresponding global data lines in each of sub memory blocks in memory block. In sub memory block SMB in which global word line GWL is unselected, word lines WL are unselected accordingly. In this case, even if the bit line lead lines are electrically connected to global data lines in an unselected sub memory block, no particular problem occurs for the following reason. Global data lines GIO and ZGIO are pulled up by the associated load circuit to the level of power supply voltage VDD. Particularly, write column selection gate 124 is provided in the write/read circuit at the last stage, and write data are not transferred to an unselected sub memory block.

Sense amplifier 122 is activated only in sub memory block SMB including a selected memory cell SMC. Thereby, the power consumption in sensing operation is reduced.

Figure 36:
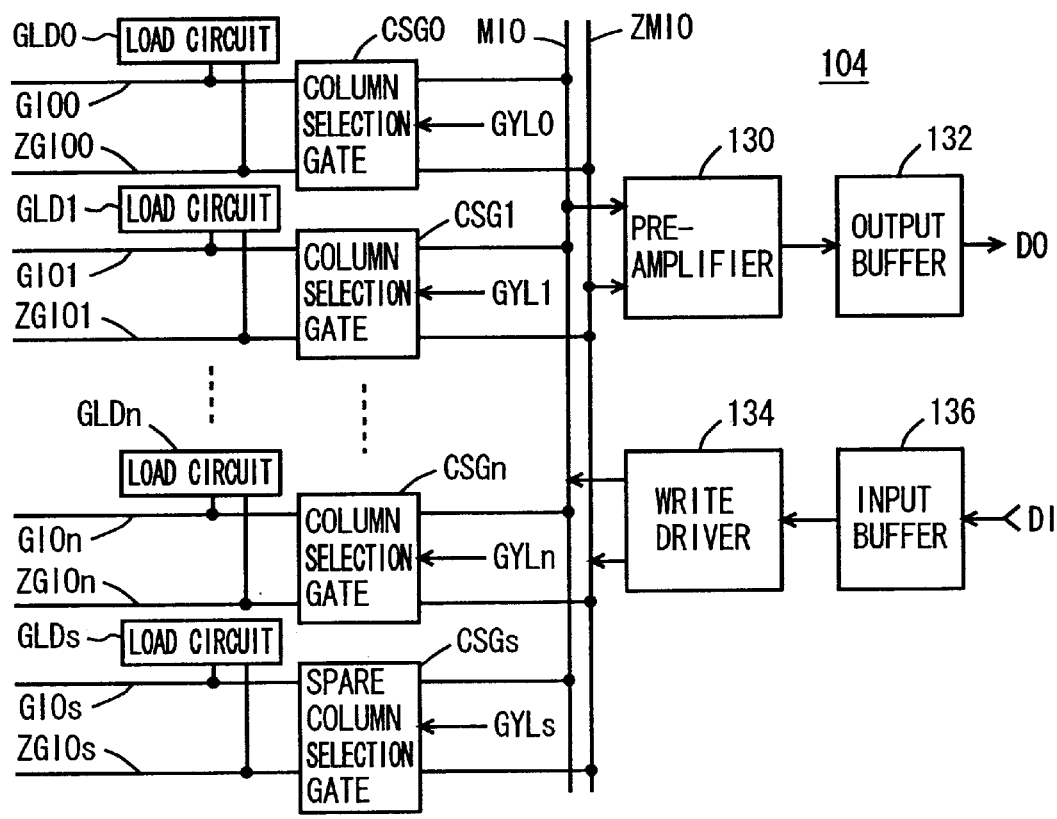
FIG. 36 is a diagram schematically showing a write/read circuit shown in FIG. 29.

FIG. 36 schematically shows a configuration of write/read circuit 104 shown in FIG. 19. Write/read circuit 104 includes column selection gates CSG0 to CSGn for electrically connecting selected global data lines to main data lines MIO and ZMIO in accordance with signals on global column selection lines GIL0 to GILn, a preamplifier 130 activated in data reading for amplifying data on main data lines MIO and ZMIO, an output buffer 132 for externally outputting data amplified by preamplifier 130, an input buffer 136 for producing internal data in accordance with externally applied write data, and a write driver 134 activated in data writing for amplifying internal data received from input buffer 136 for transmission onto main data lines MIO and ZMIO.

Column selection gates CSG0 to CSGn are provided corresponding to global data lines GIO0 and ZGIO0 to GIOn and GIOn, respectively.

Write/read circuit 130 further includes load circuit GLD0 to GLDn provided for global data lines GIO0 to ZGIOn for precharging corresponding global data lines to power supply voltage VDD in the standby state.

Write/read circuit 104 further includes a spare column selection gate CSGs provided spare global data lines GIOs and ZGIOs, for repairing a defective column. When a defective column is accessed, according to a global spare column selection signal GYLs, spare column selection gate CSGs electrically couples global spare data lines GIOs and ZGIOs to main data lines MIO to ZMIO. A load circuit GLDs is disposed for global spare data lines GIOs and ZGIOs.

Each of load circuits GLD0 to GLDn and GLDs has a configuration similar to bit line load circuit 120 shown in FIG. 35. When global column selection signals GYL0 to GYLn are selected, column selection gates CSG0 to CSGn electrically couple corresponding global data lines to main data lines MIO to ZMIO, respectively.

Figure 37:
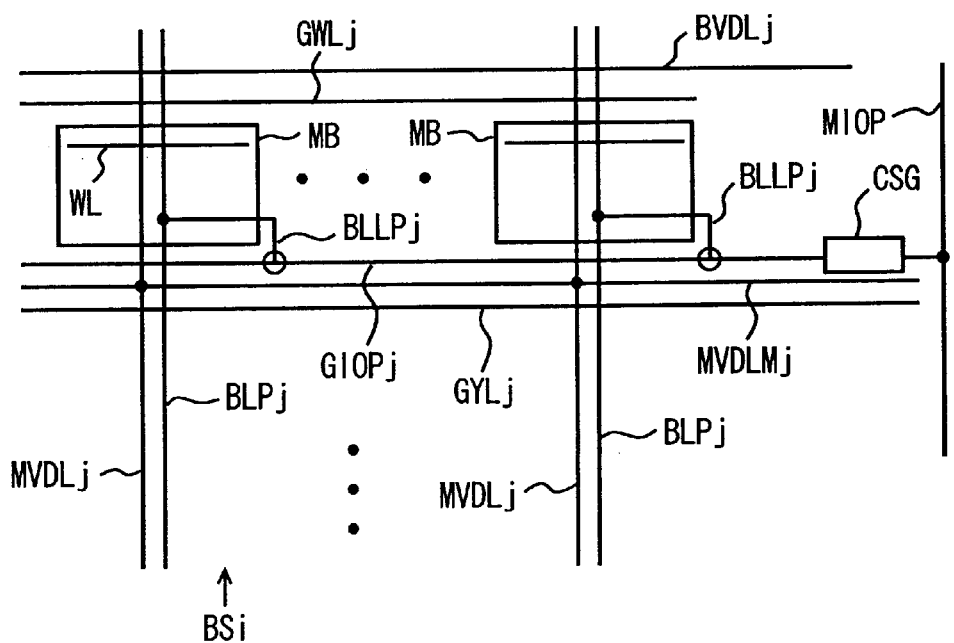
FIG. 37 is a diagram schematically showing an interconnection line layout of a row block in a semiconductor memory device shown in FIG. 29.

FIG. 37 schematically shows an interconnection line layout related to sub memory blocks (memory row block) aligned in the row direction. Unit memory blocks MB are disposed in alignment in the row direction. The memory row block is formed of unit memory blocks MB aligned in the row direction. A global word line GWLj is commonly disposed for the memory row block, and a bit line load power supply line BVDLj is disposed parallel to global word line GWLj. A global data line pair GIOPj is commonly disposed for unit memory blocks MB of the memory row block, and a main memory power supply line MVDLj is disposed parallel to global data line pair GIOPj.

In unit memory block MB, for example, eight word lines WL are disposed extending in the row direction. Bit line pair BLP is commonly disposed, extending in the column direction, for sub memory blocks SMB of unit memory blocks MB in the memory block. In each of unit memory blocks MB in the memory row block, a bit line pair BLPj is electrically coupled to global data line pair GIOPj via a bit line lead line pair BLLPj.

In a data read/write operation, bit line pair BLPj, which is provided for one of unit memory blocks MB in the memory row block, is selected and electrically coupled to global data line pair GIOPj in response to memory block selection signal BSi. A memory power supply line MVDLj is disposed parallel to bit line pair BLPj and is coupled to main memory power supply line MVDLMj. Global data line pair GIOPJ is electrically coupled to a main data line pair MIOP through a column selection gate CSGj.

In the above configuration, bit line load power supply line BVDLj and main memory power supply line MVDLMj, which are disposed in the memory row block, supply the power supply voltage, column current, and memory cell power supply voltage to bit line pair BLPj. Therefore, when the bit line pair causes a standby current defect, the defective bit line pair can be disconnected from the power supply node by disconnecting main memory power supply line and bit line load power supply line from the power supply node, and the standby current failure can be repaired.

In the above case, when the bit line pair causing the standby current abnormality is replaced, the corresponding column is replaced by a redundant column in each of unit memory blocks MB in the memory row block. This is because in the memory row block, the bit line pairs connected to the global data lines are uniquely predetermined, and the memory row block is equivalently designated through global column selection signal GYL. Hence, redundancy replacement needs to be performed for the overall memory row block in the defective-address programming of global column selection signal GYL.

Figure 38:
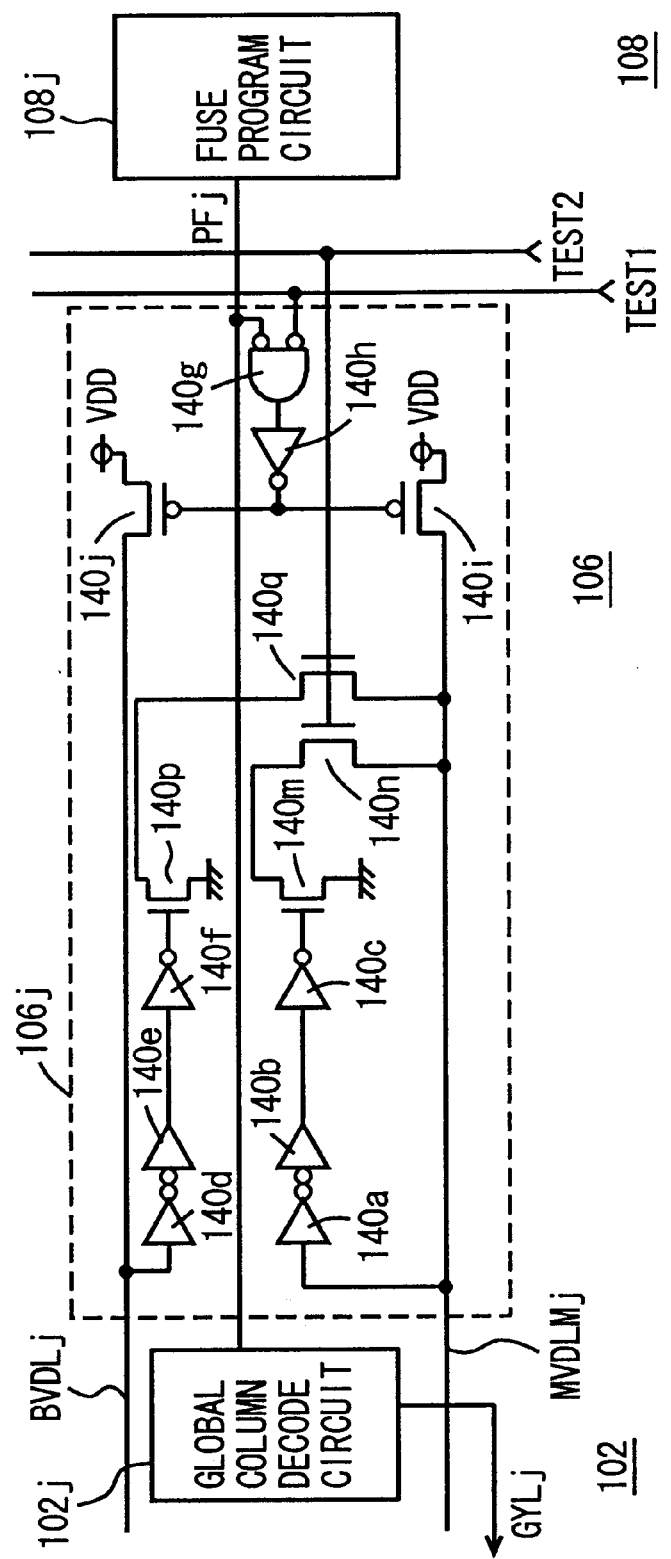
FIG. 38 is a diagram showing an example of a configuration of a switch circuit, and peripheral portions shown in FIG. 29.

FIG. 38 schematically shows a configuration of a portion provided in correspondence with a memory row block of global column decoder 102, switch circuit 106, and a fuse program circuit 108 shown in FIG. 29. In FIG. 38, global column decoder 102 includes a global column decoder 102j that generates a global column selection signal GYLj. In accordance with global column selection signal GYLj generated from global column decoder 102j, bit line pairs in the same column in unit memory blocks included in the memory row block are designated.

Fuse program circuitry 108 includes a fuse program circuit 108j that generates a fuse program signal PFj. The configuration of fuse program circuit 108j is the same as that of fuse program circuit 14 shown in FIG. 6.

Switch circuit 106 includes a voltage control circuit 106*j* that controls the voltage level of bit line load power supply line BVDLj and main memory power supply line MVDLMj in accordance with fuse program signal PFj applied from fuse program circuit 108*j* and test mode instruction signals TEST1 and TEST2.

Voltage control circuit 106*j* includes: a NOR circuit 140*g* receiving test mode instruction signal TEST1 and fuse program signal PFj; an inverter 140*h* receiving an output signal of NOR circuit 140*g*; a P-channel MOS transistor 140*j* which is made conductive when an output signal of inverter 140*h* goes low, to electrically couple a power supply node to bit line load power supply line BVDLj; and a P-channel MOS transistor 140*i* which is made conductive when an output signal of inverter 140*h* goes low, to electrically couple the power supply node to main memory power supply line MVDLMj.

In the test mode, test mode instruction signal TEST1 is set to a HIGH level, the output signal of NOR circuit 140*g* is responsively set to the LOW level, and the output signal of inverter 140*h* is set to a HIGH level accordingly. In this state, both MOS transistors 140*j* and 140*i* turn OFF, and thereby the power supply node is disconnected from bit line load power supply line DVDLj and main memory power supply line MVDLMj.

As for fuse program signal PFj from fuse program circuit 108*j*, in a case when a defective bit line pair BLPj exists in the corresponding memory row block, since a link element included therein is blown off, the level of the fuse program signal PFj is set to a HIGH level. In this case, MOS transistors 140*j* and 140*i* enter an OFF state normally, and responsively, both bit line load power supply line BVDLJ and main memory power supply line MVDLMj are disconnected from the power supply node, to prevent a standby current abnormality that can occur due to a defective memory cell in practical use.

Voltage control circuit 106*j* further includes: an inverter 140*a* receiving a signal (voltage) on main memory power supply line MVDLMj; cascaded inverters 140*b* and 140*c* at two stages receiving an output signal of inverter 140*a*; an N-channel MOS transistor 140*m* which is made conductive when an output signal of inverter 140*c* goes high, to transmit a ground voltage; an N-channel MOS transistor 140*n* which is made conductive when test mode instruction signal TEST2 goes high, to electrically couple the drain node of MOS transistor 140*m* to main memory power supply line MVDLj; an inverter 140*d* receiving a signal (voltage) on bit line load power supply line BVDLj; an inverter 140*e* receiving an output signal of inverter 140*d*; cascaded inverters 140*e* and 140*f* of two stages receiving output signals of inverter 140*d*; an N-channel MOS transistor 140*p* which is made conductive when an output signal of inverter 140*f* goes high, to transmit the ground voltage; and an N-channel MOS transistor 140*q* which is made conductive when test mode instruction signal TEST2 goes high, to electrically couple the drain node of MOS transistor 140*p* to main memory power supply line MVDLj.

Inverters 140*a* and 140*d* function as a potential detector, inverters 140*b* and 140*c* function as a waveform shaping circuit to convert an output signal of inverter 140*a* into a binary signal, and inverters 140*e* and 140*f* shape the waveform of an output signal of inverter 140*d* to generate a binary signal.

In the test mode, when test mode instruction signal TEST1 goes high, bit line load power supply line BVDLj and main memory power supply line MVDLMj are disconnected from the power supply node. In the corresponding memory row block, when a standby-current-defective memory cell is connected to bit line pair BLPj, a voltage drop is caused in bit line load power supply line BVDLj or main memory power supply line MVDLMj. The potential drop in power supply line MVDLMj or BVDLj is detected by inverter 140*a* or 140*d*, an output signal of inverter 140*c* or 140*f* goes high, and MOS transistor 140*p* or 140*m* is made conductive.

Subsequently, test mode instruction signal TEST2 is set to a HIGH level to make MOS transistors 140*n* and 140*q* conductive, for transferring the output signals of inverters 140*d* and 140*e* to main memory power supply line MVDLMj through MOS transistors 140*p* and 140*q*. When MOS transistor 140*m* or 140*p* is in the conductive state, main memory power supply line MVDLMj is driven to the ground voltage level, and the supply of the power supply voltage to a memory cell related to the standby current abnormality is stopped.

Therefore, when a voltage drop is caused in main memory power supply line MVDLMj or bit line load power supply line BVDLj because of a standby current abnormality, main memory power supply line MVDLMj is driven to the ground voltage level. Thus, as in the first to ninth embodiments, the standby-current-defective memory cell can be set to a failure state. Thereafter, the standby-current-defective but normally-operable memory cell can be detected through reading out of data stored in memory cells.

According to the detection results, a defective column address is detected, and a link element corresponding to the defective column address (global column selection signal GYLj) is blown off in a corresponding fuse program circuit 108*j*. Thereby, the standby-current-defective memory cell can be disconnected from the power supply node, and the standby current failure can be repaired. In this case, the redundancy column replacement is performed in individual memory blocks BLK.

Global column decoder 102*j* is maintained in an inactive state according to fuse program signal PFj received from fuse program circuit 108*j*. Consequently, global column selection signal GYLj is normally fixed in an unselected state. Global column selection signal GYLj may either be a positive-logic signal, or may be a negative-logic signal.

As shown in FIGS. 29 to 38, in a semiconductor memory device of a T-shaped bit line configuration having a bit line to which memory cells are connected and a bit line lead line for electrically connecting the bit line to a peripheral circuit, a defective column causing a standby current abnormality can be repaired, thereby enabling the standby current failure to be repaired.

The test sequence of the semiconductor memory device shown in FIGS. 29 to 38 is the same as the test operation flow shown in FIG. 11.

As described above, according to the tenth embodiment of the present invention, in the T-shaped bit line configuration, while the bit line load power supply line and the main memory power supply line are disconnected from the power supply node in units of the memory row blocks, and are maintained in the standby state, the presence or absence of a voltage drop in the power supply lines is detected and according to the detection result, the voltage level of the main memory power supply line is set. Thus, also in the T-shaped bit line configuration, the existence of a standby-current-defective but normally-operable memory cell can be detected. Accordingly, a standby-current-defective column can be repaired through replacement with redundancy memory cells or the use of spare global data lines and the spare bit lines.

In the redundant column replacement, such an configuration may be employed that only in the case where the redundant column (spare bit line pair) is used, spare bit line load power supply line and spare main memory power supply line provided corresponding to spare global data lines are electrically coupled to the power supply node.

In addition, in the T-shaped bit line configuration, the power supply lines and the bit line lead lines are alternately disposed using the second level metal interconnection lines, and the power supply lines are used as a shield layer. Therefore, coupling noise between interconnection lines can be reduced, and data read operation can be performed stably.

Eleventh Embodiment

Figure 39:
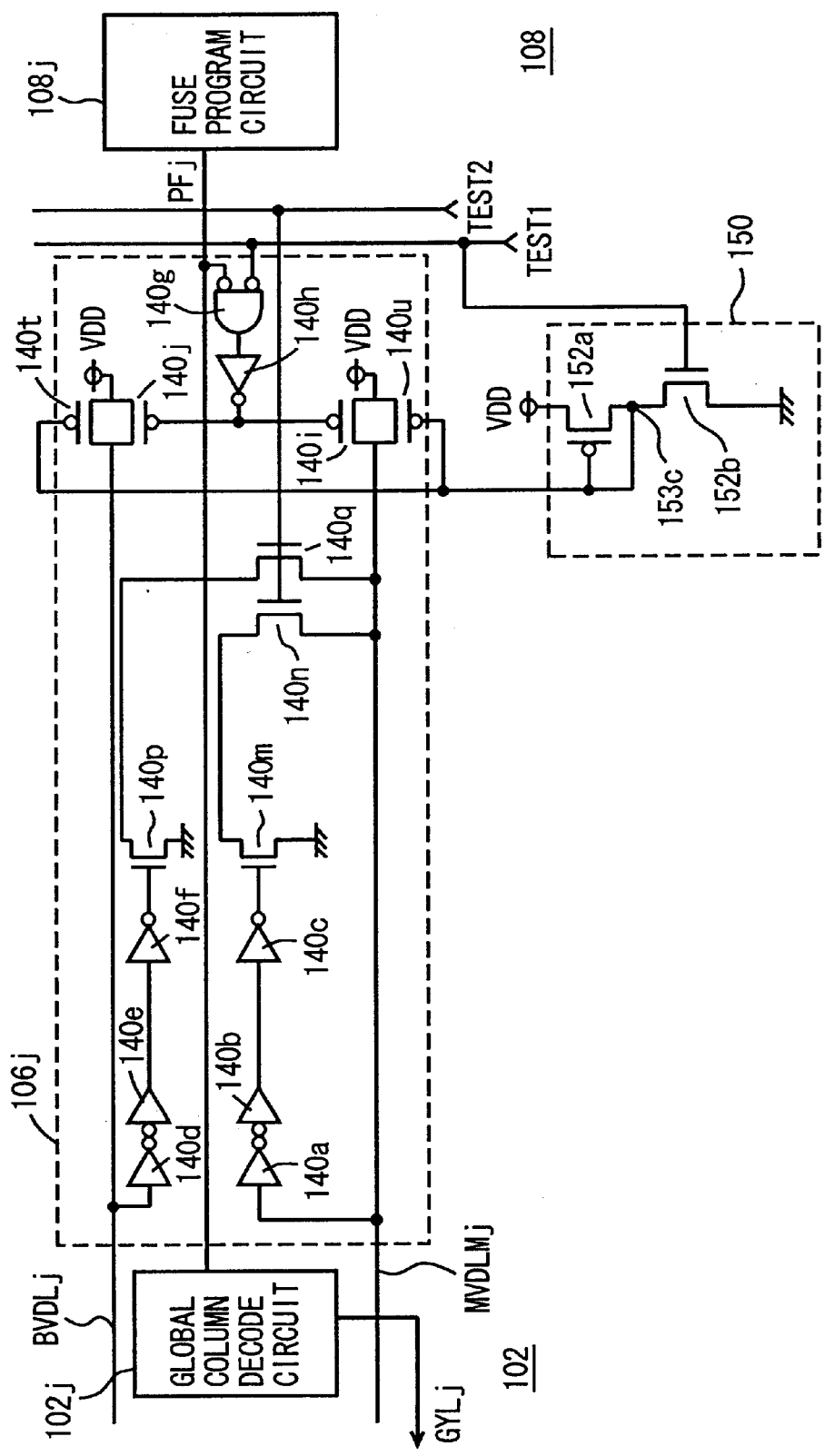
FIG. 39 is a diagram showing a configuration of a main portion of a semiconductor memory device according to a eleventh embodiment of the present invention.

FIG. 39 schematically shows a configuration of a main portion of a semiconductor memory device according to an eleventh embodiment of the present invention. The configuration shown in FIG. 39 is different from that shown in FIG. 38, in the following points. In a voltage control circuit 106j, a P-channel MOS transistor 140u is arranged in parallel to a MOS transistor 140i, and a P-channel MOS transistor 140t is arranged in parallel to a MOS transistor 140j. The gates of MOS transistor 140t and 140u receive an output voltage of a reference voltage generating circuit 150. The other portions of the configuration shown in FIG. 39 are the same as those shown in FIG. 38. Hence, the same reference numeral and characters are used for the corresponding portions, and detailed descriptions thereof will not be repeated.

Reference voltage generating circuit 150 includes a P-channel MOS transistor 152a connected between a power supply node and a node 153c and having a gate connected to node 153c, and an N-channel MOS transistor 152b connected between ground node and node 153 and having a gate receiving test mode instruction signal TEST1.

When test mode instruction signal TEST1 is at a LOW level, reference voltage generating circuit 150 produces a voltage at the level of power supply voltage VDD from node 153, and sets MOS transistors 140t and 140u to an OFF state. When test mode instruction signal TEST1 goes high, reference voltage generating circuit 150 generates a voltage corresponding to a current flowing through MOS transistor 152b onto node 153 by MOS transistor 152a. In this state, MOS transistors 140t and 140u turn high resistive, but conductive state of, for example, several M-ohms (MΩ), and function as a pull-up resistance element for main memory power supply line MVDLMj and bit line load power supply line BVDLj. In high resistive, but conductive state, each of MOS transistors 140t and 140u has a resistance of several M-ohms (MΩ). Thereby, when a normal standby current flows as a leakage current, the voltage drops on main memory power supply line MVBLj and bit line load power supply line BVDLj can be suppressed, and standby-current-defective memory cells can be reliably identified.

Reference voltage generating circuit 150 is commonly provided for voltage control circuits included in switch circuit 106.

As described above, according to the eleventh embodiment of the present invention, in the T-shaped bit line configuration, in a test of voltage drops of the bit line load power supply line and the main memory power supply line, the bit line load power supply lines and the main memory power supply lines are electrically coupled to the power supply node through resistance elements of a high resistance. Therefore, the normal standby current leak and the abnormal standby current leak can be reliably discriminated, and standby-current-defective memory cells can accurately be identified.

Twelfth Embodiment

Figure 40:
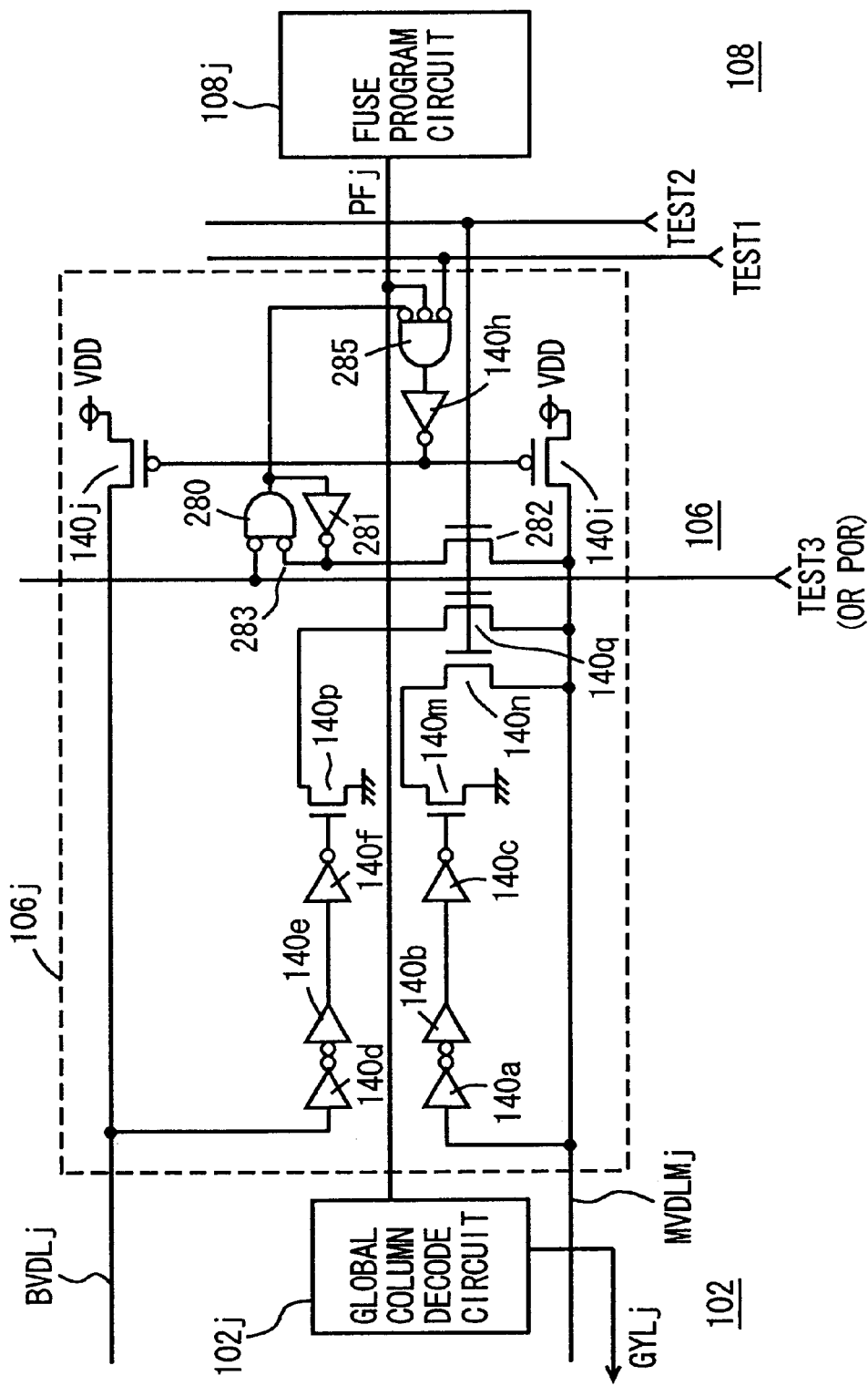
FIG. 40 is a diagram schematically showing a configuration of a main portion of a semiconductor memory device according to a twelfth embodiment of the present invention.

FIG. 40 shows a configuration of a main portion of a semiconductor memory device according to a twelfth embodiment of the invention. The configuration of the semiconductor memory device shown in FIG. 40 is different from that of voltage control circuit 106j in the following point. In FIG. 40, voltage control circuit 106j additionally includes an N-channel MOS transistor 282 which is made conductive according to test mode instruction signal TEST2, to connect main memory power supply line MVDLMj and a node 283, a NOR gate 280 receiving a signal (voltage) on node 283 and test mode instruction signal TEST3, and an inverter 281 receiving an output signal of NOR gate 280 and inverting the same for transmission onto node 283.

An output signal of NOR gate 280 is applied to a 3-input NOR gate 285 that receives test mode instruction signal TEST1 and fuse program information PFj. In place of 2-input NOR gate 140g shown in FIG. 38, 3-input NOR gate 285 is disposed. The other portions of the configuration shown in FIG. 40 are the same as those shown in FIG. 38. Hence, the same reference numerals and characters are used for the corresponding portions, and detailed descriptions thereof will not be repeated.

In the configuration shown in FIG. 40, a sequence of making test mode instruction signals TEST1 to TEST3 active/inactive is the same as the active/inactive sequence shown in FIG. 28.

First, in a standby state before a test operation mode, test operation mode instruction signal TEST3 is set to the LOW level and node 283 is initialized to the HIGH level. In the initialization, test operation mode instruction signals TEST1 and TEST2 are at the LOW level, and NOR gate 285 receives L-level signals at its three inputs and outputs an H-level signal. Accordingly, inverter 140h outputs an L-level signal, both MOS transistors 140i and 140j are in a conductive state, and a power supply voltage is supplied to power supply lines BVDLj and MVDLMj.

When test mode instruction signal TEST1 is set to the H level, MOS transistors 140i and 140j are kept off by NOR gate 285 and inverter 140h, and main memory power supply line MVDLMj and bit line load power supply line BVDLj are disconnected from the power supply node. If a failure which causes the standby current abnormality exists, the voltage level on bit line load power supply line BVDLj and/or memory power supply line MVDLMj drops in this state.

Subsequently, test mode instruction signal TEST2 is set to the H level, MOS transistors 140n and 140q enter a conductive state, and memory power supply line MVDLMj is driven to the ground voltage level by MOS transistors 140m and/or 140p. At this time, MOS transistor 282 is conductive, and the L-level voltage of memory power supply line MVDLMj is latched by NOR gate 280 and inverter 281.

When both test mode instruction signals TEST1 and TEST2 are set to the L level in a state where test mode instruction signal TEST3 is set to the L level, MOS transistors 140n, 140q, and 282 enter a non-conductive state. In this state, the L-level voltage is latched at node 283, an output signal of NOR gate 280 goes high, and accordingly, the output signal of inverter 140h is maintained at H-level because NOR gate 285 continuously outputs the L-level signal. Therefore, memory power supply line MVDLMj and bit line power supply line BVDLj, corresponding to a memory cell associated with the short circuit causing the standby current abnormality exists, maintain the L level in voltage level. Bit line load power supply line BVDLj is, although in an electrically floating state, is connected to the word line via the short circuit, and has the voltage level set to be substantially equal to the ground voltage level.

By accessing data in memory cells by using various test patterns in a state where test mode instruction signal TEST3 is set at the L level, the cross failure can be detected.

As described above, according to the twelfth embodiment of the invention, also in the T-shaped bit line configuration, the number of columns disposed in correspondence with bit line load power supply line BVDLj and memory power supply line MVDLMj can be increased, the number of latch circuits for latching the voltage level of memory power supply line MVDLMj can be decreased. Thus, the cross failure can be detected accurately without increasing the circuit occupation area.

Also in the twelfth embodiment, the test operation sequence is similar to that in the ninth embodiment.

In the tenth to twelfth embodiments, without cascaded inverters for waveform shaping, MOS transistors 140*m* and 140*p* may be driven directly according to output signals of inverters 140*a* and 140*d* for detecting potential.

In the twelfth embodiment, in place of test mode instruction signal TEST3, power-up detection signal POR may be used.

Thirteenth Embodiment

Figure 41:
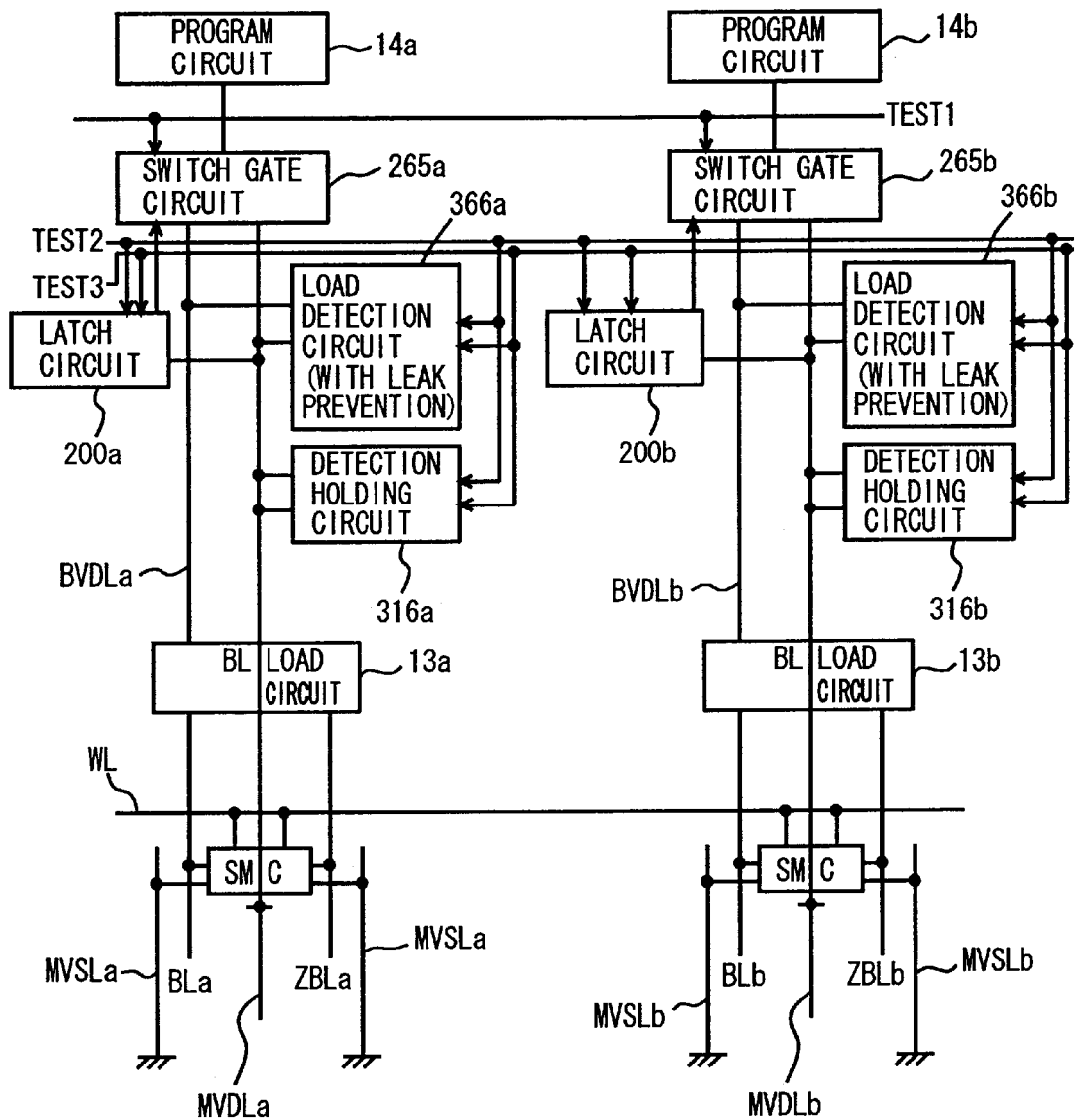
FIG. 41 is a diagram schematically showing a configuration of a main portion of a semiconductor memory device according to a thirteenth embodiment of the present invention.

FIG. 41 schematically shows a configuration of a main portion of a semiconductor memory device according to a thirteenth embodiment of the invention. The configuration shown in FIG. 41 is different from that shown in FIG. 26 in the following points. Test mode instruction signal TEST3 is applied to load detection circuits 366*a* and 366*b* provided for bit line load power supply lines BVDLa and BVDLb, respectively, and test mode instruction signal TEST3 is also applied to detection holding circuits 316*a* and 316*b* provided for memory power supply lines MVDLa and MVDLb, respectively.

Load detection circuits 366*a* and 366*b* have the function of preventing a through current from flowing through load detection circuits 366*a* and 366*b* when bit line load power supply lines BVDLa and BVDLb are driven to an intermediate voltage level due to a short circuit such as a micro short circuit.

When the voltage on bit line load power supply lines BVDLa and BVDLb attain the intermediate voltage, memory power supply lines MVDLa and MVDLb are driven to the ground voltage level, so that the possibility that the through current flows is low. In detection holding circuits 316*a* and 316*b* as well, the path of the through current flow is interrupted with reliability in accordance with test mode instruction signal TEST3.

By allowing the through current preventing mechanism in load detection circuits 366*a* and 366*b* to function in accordance with test mode instruction signal TEST3, current consumption due to the through current can be prevented in load detection circuits 366*a* and 366*b* at the time of measuring a standby current of the semiconductor memory device, and the standby current can be detected accurately.

The other configuration of FIG. 41 is similar to that of FIG. 26, the corresponding components are designated by the same reference numerals, and their detailed description will not be repeated.

Figure 42:
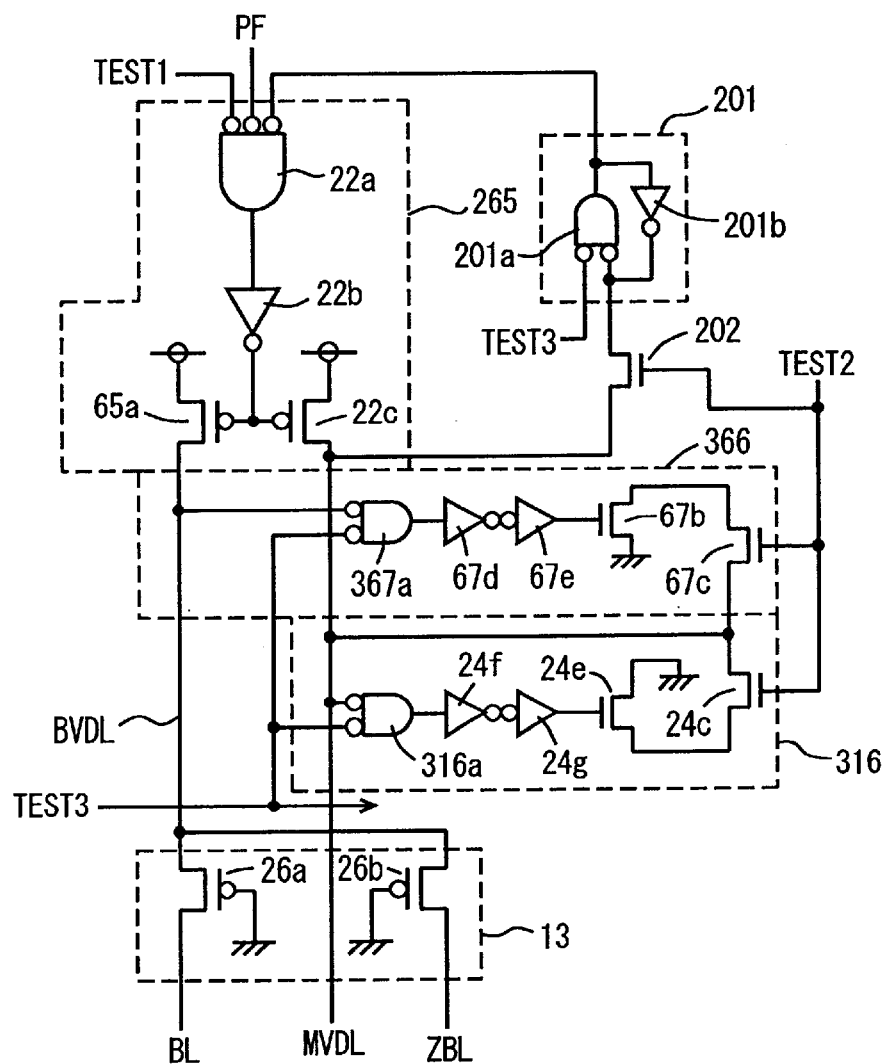
FIG. 42 is a diagram showing the configuration of the main portion of the semiconductor memory device according to the thirteenth embodiment of the present invention.

FIG. 42 shows an example of the configuration of load detection circuits 366*a* and 366*b* and detection holding circuits 316*a* and 316*b* illustrated in FIG. 41. FIG. 42 shows representatively the configuration of load detection circuit 366 and detection holding circuit 316 provided for bit line load power supply lines BVDL and memory power supply line MVDL disposed in correspondence with bit lines BL and ZBL.

In FIG. 42, detection holding circuit 316 includes: a NOR circuit 316*a* receiving test mode instruction signal TEST3 and a voltage on memory power supply line MVDL at its input stage; cascaded inverters 24*f* and 24*g* of two stages for receiving an output signal of NOR circuit 316*a*; an N-channel MOS transistor 24*e* which is selectively made conductive according to an output signal of inverter 24*g*, to transmit the ground voltage; and a MOS transistor 24*c* which is made conductive in response to activation of test mode instruction signal TEST2, to electrically couple MOS transistor 24*e* to memory power supply line MVDL.

Load detection circuit 366 with a leak preventing function includes: a NOR circuit 367*a* receiving test mode instruction signal TEST3 and a voltage on load power supply line BVDL; cascaded inverters 67*d* and 67*e* of two stages for receiving an output signal of NOR circuit 367*a*; an N-channel MOS transistor 67*b* which is selectively made conductive according to an output signal of inverter 67*e*, to transmit the ground voltage; and a MOS transistor 67*c* which is made conductive in response to activation of test mode instruction signal TEST2, to electrically couple MOS transistor 67*b* to memory power supply line MVDL.

The configuration of detection holding circuit 316 and load detection circuit 366 shown in FIG. 42 is different from that of detection holding circuit 16 and load detection circuit 66 shown in FIG. 19 in the point that NOR circuits 316*a* and 367*a* are disposed in place of inverters 24*d* and 67*a* at the initial input stage. The other configuration of the circuits 316 and 366 is the same as that shown in FIG. 19 and the configuration of switch gate circuit 265 and BL load circuit 13 is the same as that shown in FIG. 27. The corresponding components are designated by the same reference numerals and their detailed description will not be repeated.

Figure 43:
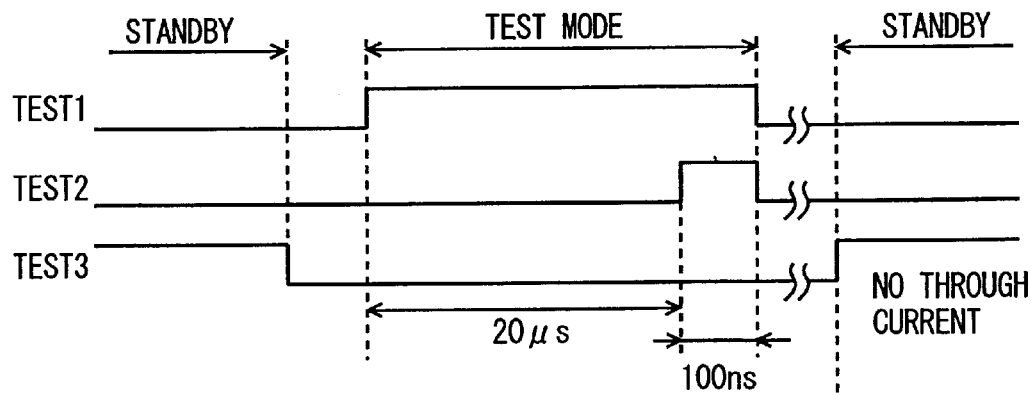
FIG. 43 is a waveform diagram representing a test mode designation signal in a test operation mode in the thirteenth embodiment of the invention.

FIG. 43 is a signal waveform chart showing the operation sequence in a test of the semiconductor memory device illustrated in FIG. 42. Referring to FIG. 43, the operation in a test of the semiconductor memory device shown in FIG. 42 will be described. In the standby state, test mode instruction signals TEST1 and TEST2 are held at the LOW level, and test mode instruction signal TEST3 is held at the HIGH level. In this state, load detection circuit 366 and detection holding circuit 316 are in an inactive state and do not perform detecting operation. Since transfer gate 202 is in a nonconductive state, latch circuit 201 is maintained in an initial state. In the test mode, fuse programming is not yet performed, so that fuse program information PF is at the LOW level.

Since test mode instruction signal TEST3 is at the HIGH level, an output of latch circuit 201 is initially set at the LOW level. An output signal of NOR circuit 22*a* at the input first stage is at the HIGH level and switch gate 265 is in a conductive state, so that a power supply voltage is supplied to load power supply line BVDL and memory power supply line MVDL.

At the time of transition to the test mode, first, test mode instruction signal TEST3 is set to the LOW level, and NOR circuits 316*a*, 367*a*, and 201*a* are enabled to operate as inverters and the operation mode for detecting a standby current abnormality is allowed to set. To detect a standby-current-defective but normally-operable memory cell, test mode instruction signal TEST1 is set to the HIGH level and after elapse of a predetermined time of 201 μs, for example, test mode instruction signal TEST2 is set to the HIGH level for predetermined period (for example, 100 ns). Memory power supply line MVDL related to a memory cell having a short circuit failure caused is thereby driven o the ground voltage level by load detection circuit 366 or detection holding circuit 316. In the case where a short circuit such as a micro short circuit occurs in bit line BL or ZBL, bit line load power supply line BVDL is held at the intermediate voltage level.

In this state, a function test such as writing/reading of data to/from a memory cell is performed, and memory power supply line MVDL or bit line load power supply line BVDL related to a defective memory cell is detected. After the completion of the test, by programming a fuse program circuit disposed in correspondence with switch gate circuit 265, switch gate circuit 265 disposed in correspondence with the defective memory cell turns nonconductive state, and bit line load power supply line BVDL and memory power supply line MVDL are disconnected from the power supply node.

At the time of a test, test mode instruction signals TEST1 to TEST3 are set to the LOW level and a standby current is detected. In latch circuit 201, the voltage level of memory power supply line MVDL is held. Therefore, in the case where memory power supply line MVDL is set to the LOW level voltage, latch circuit 201 outputs a H-level signal, switch gate circuit 265 is in a nonconductive state, and power supply node is disconnected from bit line load power supply line BVDL and memory power supply line MVDL. In this state, the standby current is measured. Bit line load power supply line BVDL, when associated with the defective memory cell, is disconnected from the power supply node by switch gate circuit 265, and the current consumption in the standby state can be measured accurately.

In the case where test mode instruction signal TEST3 is set to the HIGH level in such a state, both NOR circuits 316a and 367a enter a disable state, and output signals of NOR circuits 316a and 367a are fixed to the LOW level. On the other hand, an output signal of latch circuit 201 is forced to LOW level and switch gate circuit 265 is made conductive. Therefore, in the case where bit line load power supply line BVDL is coupled to the power supply node by switch gate circuit 265, even when the voltage level of the bit line load power supply line drops to the intermediate voltage level due to and a short circuit such as a micro short circuit in this state, output signals of NOR circuits 316a and 367a are fixed at the LOW level, and a through current can be prevented from flowing in detection circuits 316 and 366. Thus, the standby current can be measured with accuracy.

By programming the fuse program circuit after completion of the test, switch gate circuit 265 disposed in correspondence with a defective memory cell enters a nonconductive state and test mode instruction signal TEST3 is set to the HIGH level in a standby state. Even if bit line load power supply line BVDL is driven to the intermediate voltage level due to a short circuit, a through current in load detection circuit 366 can be prevented from flowing with reliability, and the standby current can be reduced with reliability in a normal mode of operation.

Even if the voltage level of memory power supply line MVDL is driven to the intermediate voltage level due to a short circuit or the like in such a state, occurrence of a through current in detection holding circuit 316 can be prevented with reliability.

Modification

Figure 44:
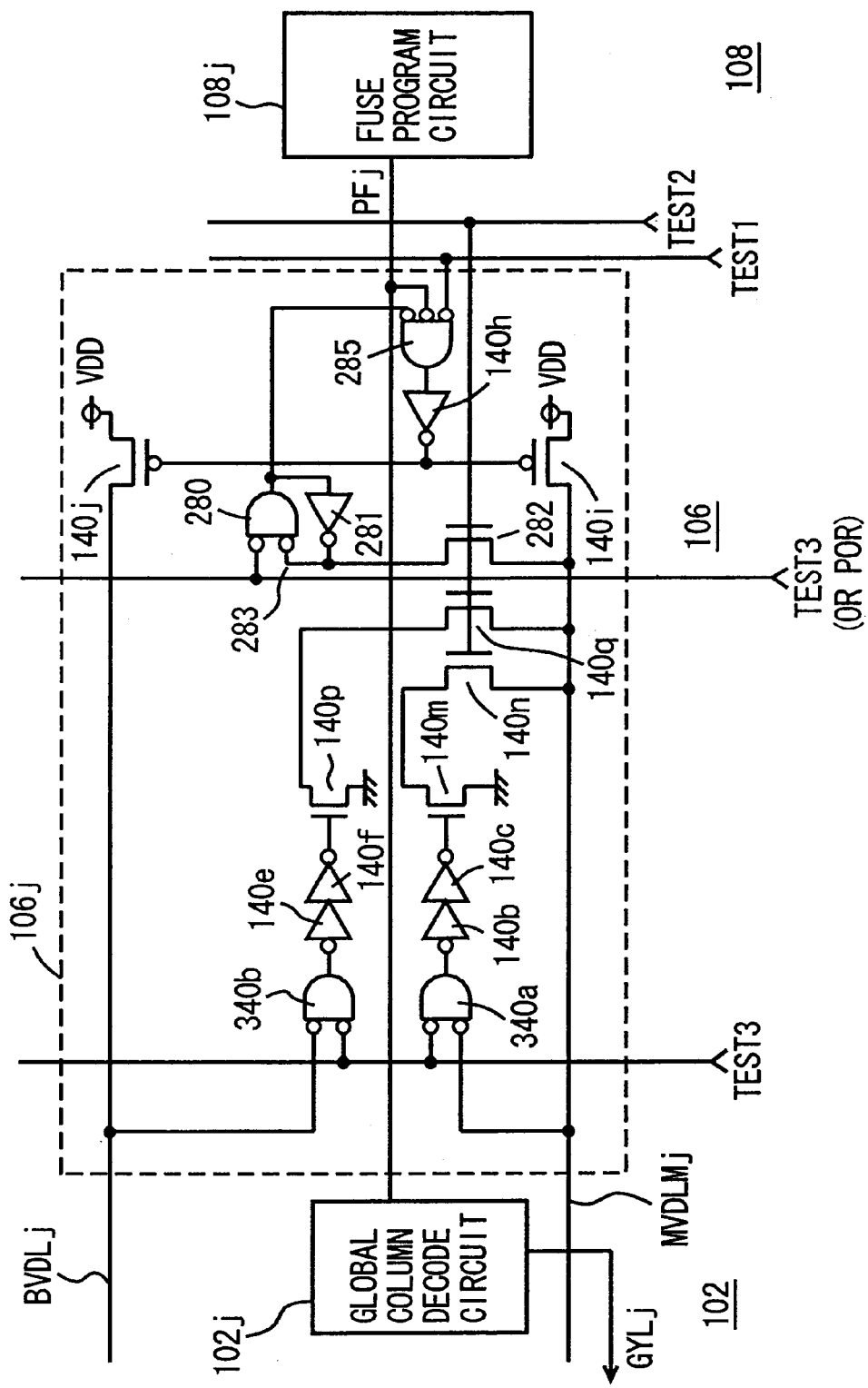
FIG. 44 is a diagram showing a modification of the thirteenth embodiment of the invention.

FIG. 44 shows a configuration of a modification of the thirteenth embodiment of the invention. The configuration of switch circuit 106 shown in FIG. 44 is different from that of switch circuit 106 in FIG. 40 in the following point. In switch circuit 106, in place of inverter 140a, a NOR circuit 340a receiving test mode instruction signal TEST3 and a voltage on main memory power supply line MVDLMj is disposed. In place of inverter 140b, a NOR circuit 340b receiving a voltage on bit line load power supply line BVDLj and test mode instruction signal TEST3 is disposed. The other configuration of FIG. 44 is the same as that shown in FIG. 40, the corresponding components are designated by the same reference numerals, and their detailed description will now be repeated.

Also in the configuration of switch circuit 106 shown in FIG. 44, when test mode instruction signal TEST3 is set to the HIGH level, output signals of NOR circuits 340a and 340b are fixed to the LOW level. In this state, even when the voltage on bit line load power supply line BVDLj drops to the intermediate voltage level in a test for detecting a short circuit, no through current flows in NOR circuit 340b. Therefore, even in the case where a micro short circuit occurs, since bit line load power supply line BVDLj and main memory power supply line MVDLMj are disconnected from the power supply node by the latch circuit in switch circuit 106 and the path of the leak current of the micro short circuit is cut off, the influence of the micro short circuit can be eliminated, and the standby current can be measured accurately.

Even in the case where MOS transistors 140j and 140i are turned off in switch circuit 106 after the fuse programming in fuse program circuit 108j, even if bit line load power supply line BVDLj and/or main memory power supply line MVDLMj are/is driven to the intermediate voltage level in a standby mode, no through current occurs and the standby current can be reduced.

In the configurations shown in FIGS. 42 and 44 for detecting the voltage level of memory power supply line MVDL or MVDLMj, each of NOR circuits 316a and 340a may be replaced with an inverter. This is because, in the case where the power supply voltage of memory power supply line MVDL or MVDLMj lowers to the intermediate voltage level, memory power supply line MVDL or MVDLMj is driven to the ground voltage level through its voltage level detecting operation. However, if the time period during which memory power supply line MVDL or MVDLMj is maintained at the intermediate voltage level is long in the detecting operation, a non-negligible through current flows. Therefore, by using NOR circuit 316a or 340a, occurrence of the through current can be prevented with reliability.

In the state where both test mode instruction signals TEST1 and TEST2 are set at the LOW level, by setting test mode instruction signal TEST3 to the HIGH level, even if memory power supply line MVDLMj or MVDL is driven to the intermediate voltage level for some reason before the fuse programming, occurrence of a through current in NOR circuits 316a and 340a can be prevented with reliability.

As described above, according to the thirteenth embodiment of the invention, in load detection circuit 366 or switch circuit 106, a gate circuit coupled to bit line load power supply line BVDL (or BVDLj) is selectively set in an enable/disable state by test mode instruction signal TEST3. In the standby state, an output signal of the NOR gate can be fixed to the LOW level. Thus, even in the case where the bit line load power supply line is driven to the intermediate voltage level, flowing of the through current in the load detection circuit can be prevented with reliability. Thus, the standby current can be measured accurately.

Fourteenth Embodiment

Figure 45:
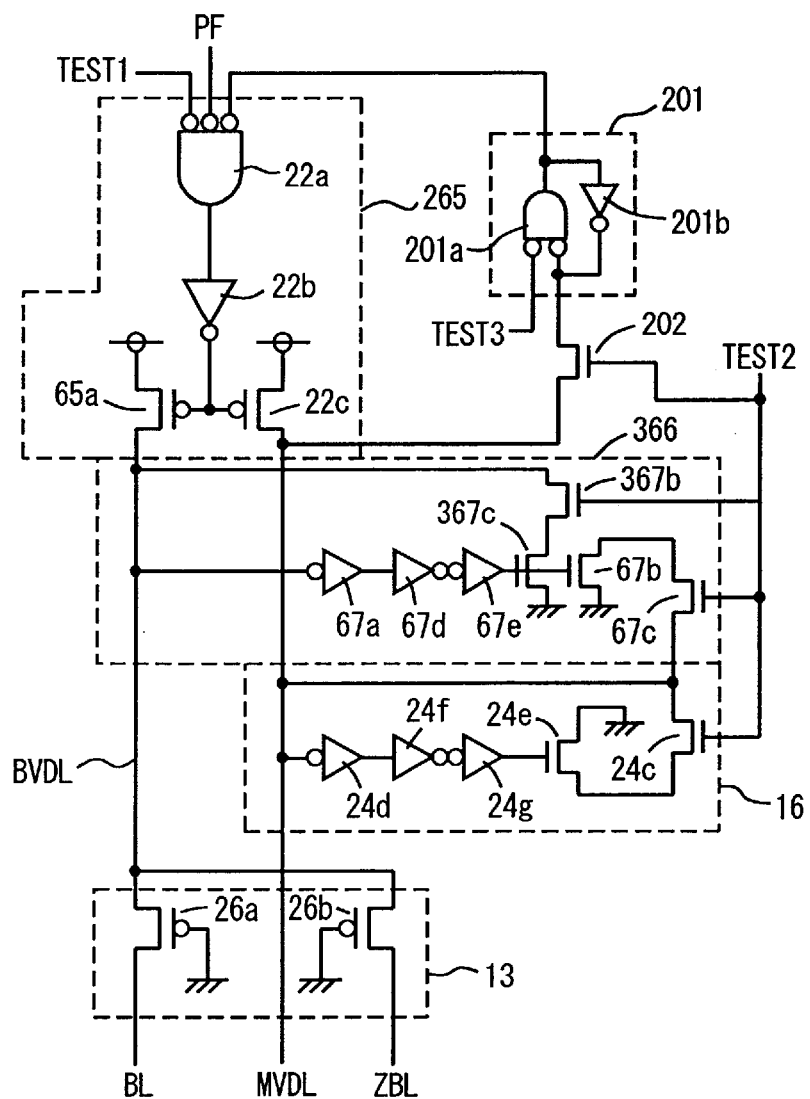
FIG. 45 is a diagram showing a configuration of a main portion of a semiconductor memory device according to a fourteenth embodiment of the invention.

FIG. 45 shows a configuration of a main portion of a semiconductor memory device according to a fourteenth embodiment of the invention. In FIG. 45, the configuration of load detection circuit 366 for driving memory power supply line MVDL in accordance with the voltage on bit line load power supply line BVDL is different from that of load detection circuit 66 shown in FIG. 18. Specifically, load detection circuit 366 shown in FIG. 45 includes an N-channel MOS transistor 367c which is made conductive in response to an output signal of inverter 67e, to transmit the ground voltage, and an N-channel MOS transistor 367b which is made conductive in response to activation of test mode instruction signal TEST2, to couple MOS transistor 367c to bit line load power supply line BVDL. The other configuration of load detection circuit 366 is the same as that of load detection circuit 66 shown in FIG. 18. The corresponding components are designated by the same reference numerals and their detailed description will not be repeated.

The configuration of each of switch gate circuit 265 and latch circuit 201 is the same as that of the corresponding circuit shown in FIG. 27. The configuration of each of detection holding circuit 16 and BL load circuit 13 is the same as that shown in FIG. 18. The corresponding components are designated by the same reference numerals and their detailed description will not be repeated.

Figure 46:
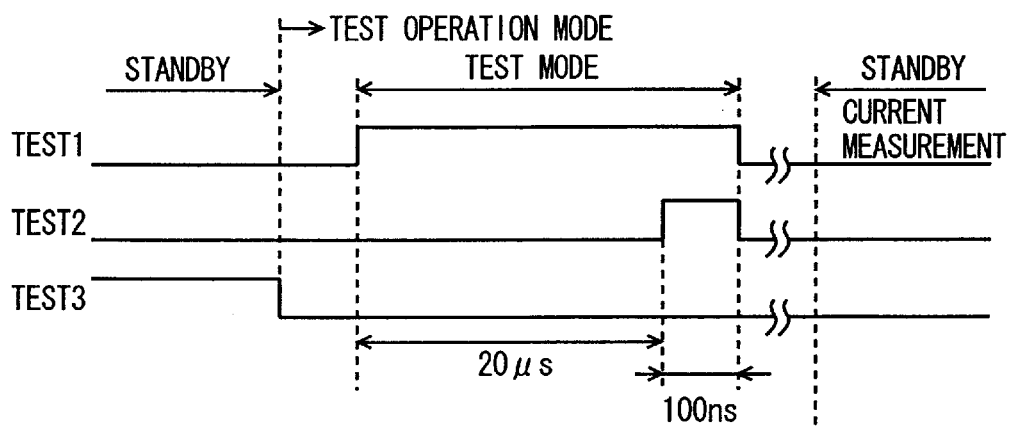
FIG. 46 is a diagram representing signal waveforms in a test mode in the fourteenth embodiment of the invention.

FIG. 46 is a diagram representing waveforms of test mode instruction signals in a test operation mode of the semiconductor memory device according to the fourteenth embodiment of the invention. Referring to FIG. 46, the operation in the test mode in the configuration shown in FIG. 45 will be described below.

The test operation sequence using the signal waveforms shown in FIG. 46 is substantially the same as that shown in FIG. 43.

In a normal operation mode before the test mode of operation, both test mode instruction signals TEST1 and TEST2 are at the LOW level, test mode instruction signal TEST3 is at the HIGH level, an output signal of latch gate 201 is at the LOW level, and switch gate circuit 265 is in a conductive state before a test mode.

In the configuration of load detection circuit 366 shown in FIG. 45, when test mode instruction signal TEST2 is at the LOW level, since MOS transistor 367b is in a nonconductive state, bit line load power supply line BVDL is disconnected from the ground node. On the other hand, when test mode instruction signal TEST2 goes high, MOS transistor 367b enters a conductive state.

In the test operation mode, test operation mode instruction signal TEST1 goes high and switch gate circuit 265 enters a nonconductive state. In the case where the voltage level of bit line load power supply line BVDL lowers to the intermediate voltage level due to a micro short circuit or the like and drops to such a voltage level that inverter circuit 67a functioning as a level detector outputs a signal of the HIGH-level, MOS transistor 367c as well as MOS transistor 367d are made conductive. In this state, when test operation mode instruction signal TEST2 goes high, bit line load power supply line BVDL is driven to the ground voltage level by MOS transistors 367b and 367c. Therefore, in this case, both memory power supply line MVDL and bit line load power supply line BVDL are held at the LOW level.

Even if test mode instruction signals TEST1 and TEST2 are set to the LOW level after that, since test operation mode instruction signal TEST3 is at the LOW level in latch circuit 201, the L-level voltage of memory power supply line MVDL is latched in response to the HIGH level of test operation mode instruction signal TEST2. Switch gate circuit 265 is in the nonconductive state, and bit line load power supply line BVDL and memory power supply line MVDL maintain the state where they are disconnected from the power supply node.

Even if all of test mode instruction signals TEST1 to TEST3 are set to the LOW level in such a state, since a leak source which decreases the voltage level of bit line load power supply line BVDL exists, bit line load power supply line BVDL maintains the ground voltage level. Therefore, all of test mode instruction signals TEST1 to TEST3 are set to the LOW level and the standby current of the semiconductor memory device is measured. An input signal of inverter circuit 67a functioning as a voltage detecting circuit is at the ground voltage level, and no through current is generated in inverter 67a. Therefore, without considering the current consumption in load detection circuit 366, the standby current in the semiconductor memory device can be measured accurately. At this time, memory power supply line MVDL is already driven to the ground voltage level, and a through current does not similarly flow in inverter circuit 24d at the time of measuring the standby current.

As described above, by detecting the voltage level of bit line load power supply line BVDL and setting the voltage level of bit line load power supply line BVDL in accordance with the detection result, in the test mode, a standby-current-defective but normally-operable memory cell is detected and then the standby current of the semiconductor memory device can be measured successively with accuracy without being influenced by the through current of the detection circuit.

Modification

Figure 47:
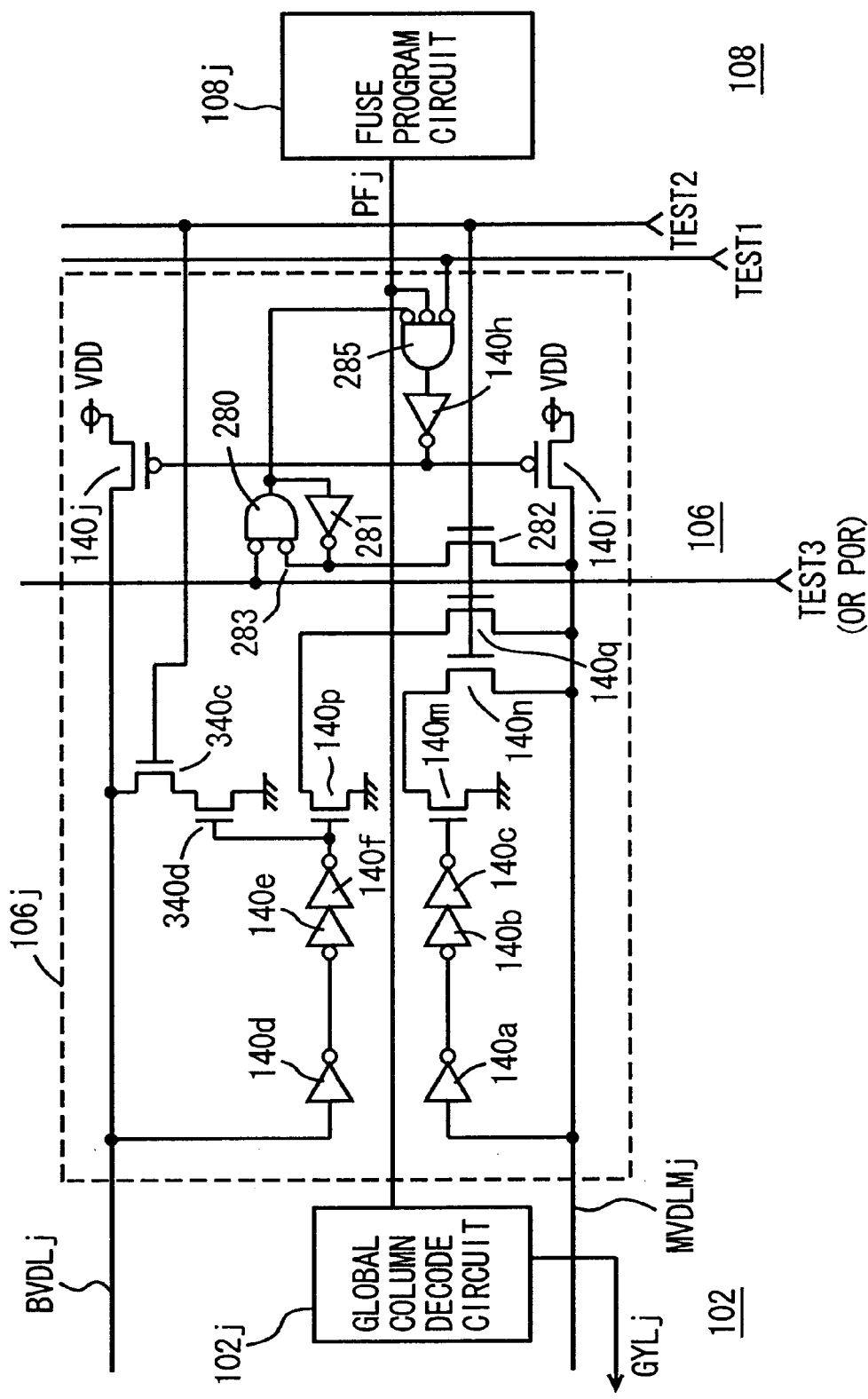
FIG. 47 is a diagram showing a modification of the fourteenth embodiment of the invention.

FIG. 47 is a diagram showing the configuration of a modification of the fourteenth embodiment of the invention. The configuration of switch circuit 106 shown in FIG. 47 is different from that of the switch circuit shown in FIG. 40 in the following point. Specifically, switch circuit 106 is further includes an N-channel MOS transistor 340d which is made conductive in response to an output signal of inverter circuit 140f, to transmit the ground voltage, and an N-channel MOS transistor 340c which is made conductive in response to activation of test mode instruction signal TEST2, to electrically connect MOS transistor 340d to bit line load power supply line BVDLj. The other configuration of switch circuit 106 is the same as that of the switch circuit shown in FIG. 40. The corresponding components are designated by the same reference numerals and their detailed description will not be repeated.

Also in the configuration of switch circuit 106 shown in FIG. 47, in the case where the voltage level of bit line load power supply line BVDLj decreases to the intermediate voltage level when test mode instruction signal TEST2 is activated, bit line load power supply line BVDLj is driven to the ground voltage level by MOS transistors 340d and 340c. Similarly, main memory power supply line MVDLMj is also driven to the ground voltage level. Therefor, even if all of test mode instruction signals TEST1 to TEST3 are set to the LOW level, memory power supply line MVDLMj and bit line load power supply line BVDLj are at the ground voltage level, and in inverters 140d and 140a, no through current flows. Thus, the standby current can be detected accurately.

After the fuse programming, in the case where MOS transistors 140j and 140i is set in a nonconductive state and the voltage level of bit line load power supply line BVDLj becomes the intermediate voltage level for some reason, there is the possibility that a through current flows in inverter 140d. However, the leak source existing in bit line load power supply line BVDLj is a leak source causing the voltage level of bit line load power supply line BVDLj to lower. If the leak source is a leak source to the ground voltage source, bit line load power supply line BVDLj is held at the ground voltage level and no through current occurs in inverter 140d.

As described above, according to the fourteenth embodiment of the invention, when the voltage of the bit line load power supply line lowers, the voltage level of the bit line load power supply line is detected and according to the detection result, the bit line load power supply line is driven to the ground voltage level. Even in the case where the leak source which decreases the bit line load power supply line to an intermediate voltage level through a short circuit exists, the bit line load power supply line is driven to the ground voltage level reliably. Thus, occurrence of a through current in the circuit for detecting the voltage on the bit line load power supply line can be prevented reliably, and the standby current can be detected accurately. Therefore, in the test mode performed after a standby-current-defective but normally-operable memory cell is detected, a standby current measuring test can be preformed reliably.

Fifteenth Embodiment

Figure 48:
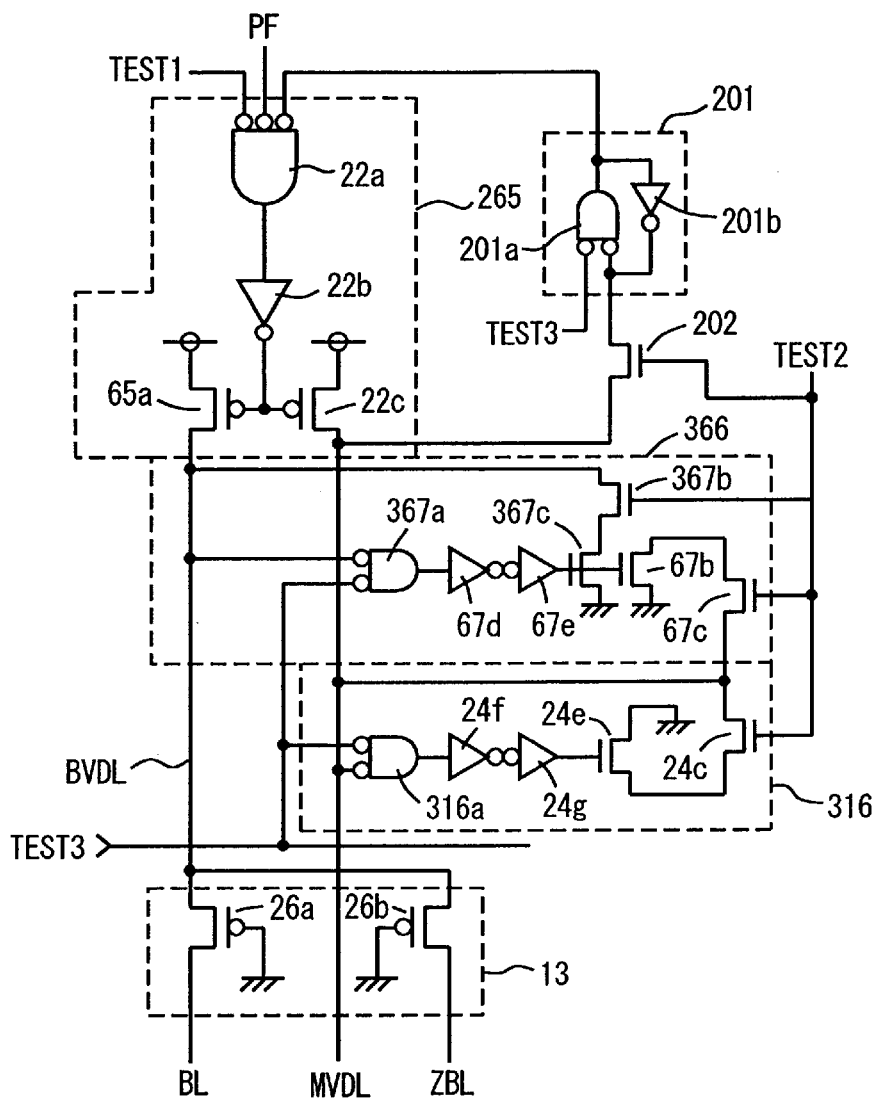
FIG. 48 is a diagram schematically showing a configuration of a main portion of a semiconductor memory device according to a fifteenth embodiment of the invention.

FIG. 48 shows a configuration of a main portion of a semiconductor memory device according to a fifteenth embodiment of the invention. The configuration of load detection circuit 366 shown in FIG. 48 is different from that of load detection circuit 366 shown in FIG. 45 in the following point. Specifically, a NOR circuit 367a receiving the voltage on bit line load power supply line BVDL and test mode instruction signal TEST3 is disposed in place of inverter 67a at the input first stage. In detection holding circuit 316, in place of inverter 24d, a NOR circuit 316a receiving test mode instruction signal TEST3 and the voltage on memory power supply line MVDL is disposed. The other configuration is similar to that of the circuits 366 and 316 shown in FIG. 45. The corresponding components are designated by the same reference numerals and their detailed description will not be repeated. The configurations of switch gate circuit 265, latch circuit 201, and BL load circuit 13 are the same as those shown in FIG. 45. The corresponding components are designated by the same reference numerals, and their detailed description will not be repeated.

In the configuration of load detection circuit 366 shown in FIG. 48, when test mode instruction signal TEST3 is at the HIGH level, an output signal of NOR circuit 367a is fixed at the LOW level. Therefore, in the standby state where test mode instruction signal TEST3 is set to the HIGH level, even in the case where bit line load power supply line BVDL decreases to an intermediate voltage level, an output signal of NOR circuit 367a is fixed to the LOW level, and no through current flows.

Figure 49:
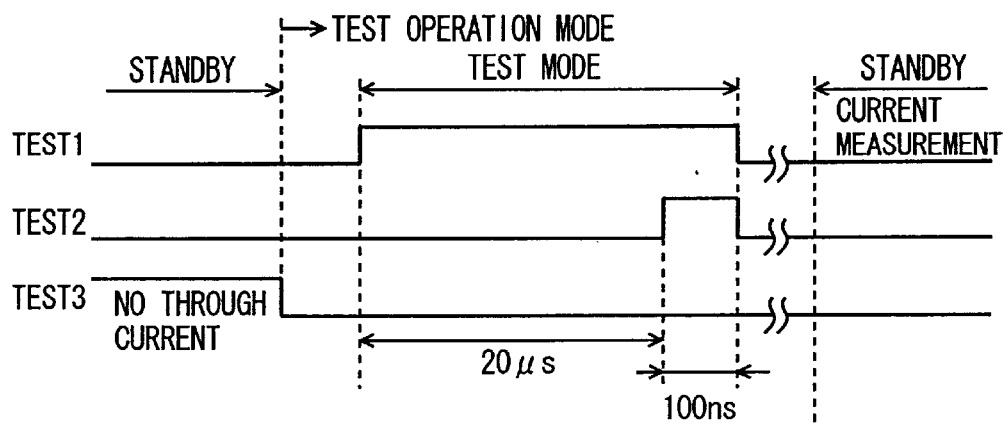
FIG. 49 is a signal waveform diagram representing an operation in the test mode in the fifteenth embodiment of the invention.

All of test mode instruction signals TEST1 to TEST3 are set to the LOW level after completion of the testing for detecting a short circuit failure, as shown in FIG. 49. In the case where the leak source exists in bit line load power supply line BVDL, both MOS transistors 67c and 367b are in a nonconductive state in the load detection circuit, an output signal of latch circuit 201 is at HIGH level, and bit line load power supply line BVDL is disconnected from the ground node. A leak source which decreases the voltage level exists in bit line load power supply line BVDL. By the leak source, bit line load power supply line BVDL is maintained at the ground voltage level. Therefore, in load detection circuit 366, no through current flows, and the standby current can be detected accurately.

Also as for detection holding circuit 316, in the case where memory power supply line MVDL is disconnected from the power supply node in accordance with an output signal of latch circuit 201, the voltage level of the memory power supply line is held at the ground voltage level by detection holding circuit 316. Consequently, with test mode instruction signals TEST1 to TEST3 set to the LOW level, the standby current can be detected accurately.

Even if the fuse programming is performed, switch gate circuit 265 corresponding to a defective column is set in a nonconductive state, and bit line load power supply line BVDL is disconnected from the power supply node, NOR circuit 367a and 316a each have an output signal fixed at the LOW level in the standby state (when test mode instruction signal TEST3 is at the HIGH level), and cause no through current. Thus, the standby current can be reduced (even when bit line load power supply line BVDL is held at an intermediate voltage level due to the leak source in the normal operation mode, no standby current flows).

Similarly to bit line load power supply line BVDL, also in the case where the memory power supply line MVDL has the voltage level driven to an intermediate voltage level due to a micro short circuit or the like, as far as test mode instruction signal TEST3 is at the HIGH level, no through current is caused, and the standby current can be reduced.

By using the configuration shown in FIG. 48, even in the case where bit line load power supply line BVDL is held at an intermediate voltage level, no through current flow occurs in load detection circuit 366, and the standby current can be detected accurately. In the case where bit line load power supply line BVDL corresponding to the defective column is disconnected from the power supply node for supplying the power supply voltage through the fuse programming, even if bit line load power supply line BVDL disposed in correspondence with the defective column attains an intermediate voltage level, test mode instruction signal TEST3 is set at the HIGH level (in the normal operation mode), and therefore, occurrence of a through current in load detection circuit 366 can be prevented, and a standby current can be reduced.

The prevention of occurrence of a through current in load detection circuit 366 similarly holds in detection holding circuit 316, so that the standby current is reduced. Thus, a semiconductor memory device with a reduced standby current, allowing the measurement of a standby current can be implemented.

Modification

Figure 50:
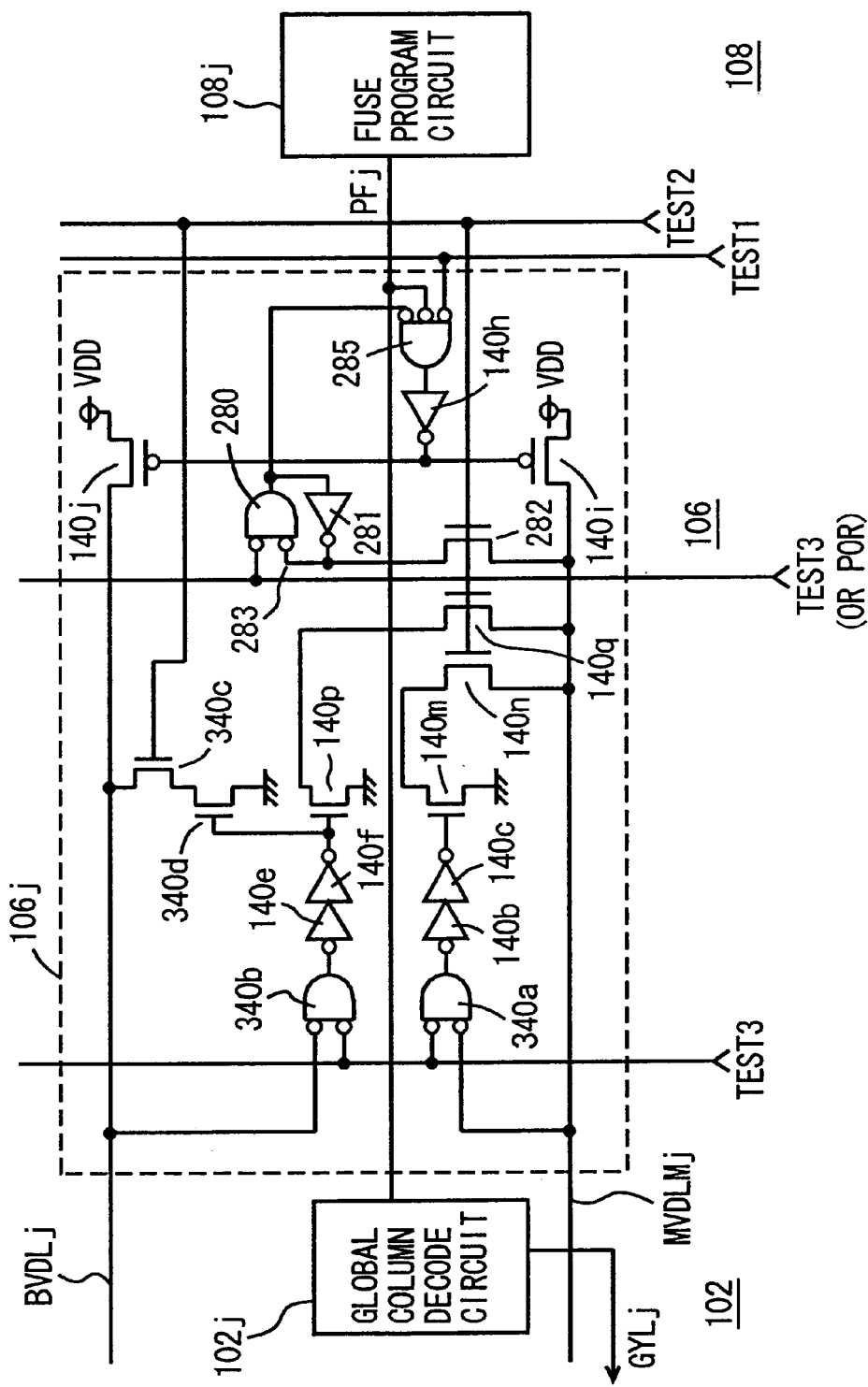
FIG. 50 is a diagram showing a configuration of a main portion of the semiconductor memory device according to the fifteenth embodiment of the invention.
Figure 51:
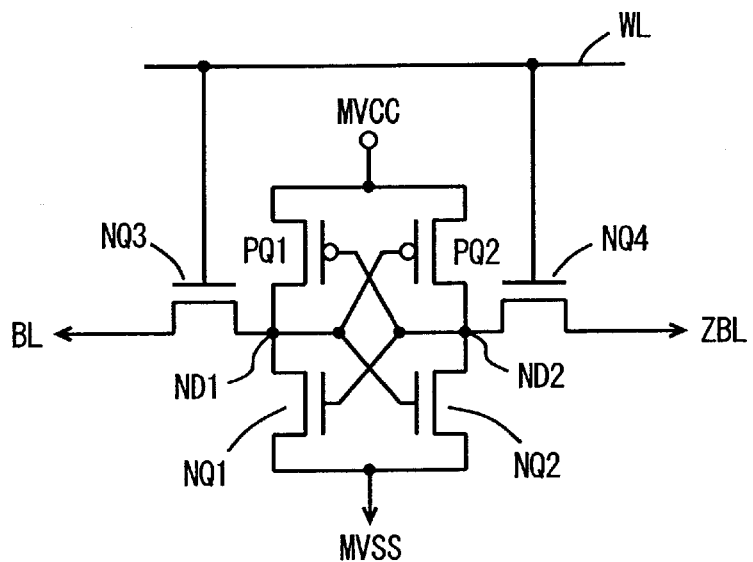
FIG. 51 is a diagram showing a configuration of a conventional SRAM cell.
Figure 52:
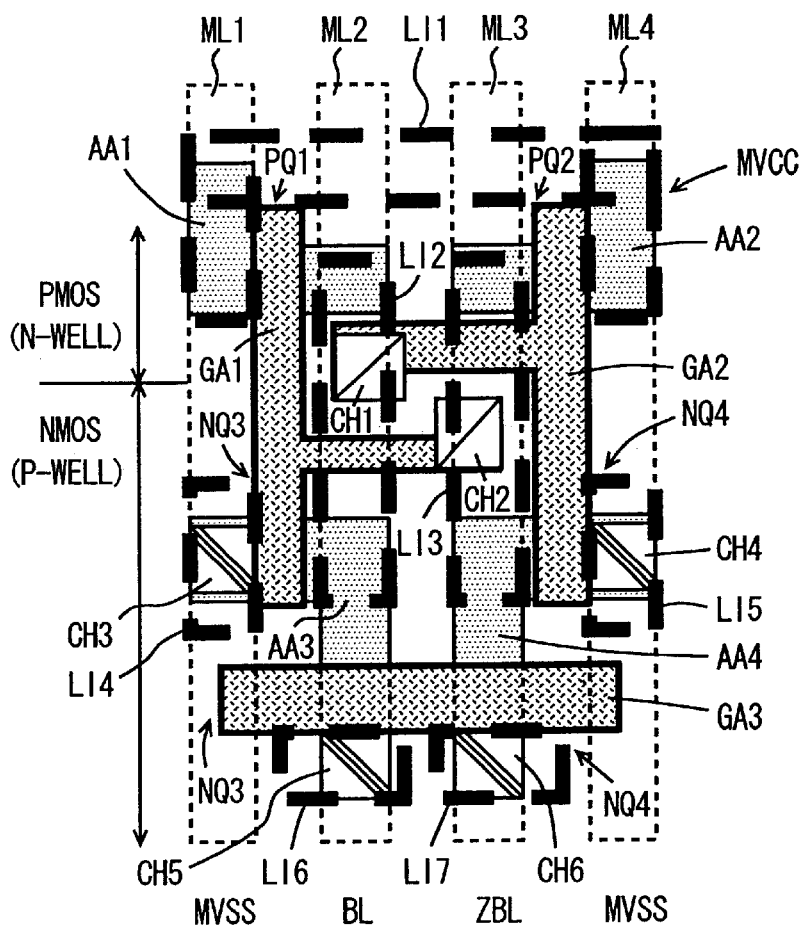
FIG. 52 is a diagram schematically showing a layout of the SRAM cell shown in FIG. 51.
Figure 53:
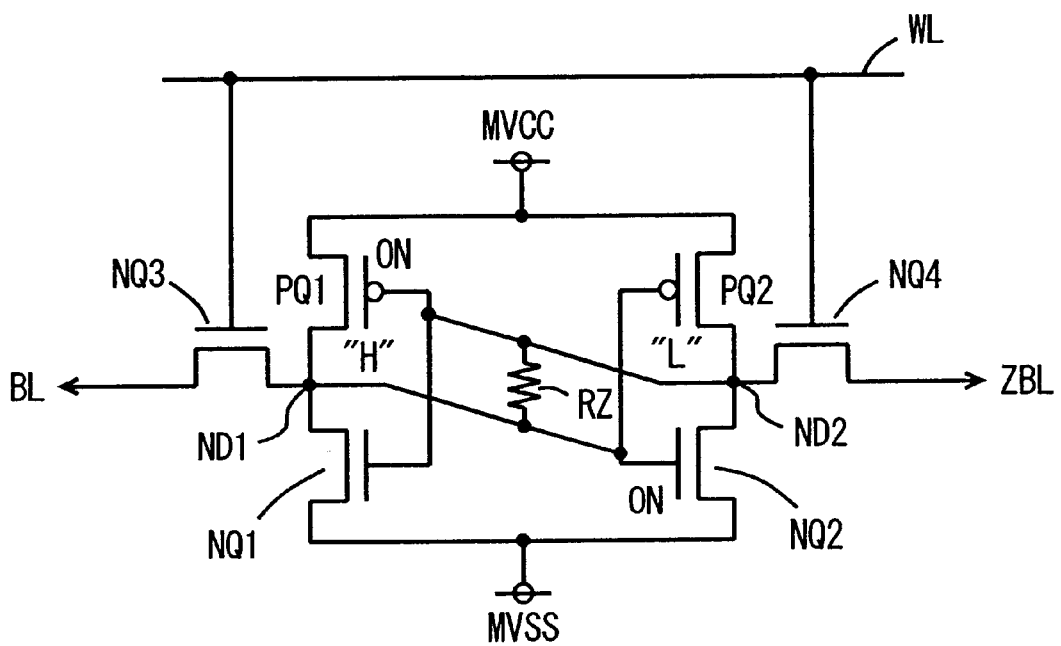
FIG. 53 is a diagram showing an example of a current leakage path in a conventional SRAM cell.

FIG. 50 shows a configuration of a modification of the fifteenth embodiment of the invention. The configuration of switch circuit 106 shown in FIG. 50 is different from that of the switch circuit shown in FIG. 47 in the following point. Specifically, in place of inverter 140a for detecting the voltage on memory power supply line MVDLMj, NOR circuit 340a receiving test mode instruction signal TEST3 and the voltage on main memory power supply line MVDLMj is disposed. Similarly, in place of inverter 140d for detecting the voltage level of bit line load power supply line BVDLj, NOR circuit 340b receiving test mode instruction signal TEST3 and the voltage on bit line load power supply line BVDLj is disposed. The other configuration of switch circuit 106 shown in FIG. 50 is the same as that of the switch circuit shown in FIG. 47. The corresponding components are designated by the same reference numerals and their detailed description will not be repeated.

Also in the configuration of switch circuit 106 shown in FIG. 50, if test mode instruction signal TEST is at the H level, output signals of NOR circuits 340a and 340b are fixed to the LOW level. Even when the voltages on bit line load power supply line BVDLj and memory power supply line MVDLMj are at an intermediate voltage level, no through current flow in switch circuit 106.

In the case where bit line load power supply line BVDLj and memory power supply line MVDLj related to a defective column, these power supply lines BVDLj and MVDL are maintained at the ground voltage level even when all test mode instruction signals TEST1 to TEST3 are set to the LOW level. No through current is generated in the detection circuit 106 and the standby current can be measured accurately. In the normal operation mode, test mode instruction signal TEST3 is at the HIGH level and the standby current can be reduced because the output signals of NOR circuits 340a and 340b are forced to LOW level.

In the configurations shown in FIGS. 48 and 50, each of NOR circuits 340b and 340a coupled to memory power supply lines MVDL and MVDLMj may be replaced with an inverter. That is, a configuration that an NOR circuit is disposed only for bit line load power supply line BVDL or BVDLj may be employed.

Other Embodiments

In the foregoing, static random access memory (SRAM) is described as the semiconductor memory device by way of example. However, the present invention can also be applied to, for example, sense power supply lines of a sense amplifier circuits that differentially amplify and latch voltages of individual memory cell columns in a dynamic random access memory (DRAM).

In addition, in a DRAM, the present invention may be applied to, for example, bit line precharge voltage transfer lines for precharging and equalizing the bit lines to a predetermined voltage level. When the bit lines are precharged and equalized to an intermediate voltage level (VDD/2), input logic threshold voltage of inverters for detecting the voltage levels of the bit line precharge voltage transfer lines are set below the precharge voltage level. Thereby, the bit line precharge voltage transfer lines can be driven to the ground voltage level when the bit line voltage transfer line causes a voltage drop. When data stored in the memory cells is read out, bit lines associated with a standby current abnormality are both at the ground voltage level, and the corresponding sense amplifier circuit does not receive complementary data. Therefore, since the sense amplifier circuit could not perform a normal sensing operation, by comparing read data with write data, the bit line that causes the standby current failure can be identified.

As described above, according to the present invention, in the test mode, voltage transfer lines are disconnected from reference potential node, the voltage levels of the voltage transfer lines are detected, and the voltage transfer lines are set to a voltage level according to the detection result. Thereby, determination can be made as to whether an abnormal standby current flows through the voltage transfer lines. In addition, a memory cells that cause an abnormal standby current flow can be identified through readout of data stored in the memory cells. Thereby, through redundancy replacement, the standby-current-defective but normally-operable memory cell can be repaired, and the standby current defect can be repaired.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a plurality of memory cells disposed in rows and columns;
   a first reference potential node;
   a switch circuit electrically coupled to said first reference potential node, and selectively rendered conductive for transferring a reference potential of said first reference potential node when rendered conductive;
   a first voltage transfer line for transferring voltage received from said switch circuit to said plurality of memory cells; and
   a voltage control circuit activated in a specific operation mode, for detecting whether a potential of said first voltage transfer line is at a predetermined potential level, and for setting the potential of said first voltage transfer line to a level according to a result of detection in accordance with the result of detection.

2. The semiconductor memory device according to claim 1, wherein
   said specific operation mode is a test mode for testing said semiconductor memory device; and
   said voltage control circuit comprises a circuit for driving said first voltage transfer line to a ground voltage level when the potential of said first voltage transfer line is lower than said predetermined potential level.

3. The semiconductor memory device according to claim 1, wherein said switch circuit comprises a plurality of switch gates each provided for a predetermined number of memory cells in said plurality of memory cells and rendered non-conductive when a corresponding memory cell is replaced with a redundant cell.

4. The semiconductor memory device according to claim 1, wherein
   said predetermined operation mode is a test mode for testing said semiconductor memory device; and
   said switch circuit is rendered non-conductive in said test mode.

5. The semiconductor memory device according to claim 1, wherein
   said first voltage transfer line comprises a plurality of first voltage lines each disposed corresponding to a predetermined number of memory cells in said plurality of memory cells; and
   said switch circuit comprises switch gates disposed corresponding to the first voltage lines.

6. The semiconductor memory device according to claim 1, further comprising an auxiliary switch circuit disposed between said first reference potential node and said first voltage transfer line in parallel to said switch circuit and having a resistance in a conductive state higher than a resistance of said switch circuit in a conductive state.

7. The semiconductor memory device according to claim 6, wherein
   said predetermined operation mode is a test mode for performing a test on said semiconductor memory device; and
   said auxiliary switch circuit is rendered conductive in said test mode.

8. The semiconductor memory device memory cell according to claim 1, wherein
   the memory cells each are a latch type memory cell; and
   said first voltage transfer line is a memory power supply line for transferring a power supply voltage to the memory cells.

9. The semiconductor memory device according to claim 1, wherein
   said switch circuit comprises a plurality of switch gates each disposed for a predetermined number of memory cells in said plurality of memory cells;
   said first voltage transfer line comprises a plurality of first voltage lines each disposed corresponding to the switch gates; and
   said semiconductor memory device further comprises:
      a plurality of bit line pairs each disposed corresponding to a column of the memory cells and electrically coupled to the memory cells on a corresponding column;

a plurality of load switch circuits disposed corresponding to the switch gate, electrically coupled to a second reference potential node, and rendered conductive in said specific mode, for transferring a voltage on said second reference potential node when made conductive;

load voltage transfer lines disposed corresponding to the load switch circuits, for transferring a voltage received from corresponding load switch circuits;

bit line load circuits disposed corresponding to the bit line pairs, for charging bit lines of corresponding bit line pairs in accordance with the voltages transferred through corresponding load voltage lines at least in a standby state; and load voltage detection circuitry for detecting, in said specific operation mode, potentials of said load voltage transfer lines and for setting the potential of said first voltage transfer line in according with a result of detection.

10. The semiconductor memory device according to claim 9, further comprising an auxiliary load resistance coupled in parallel to each load switch circuit and having a resistance value in a conductive state higher than a resistance of said each load switch circuit in a conductive state.

11. The semiconductor memory device according to claim 9, wherein said voltage control circuit includes:

a first voltage detection circuit for generating a binary signal in accordance with a voltage on said first voltage transfer line;

a first detection transistor for driving an internal node to said predetermined voltage level in accordance with an output signal of said first voltage detection circuit; and a first latch transistor selectively made conductive in response to a specific operation mode instruction signal for instructing said specific operation mode, and electrically coupling said first internal node to said first voltage transfer line when made conductive, and said load voltage detection circuit comprises:

a second voltage detection circuit for generating a binary signal in accordance with a voltage level of said second voltage transfer line;

a second detection transistor selectively made conductive in accordance with an output signal of said second voltage detection circuit, and transferring said predetermined voltage to a second internal node when made conductive; and a second latch transistor, made conductive when said specific operation mode instruction signal is activated, for electrically coupling said second internal node to said first voltage transfer line.

12. The semiconductor memory device according to claim 11, wherein each of the first and second voltage detection circuits includes an inverter(s) of an odd number of stage(s).

13. The semiconductor memory device according to claim 1, further comprising:

a plurality of word lines disposed corresponding to the rows of the memory cells and coupled to the memory cells on corresponding rows;

a plurality of bit lines disposed corresponding to columns of the memory cells and coupled to the memory cells of corresponding columns; and bit line lead lines disposed perpendicular to the bit lines, for transferring data on the bit lines, and wherein said first voltage transfer line is disposed parallel to the word lines.

14. The semiconductor memory device according to claim 1, wherein said voltage control circuit determines a binary value of a potential of said first voltage transfer line, and drives and latches the potential of said first voltage transfer line in accordance with a result of determination.

15. The semiconductor memory device according to claim 14, wherein said voltage control circuit comprises:

a binary value detection circuit for generating a binary signal in accordance with the potential on said first voltage transfer line;

a voltage transfer transistor selectively made conductive in accordance with an output signal of said binary value detection circuit and transferring said predetermined voltage to an internal node when made conductive; and a latch transistor selectively made conductive in accordance with a signal for designating said specific operation mode and electrically coupling said internal node to said first voltage transfer line when made conductive.

16. The semiconductor memory device according to claim 1, further comprising:

a control signal generation circuit arranged corresponding to said switch circuit, for selectively setting said switch circuit into a non-conductive state in said specific operation mode; and a latch circuit for latching a voltage on said first voltage transfer line set by said voltage control circuit in said specific operation mode, and setting a logic level of a control signal generated by said control signal generation circuit in accordance with a latched voltage signal.

17. A semiconductor memory device comprising:

a plurality of memory cells arranged in rows and columns;

a reference voltage node;

a switch circuit electrically coupled to said reference voltage node, and selectively rendered conductive for transferring a voltage of said reference voltage node;

at least one first voltage transfer line for transferring the voltage received from said switch circuit to said plurality of memory cells;

a plurality of bit line pairs, arranged corresponding to the memory cell columns, each connecting to memory cells of corresponding columns;

at least one second voltage transfer line for transferring the voltage received from said switch circuit;

bit line load circuits, arranged corresponding to the respective bit line pairs, each for transferring the voltage of the second voltage transfer line to a corresponding bit line pair when made conductive;

a load voltage detection circuit, arranged corresponding to the second voltage transfer line, for detecting the voltage of the second voltage transfer line and setting said first voltage transfer line to a voltage level according to a result of detection in a specific operation mode; and a switch control circuit, arranged for the first voltage transfer line, for latching the voltage of said first voltage transfer line and setting said switch circuit into one of a conductive state and a non-conductive state in accordance with a result of latching and an operation mode instruction signal in said specific operation mode.

18. The semiconductor memory device according to claim 17, wherein the switch control circuit includes a latch circuit having latching operation thereof selectively enabled and disabled in accordance with said operation mode instruction signal, and said operation mode instruction signal is set in a state of activating said latch circuit for taking in and latching the voltage of the first voltage transfer line at least in said specific operation mode.

19. A semiconductor memory device comprising:

a plurality of memory cells disposed in rows and columns;

a reference voltage node selectively coupled to a reference voltage source supplying a reference voltage;

at least one first voltage transfer line coupled to said reference voltage node, for transferring voltage received from said reference voltage node to said plurality of memory cells;

a plurality of bit line pairs, disposed corresponding to the memory cell columns, each connecting to memory cells of a corresponding column;

at least one second voltage transfer line for transferring a voltage received from said reference voltage node;

a bit line load circuit arranged corresponding to each respective bit line pair, for transferring the voltage of the second voltage transfer line to a corresponding bit line pair when rendered conductive;

a load voltage detection circuit, arranged corresponding to the second voltage transfer line, for detecting a voltage level of the second voltage transfer line and setting the voltage of said first voltage transfer line to a voltage level according to a result of detection in a specific operation mode.

20. The semiconductor memory device according to claim 19, wherein said load voltage detection circuit comprises:

a gate circuit, selectively enabled in response to a mode instruction signal for instructing said specific operation mode, detecting a voltage level of said second voltage transfer line and outputting an output signal corresponding to a result of detection when enabled, and having the output signal fixed to a predetermined voltage level independent of the voltage level of said second voltage transfer line when disabled; and a drive circuit for setting the voltage level of said first voltage transfer line to a voltage level according to the output signal of said gate circuit in response to the output signal of said gate circuit.

21. The semiconductor memory device according to claim 19, wherein said load voltage detection circuit comprises:

a gate circuit coupled to said second voltage transfer line, for outputting a signal of a voltage level according to the voltage level of said second voltage transfer line;

a first drive circuit for driving the voltage level of said first voltage transfer line to a voltage level according to an output signal of said gate circuit in response to the output signal of said gate circuit; and a second drive circuit for driving the voltage level of said second voltage transfer line to a voltage level according to the voltage level of an output signal of said gate circuit in accordance with the output signal of said gate circuit in said specific operation mode.

22. The semiconductor memory device according to claim 19, wherein said load voltage detection circuit comprises:

a gate circuit selectively enabled in response to a first operation mode instruction signal, outputting a signal of a voltage level according to the voltage level of said second voltage transfer line when enabled, and outputting a signal of a predetermined voltage level independent of the voltage level of said second voltage transfer line when disabled;

a first drive circuit activated in response to a second operation mode instruction signal, for driving the voltage level of said first voltage transfer line to a voltage level according to the output signal of said gate circuit in response to the output signal of said gate circuit; and a second drive circuit activated in response to said second operation mode instruction signal, for driving the voltage level of said second voltage transfer line to the voltage level of the output signal of said gate circuit in accordance with the output signal of said gate circuit.

23. The semiconductor memory device according to claim 19, wherein said load voltage detection circuit further comprises a circuit for detecting a voltage level of said second voltage transfer line and selectively driving the voltage level of said second voltage transfer line to a same voltage level as a voltage level of the first voltage transfer line in accordance with a result of detection in said specific operation mode.

* * * * *